United States Patent
Park et al.

(10) Patent No.: US 10,483,467 B2
(45) Date of Patent: *Nov. 19, 2019

(54) ORGANIC LIGHT EMITTING DIODE

(71) Applicant: SFC CO., LTD., Cheongju (KR)

(72) Inventors: Young-hwan Park, Cheongju (KR);
Seo-Yeon Yoon, Seongnam (KR);
Jeong-Soo Kim, Hongseong (KR);
Yeon-Kwon Ryu, Cheongju (KR);
Jea-Geon Lim, Cheongju (KR);
Ji-Hwan Kim, Anyang (KR)

(73) Assignee: SFC CO., LTD., Cheongju (KR)

( * ) Notice: Subject to any disclaimer, the term of this patent is extended or adjusted under 35 U.S.C. 154(b) by 293 days.

This patent is subject to a terminal disclaimer.

(21) Appl. No.: 15/094,099

(22) Filed: Apr. 8, 2016

(65) Prior Publication Data

US 2016/0308137 A1    Oct. 20, 2016

(30) Foreign Application Priority Data

Apr. 20, 2015   (KR) .................. 10-2015-0055245

(51) Int. Cl.
*H01L 51/00* (2006.01)
*C09K 11/02* (2006.01)
(Continued)

(52) U.S. Cl.
CPC ........ *H01L 51/0058* (2013.01); *C09K 11/025* (2013.01); *C09K 11/06* (2013.01);
(Continued)

(58) Field of Classification Search
CPC ............... H01L 51/5004; H01L 51/508; H01L 51/0058
See application file for complete search history.

(56) References Cited

U.S. PATENT DOCUMENTS 5,935,721 A * 8/1999 Shi .................. C09K 11/06 313/504
9,755,171 B2 * 9/2017 Seo ..................... H01L 51/5004
(Continued)

FOREIGN PATENT DOCUMENTS

KR   10-2006-0044591 A   5/2006
KR   10-2006-0048920 A   5/2006
(Continued)

OTHER PUBLICATIONS

Machine Translation of WO 2012005214 A1 (Year: 2012).*
Office Action from Korean Intellectual Property Office, dated Aug. 11, 2017.

*Primary Examiner* — Michael M Dollinger
(74) *Attorney, Agent, or Firm* — STIP Law Group, LLC

(57) ABSTRACT

Disclosed herein is an organic light-emitting diode, comprising an anode, a hole transport layer, a light-emitting layer including a host and a dopant, an electron transport layer, and a cathode in that order, wherein an electron-density-controlling layer including an anthracene derivative represented by the following Chemical Formula A is disposed between the light-emitting layer and the electron transport layer, and wherein an affinity $A_h$ (eV) of the host of the light-emitting layer, an affinity $A_{ed}$ (eV) of the electron-density-controlling layer, and an affinity $A_e$ (eV) of the electron transport layer satisfy an relationship of $A_h \geq A_e - d \geq A_e$.

10 Claims, 8 Drawing Sheets

(51) Int. Cl.
  *C09K 11/06* (2006.01)
  *H01L 51/50* (2006.01)
(52) U.S. Cl.
  CPC ...... *H01L 51/0061* (2013.01); *H01L 51/0073* (2013.01); *H01L 51/5004* (2013.01); *C09K 2211/1007* (2013.01); *C09K 2211/1011* (2013.01); *C09K 2211/1014* (2013.01); *C09K 2211/1022* (2013.01); *C09K 2211/1088* (2013.01); *H01L 51/508* (2013.01)

(56) References Cited

U.S. PATENT DOCUMENTS

| | | | | |
|---|---|---|---|---|
| 2006/0029828 | A1* | 2/2006 | Kanno | H01L 51/5096 428/690 |
| 2006/0105202 | A1* | 5/2006 | Kitamura | C09K 11/06 428/690 |
| 2011/0233604 | A1* | 9/2011 | Ikeda | H01L 51/5016 257/103 |
| 2012/0126220 | A1* | 5/2012 | Yokoyama | C07D 471/04 257/40 |
| 2014/0061545 | A1* | 3/2014 | Leroy | C09K 11/06 252/500 |
| 2014/0065750 | A1* | 3/2014 | Harikrishna Mohan | H01L 51/5265 438/35 |
| 2014/0346406 | A1* | 11/2014 | Lee | C07B 59/001 252/500 |
| 2015/0014671 | A1* | 1/2015 | Koike | C07D 401/10 257/40 |

FOREIGN PATENT DOCUMENTS

| | | |
|---|---|---|
| KR | 10-2012-0051700 A | 5/2012 |
| KR | 10-2012-0092555 A | 8/2012 |
| KR | 10-2014-0031171 A | 3/2014 |
| WO | WO2012-005214 A1 | 9/2013 |

* cited by examiner

ORGANIC LIGHT EMITTING DIODE

CROSS-REFERENCE TO RELATED APPLICATIONS

This application claims the benefit of Korean Application No. 10-2015-0055245, filed on Apr. 20, 2015, the disclosures of which are incorporated by reference into the present application.

BACKGROUND OF THE INVENTION

1. Field of the Invention

The present disclosure relates to an organic light-emitting diode. More particularly, the present disclosure relates to a high-efficiency organic light-emitting diode in which an electron-density-controlling layer is disposed between a light-emitting layer and an electron injection layer.

2. Description of the Related Art

Organic light-emitting diodes, based on self-luminescence, exhibit the advantages of having a wide viewing angle, excellent contrast, fast response time, high brightness, and excellent driving voltage and response rate characteristics, and of realizing a polychromic display.

A typical organic light-emitting diode includes an anode and a cathode, with an organic emissive layer disposed therebetween.

As to the general structure of the organic light-emitting diode, a hole transport layer, a light-emitting layer, an electron transport layer, and a cathode are formed in that order on an anode. Here, all of the hole transport layer, the light-emitting layer, and the electron transport layer are organic films comprising organic compounds.

An organic light-emitting diode having such a structure operates as follows: when a voltage is applied between the anode and the cathode, the anode injects holes which are then transferred to the light-emitting layer via the hole transport layer while electrons injected from the cathode move to the light-emitting layer via the electron transport layer. In the luminescent zone, the carriers such as holes and electrons recombine to produce an exciton. When the exciton returns to the ground state from the excited state, the molecule of the light-emitting layer emits light.

Materials used as the organic layers in organic light-emitting diodes may be divided into luminescent materials and charge carrier materials, for example, a hole injection material, a hole transport material, an electron injection material, and an electron transport material. The light-emitting mechanisms allow the luminescent materials to be classified as fluorescent and phosphorescent materials, which use excitons in singlet and triplet states, respectively.

Meanwhile, when a single material is employed as the luminescent material, intermolecular actions cause the maximum luminescence wavelength to shift toward a longer wavelength, resulting in a reduction in color purity and light emission efficiency. In this regard, a host-dopant system may be used as a luminescent material so as to increase the color purity and the light emission efficiency through energy transfer. This is based on the principle whereby, when a dopant has a smaller energy band gap than a host, which consist of the light-emitting layer, the addition of a small amount of the dopant to the host generates excitons from the light-emitting layer so that the excitons are transported to the dopant, emitting light at high efficiency. Here, light of desired wavelengths can be obtained depending on the kind of the dopant because the wavelength of the host moves to the wavelength range of the dopant.

With regard to the efficiency of organic light-emitting diodes, statistically, there is a 25% probability of forming a singlet state and a 75% probability of forming a triplet state. It would thus be expected that in fluorescent OLEDs only the formation of singlet excitons results in the emission of useful radiation, placing a theoretical limit on the internal quantum efficiency of 25%.

To avoid the disadvantage, Korean Patent Unexamined Application Publication No. 10-2012-0092555 (Aug. 21, 2012) proposes the effective occurrence of a TTF phenomenon, in which singlet excitons are generated through the collision and fusion of two triplet excitons. For this, as shown in FIG. 1, this reference discloses an electroluminescence device in which a blocking layer is interposed between a light-emitting layer and an electron injection layer, with an affinity difference between the electron injection layer and the blocking layer. In this regard, the blocking layer is set to have a triplet energy larger than that of the host of the light-emitting layer so as to confine triplet excitons within the light-emitting layer, whereby the effective occurrence of the TTF phenomenon is induced. In addition, the electroluminescence device employs a material in which respective affinities of both the electron injection layer and the blocking layer satisfy a specific condition.

As described above, the reference document is designed to cause the effective occurrence of a TTF phenomenon in order to provide high emission efficiency for an organic electroluminescence device. To this end, the blocking layer should include a material that is higher in triplet energy than the host, and an aromatic heterocyclic compound of a specific fused ring should be employed in the blocking layer.

In spite of various efforts made to fabricate organic light-emitting diodes having effective luminescence characteristics, however, there is still a continued need to develop organic light-emitting diodes having a higher effective luminescence efficiency by improving the emitting layer.

RELATED ART DOCUMENT

Korean Patent Unexamined Application Publication No. 10-2012-0092555 (Aug. 21, 2012)

SUMMARY OF THE INVENTION

Accordingly, the present invention has been made keeping in mind the above problems occurring in the prior art, and an object of the present invention is to provide an organic light-emitting diode that has high luminous efficiency, wherein a light-emitting layer has increased exciton density.

The present disclosure provides an organic light-emitting diode comprising an anode, a hole transport layer, a light-emitting layer including a host and a dopant, an electron transport layer, and a cathode in that order, wherein an electron-density-controlling layer including an anthracene derivative represented by the following Chemical Formula A is disposed between the light-emitting layer and the electron transport layer, and an affinity $A_h$ (eV) of the host of the light-emitting layer, an affinity $A_{ed}$ (eV) of the electron-density-controlling layer, and an affinity $A_e$ (eV) of the electron transport layer satisfy the relationship $A_h \geq A_{ed} \geq A_e$:

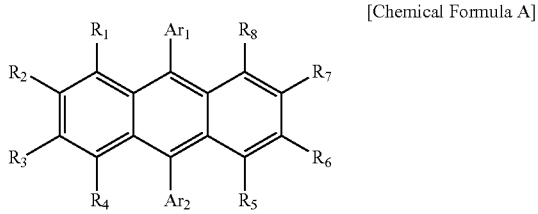

[Chemical Formula A]

wherein,

Ar$_1$ and Ar$_2$ may be the same or different, and are each independently a substituted or unsubstituted aryl of 6 to 50 carbon atoms, or a substituted or unsubstituted heteroaryl of 2 to 50 carbon atoms, R$_1$ to R$_8$ may be the same or different, and are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkenyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 6 to 30 carbon atoms, a substituted or unsubstituted alkylsilyl of 1 to 30 carbon atoms, a substituted or unsubstituted arylsilyl of 6 to 30 carbon atoms, a substituted or unsubstituted alkyl germanium of 1 to 30 carbon atoms, a substituted or unsubstituted aryl germanium of 6 to 30 carbon atoms, a cyano, a nitro, and a halogen.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
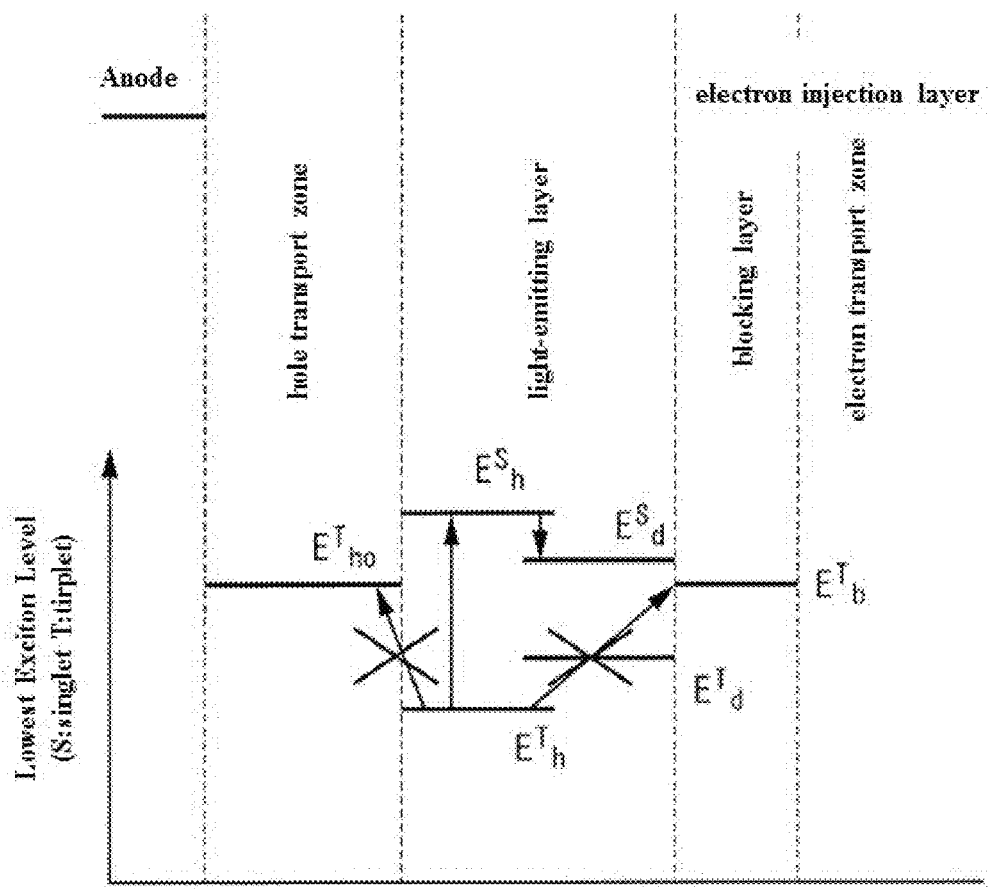
FIG. 1 is a diagram of the energy level of a conventional organic light-emitting diode in which a TTF phenomenon is enhanced in order to increase the external quantum efficiency.

Hereinafter, some embodiments which can be easily embodied by those skilled in the art will be described with reference to the accompanying drawings. In the drawings of the invention, sizes and dimensions of structures are illustrated by enlarging or reducing as compared with the actual sizes and dimensions to clarify the invention, the known configurations are not illustrated to exhibit characteristic configurations, and the invention is not limited to the drawings. In describing phenomenon of the preferred embodiments of the invention in detail, when it is determined that detailed description of the related known functions or configurations may unnecessarily obscure the gist of the invention, the detailed description is omitted.

In addition, the size and thickness of each configuration illustrated in the drawings are arbitrarily illustrated for the sake of convenience of explanation, and thus the present disclosure may not be necessarily limited to the illustration. Further, in the drawings, the thicknesses of layers and regions are exaggerated for clarity. It will be understood that when an element such as a layer, film, region or substrate is referred to as being "on" another element, it can be directly on the other element or intervening elements may also be present.

Throughout the specification, when a portion may "include" a certain constituent element, unless specified otherwise, it may not be construed to exclude another constituent element but may be construed to further include other constituent elements.

In addition, unless explicitly described to the contrary, the word "comprise" and variations such as "comprises" or "comprising" will be understood to imply the inclusion of stated elements but not the exclusion of any other elements. Further, Throughout the specification, the word "on" means positioning on or below the object portion, but does not essentially mean positioning on the lower side of the object portion based on a gravity direction.

Hereinafter, an organic light-emitting diode according to some embodiments of the present invention will be described with reference to the drawings.

Figure 2:
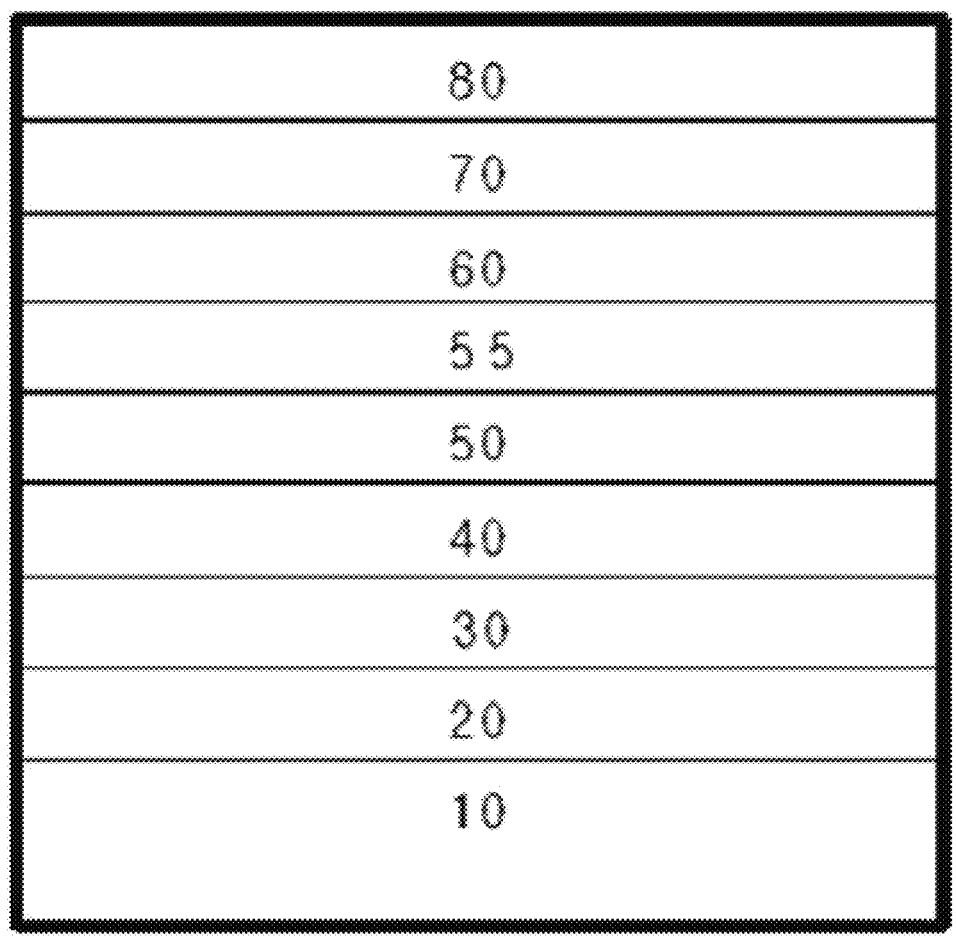
FIG. 2 is a diagram of the structure of an organic light-emitting diode according to some embodiments of the present disclosure.

FIG. 2 is a diagram of the structure of an organic light-emitting diode according to some embodiments of the present disclosure.

As can be seen in FIG. 2, the light-emitting diode according to some embodiments of the present disclosure comprises an anode, a hole transport layer, a light-emitting layer including a host and a dopant, an electron transport layer, and a cathode in that order, wherein an electron-density-controlling layer including an anthracene derivative represented by the following Chemical Formula A is disposed between the light-emitting layer and the electron transport layer, and an affinity $A_h$ (eV) of the host of the light-emitting layer, an affinity $A_{ed}$ (eV) of the electron-density-controlling layer, and an affinity $A_e$ (eV) of the electron transport layer satisfy the relationship $A_h \geq A_{ed} \geq A_e$:

[Chemical Formula A]

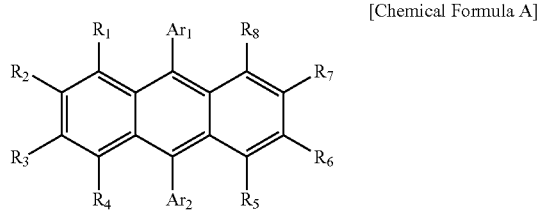

wherein, $Ar_1$ and $Ar_2$ may be the same or different, and are each independently a substituted or unsubstituted aryl of 6 to 50 carbon atoms, or a substituted or unsubstituted heteroaryl of 2 to 50 carbon atoms, and $R_1$ to $R_8$ may be the same or different, and are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkenyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 6 to 30 carbon atoms, a substituted or unsubstituted alkylsilyl of 1 to 30 carbon atoms, a substituted or unsubstituted arylsilyl of 6 to 30 carbon atoms, a substituted or unsubstituted alkyl germanium of 1 to 30 carbon atoms, a substituted or unsubstituted aryl germanium of 6 to 30 carbon atoms, a cyano, a nitro, and a halogen.

The term 'substituted' in the expression 'substituted or unsubstituted' means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a hetero arylamino of 2 to 24 carbon atoms, an alkylsilyl of 1 to 24 carbon atoms, an arylsilyl of 6 to 24 carbon atoms, and an aryloxy of 6 to 24 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. It may be a single or fused aromatic system including a 5- to 7-membered ring, and preferably a 5- to 6-membered ring. Further, the aromatic system may include a fused ring that is formed by adjacent substituents on the aryl radical.

Examples of the aryl include phenyl, naphthyl, anthryl, indenyl, fluorenyl, phenanthryl, triphenylenyl, pyrenyl, perylenyl, chrysenyl, naphthacenyl, and fluoranthenyl, but are not limited thereto.

At least one hydrogen atom of the aryl may be substituted by a deuterium atom, a halogen atom, hydroxy, nitro, cyano, silyl, amino (–NH$_2$, —NH(R), —N(R')(R") wherein R' and R" are each independently an alkyl of 1 to 10 alkyl, in this case, called "alkylamino"), amidino, hydrazine, hydrazone, carboxyl, sulfonic acid, phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The heteroaryl substituent used in the compound of the present disclosure refers to a cyclic aromatic system of 2 to 24 carbon atoms containing 1 to 4 heteroatoms selected from among N, O, P, Se, Te, Si, Ge and S. In the aromatic system, two or more rings may be fused. One or more hydrogen atoms on the heteroaryl may be substituted by the same substituents as on the aryl.

Examples of the alkyl substituent useful in the present disclosure include methyl, ethyl, propyl, isopropyl, isobutyl, sec-butyl, tert-butyl, pentyl, iso-amyl, and hexyl. At least one hydrogen atom of the alkyl may be substituted by the same substituent as in the aryl.

Examples of the alkoxy substituent useful in the present disclosure include methoxy, ethoxy, propoxy, isobutyloxy, sec-butyloxy, pentyloxy, iso-amyloxy, and hexyloxy. At least one hydrogen atom of the alkoxy may be substituted by the same substituent as in the aryl.

Representative among examples of the silyl useful in the present invention are trimethylsilyl, triethylsilyl, triphenylsilyl, trimethoxysilyl, dimethoxyphenylsilyl, diphenylmethylsilyl, silyl, diphenylvinylsilyl, methylcyclobutylsilyl, and dimethylfurylsilyl. One or more hydrogen atom of the silyl may be substituted by the same substituent as in the aryl.

In the organic light-emitting diode of the present disclosure, a hole injection layer may be introduced between the anode and the hole transport layer while an electron injection layer is disposed between the electron transport layer and the cathode.

FIG. 2 shows the structure of the organic light-emitting diode comprising the hole injection layer and the electron injection layer according to some embodiments of the present disclosure.

In detail, the light-emitting diode according to some embodiments of the present invention comprises an anode 20, a hole transport layer 40, a light-emitting layer 50, an electron-density-controlling layer 55, an electron transport layer 60, and a cathode 80, and optionally a hole injection layer 30 and an electron injection layer 70. In addition, one or two intermediate layers may further be formed in the organic light-emitting diode.

Reference is made to FIG. 2 with regard to the structure and fabrication of the organic light-emitting diode of the present disclosure. First, a substrate 10 is coated with an anode electrode material to form an anode 20. So long as it is used in a typical organic EL device, any substrate may be taken as the substrate 10. Preferable is an organic substrate or a transparent plastic substrate that exhibits excellent transparency, surface smoothness, and ease of handling. As the anode electrode material, indium tin oxide (ITO), indium zinc oxide (IZO), tin oxide ($SnO_2$), or zinc oxide (ZnO) may be used because of the high transparency and conductivity thereof.

A hole injection layer material is applied on the anode electrode 20 by thermal deposition in a vacuum or by spin coating to form a hole injection layer 30. Subsequently, thermal deposition in a vacuum or spin coating may also be conducted so as to deposit a hole transport layer material on the hole injection layer 30, resulting in the formation of a hole transport layer 40.

No particular limitations are imposed on the hole injection layer material that is typically used in the art. For example, mention may be made of 2-TNATA [4,4',4"-tris(2-naphthylphenyl-phenylamino)-triphenylamine], NPD[N,N'-di(1-naphthyl)-N,N'-diphenylbenzidine)], TPD[N,N'-diphenyl-N,N'-bis(3-methylphenyl)-1,1'-biphenyl-4,4'-diamine], and DNTPD[N,N'-diphenyl-N,N'-bis-[4-(phenyl-m-tolyl-amino)-phenyl]-biphenyl-4,4'-diamine], but are not limited thereto.

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenyl-benzidine (a-NPD).

Then, a light-emitting layer 50 is deposited on the hole transport layer 40 by vacuum deposition or spin coating, followed by the formation of a thin electron-density-controlling layer 55 on the organic light-emitting layer 50 by vacuum deposition or spin coating.

In some embodiments of the present disclosure, the light-emitting layer may comprise a host and a dopant.

In some embodiments of the present disclosure, the light-emitting layer particularly ranges in thickness from 50 to 2,000 Å.

Together with a dopant, a host material may be employed in the light-emitting layer. When the light-emitting layer comprises a host and a dopant, the content of the dopant may range from about 0.01 to 20 parts by weight based on 100 parts by weight of the host, but is not limited thereto.

The host available in the light-emitting layer of the organic light-emitting diode according to an embodiment of the present disclosure may be at least one of the compounds represented by the following Chemical Formula 1A:

[Chemical Formula 1A]

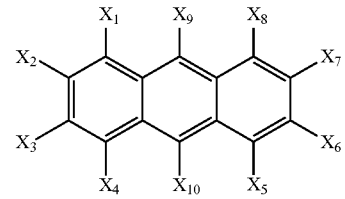

wherein, $X_1$ to $X_{10}$ may be the same or different and are each independently selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 6 to 30 carbon atoms, a substituted or unsubstituted aryl of 6 to 50 carbon atoms, a substituted or unsubstituted heteroaryl of 3 to 50 carbon atoms containing at least one heteroatom selected from among O, N, and S, a substituted or unsubstituted silicone, a substituted or unsubstituted boron, a substituted or unsubstituted silane, a carbonyl, a phosphoryl, an amino, a nitrile, a hydroxy, a nitro, a halogen, an amide, and an ester wherein adjacent moieties of $X_1$ to $X_{10}$ may form a fused, aliphatic, aromatic, heteroaliphatic or heteroaromatic ring.

Concrete examples of the host may include, but are not limited to, compounds represented by the following Compounds 1 to 196:

[Cpd. 1]

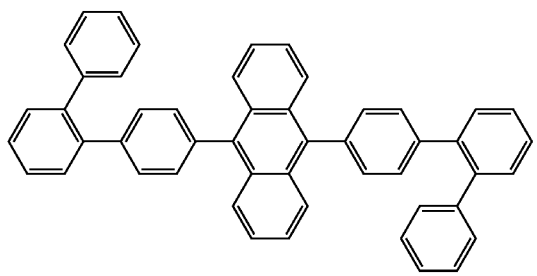

[Cpd. 2]

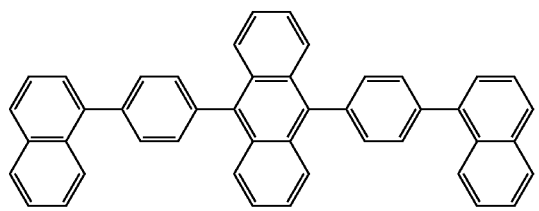

-continued
[Cpd. 3]
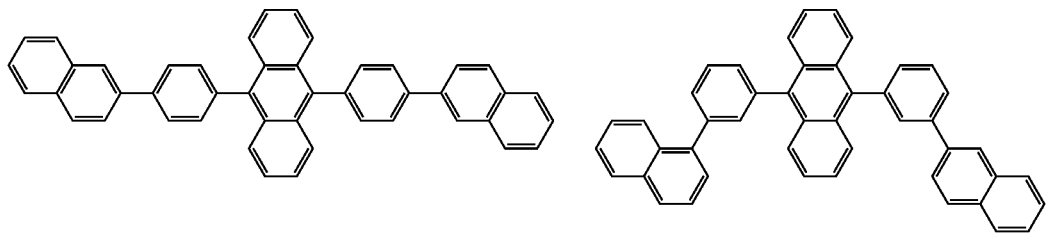
[Cpd. 4]
[Cpd. 5]
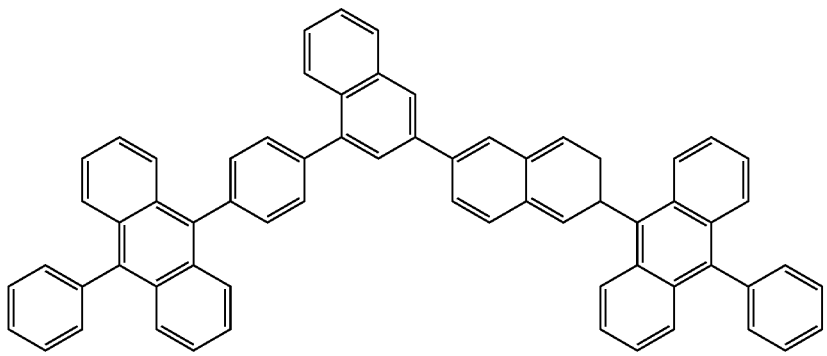
[Cpd. 6]
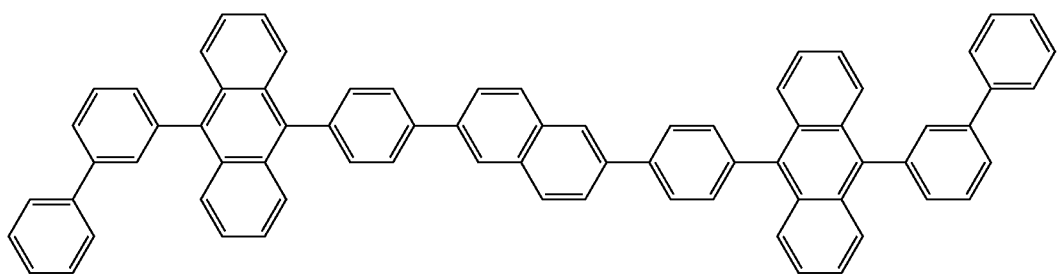
[Cpd. 7]
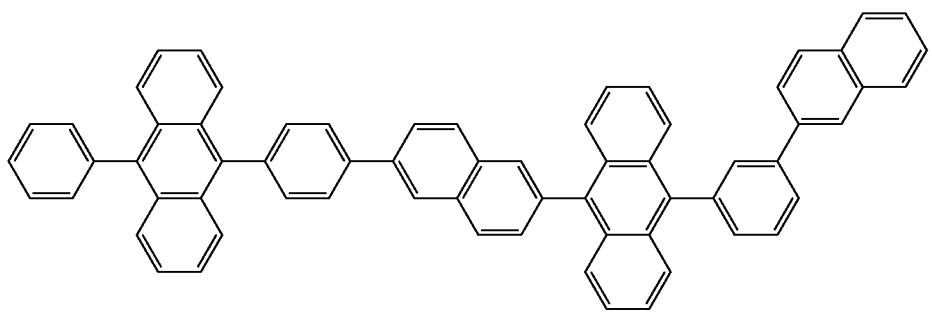
[Cpd. 8]
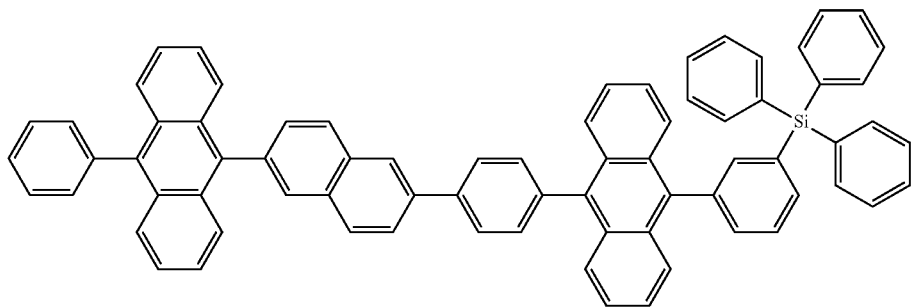

-continued
[Cpd. 9]
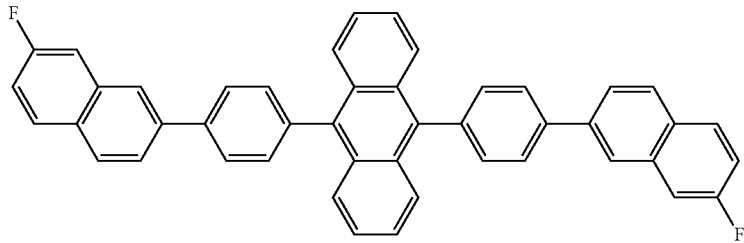
[Cpd. 10]
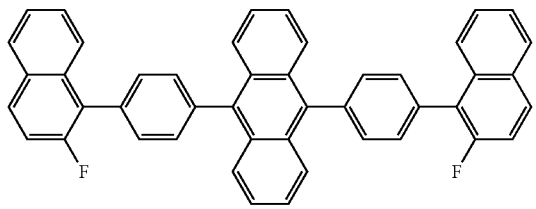
[Cpd. 11]
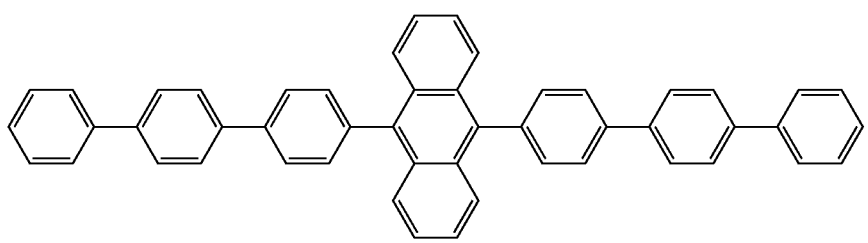
[Cpd. 12]
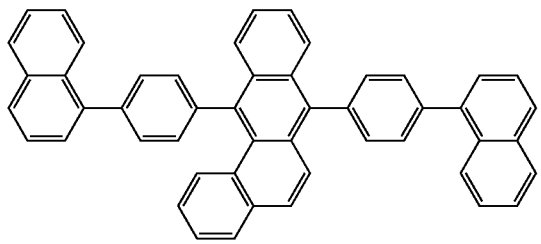
[Cpd. 13]
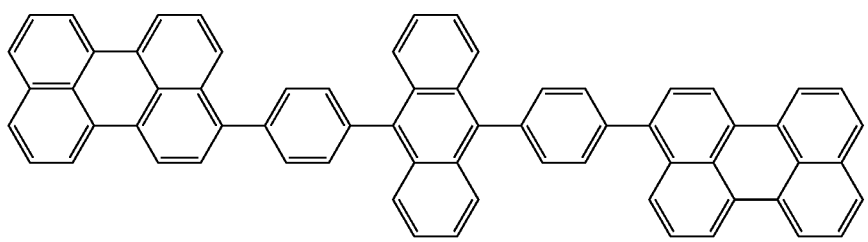
[Cpd. 14]
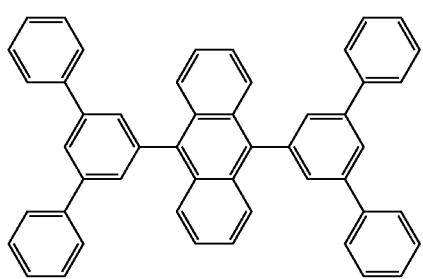
[Cpd. 15]
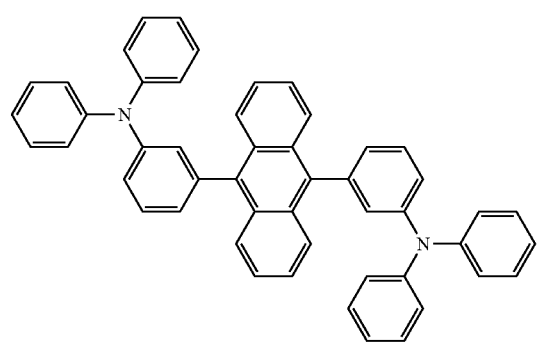

[Cpd. 16]
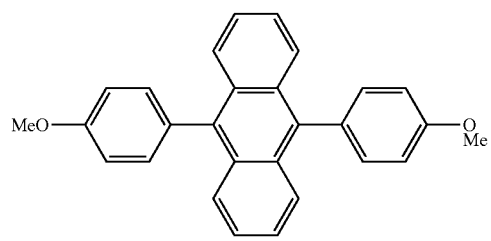
[Cpd. 17]
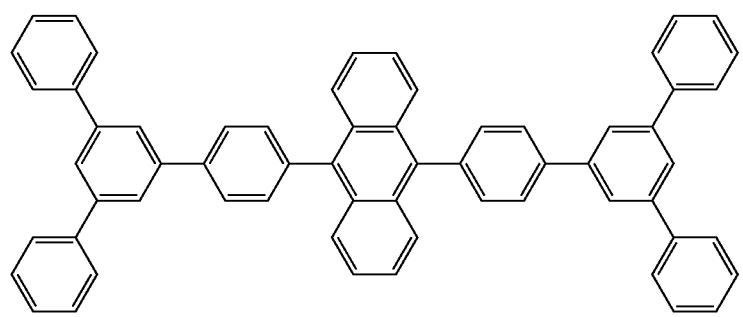
[Cpd. 18]
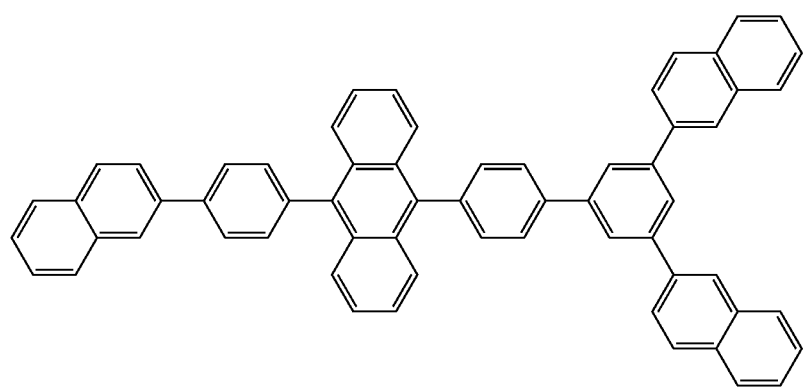
[Cpd. 19]
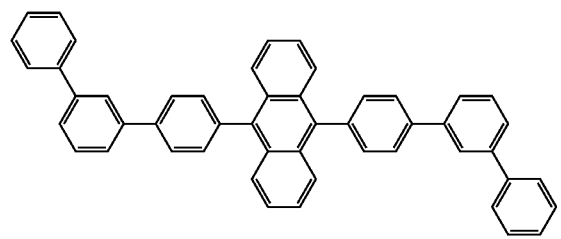
[Cpd. 20]
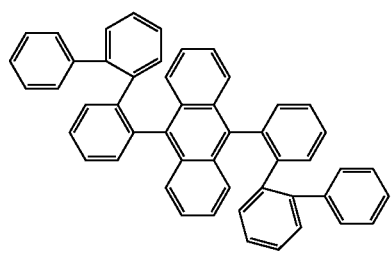

-continued
[Cpd. 21]
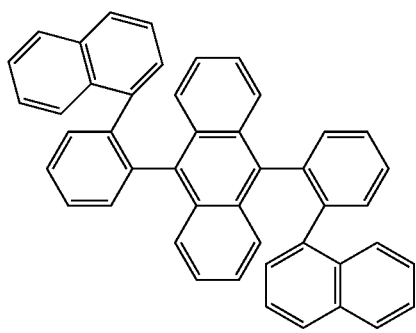
[Cpd. 22]
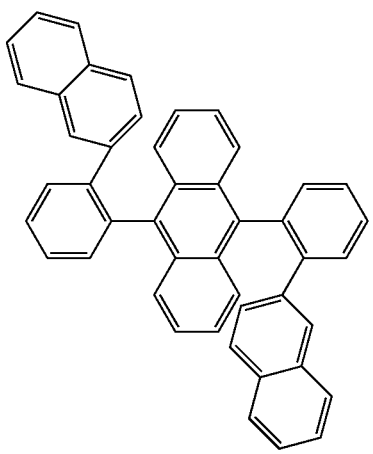
[Cpd. 23]
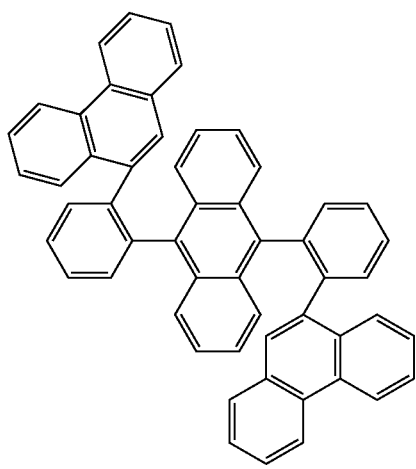
[Cpd. 24]
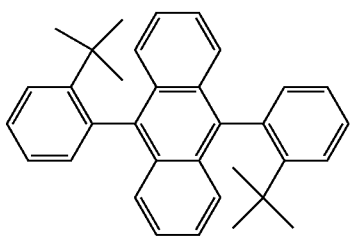
[Cpd. 25]
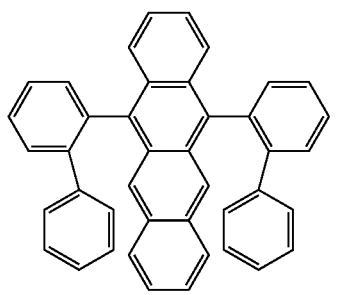
[Cpd. 26]
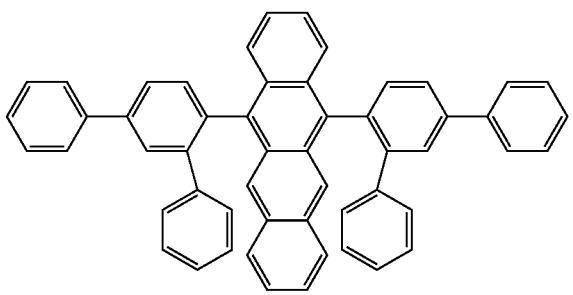
[Cpd. 27]
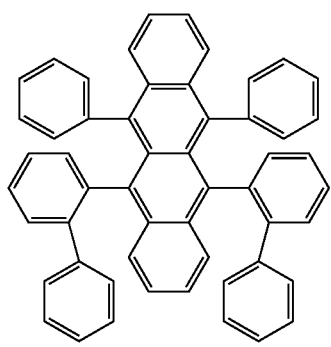
[Cpd. 28]
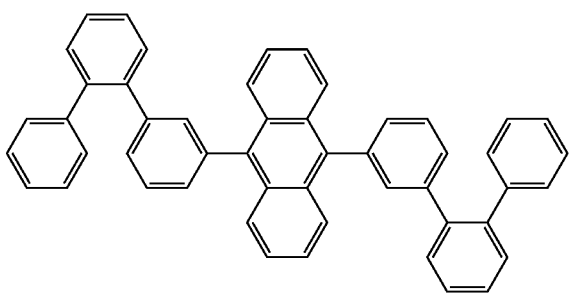

-continued
[Cpd. 29]
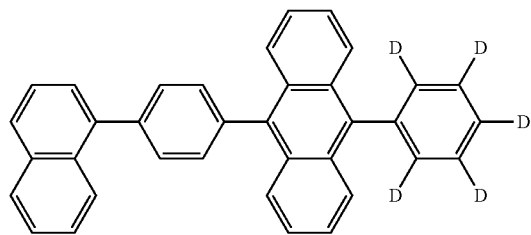
[Cpd. 30]
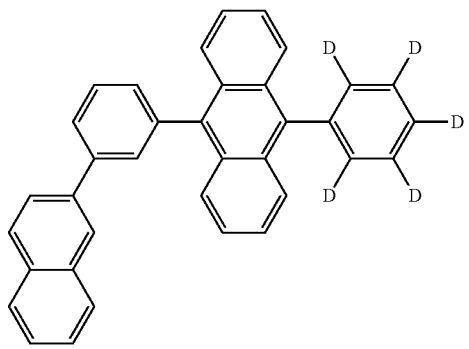
[Cpd. 31]
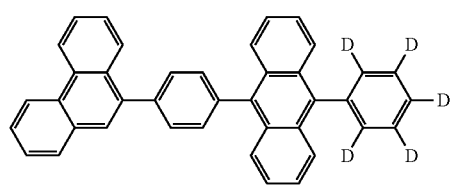
[Cpd. 32]
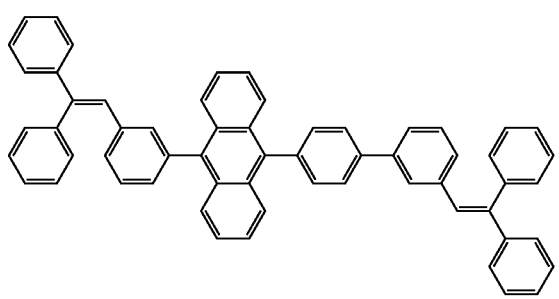
[Cpd. 33]
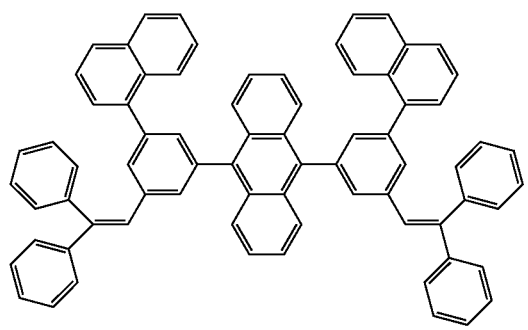
[Cpd. 34]
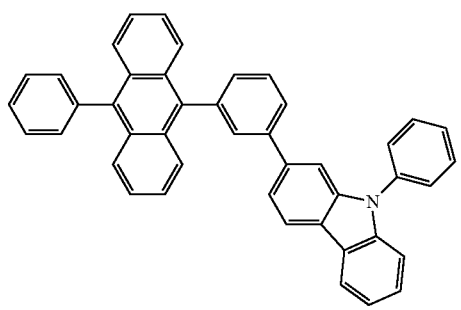
[Cpd. 35]
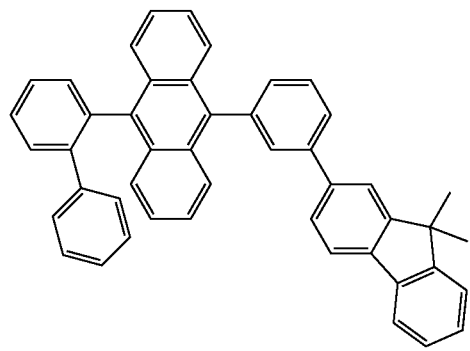
[Cpd. 36]
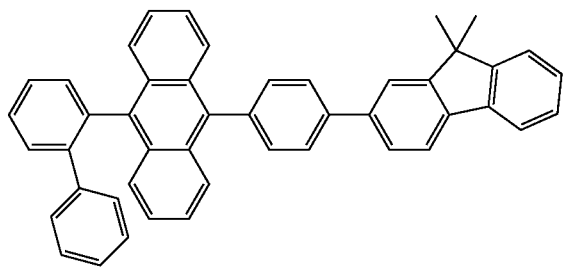

-continued
[Cpd. 37]
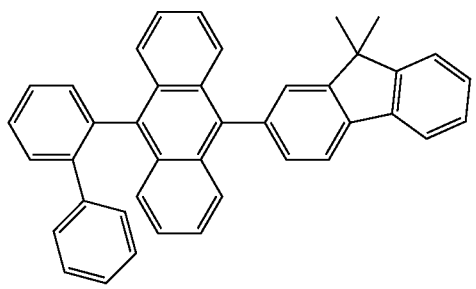
[Cpd. 38]
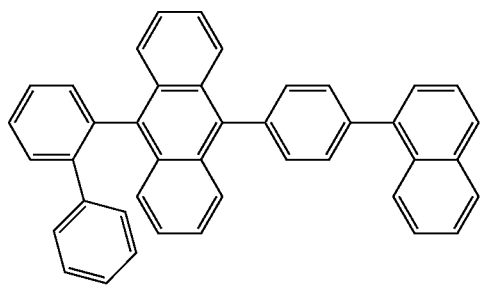
[Cpd. 39]
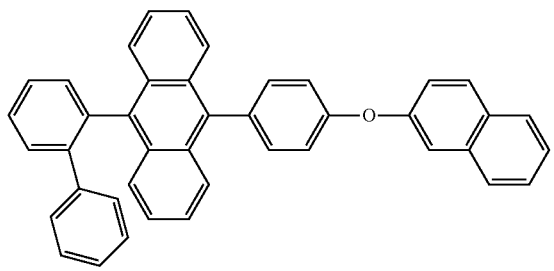
[Cpd. 40]
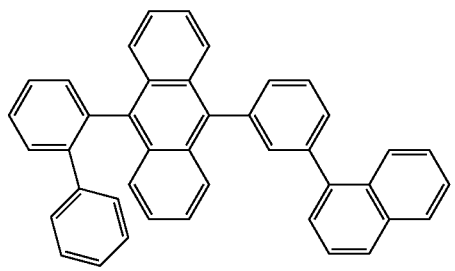
[Cpd. 41]
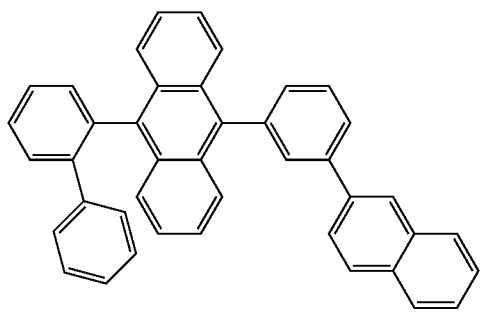
[Cpd. 42]
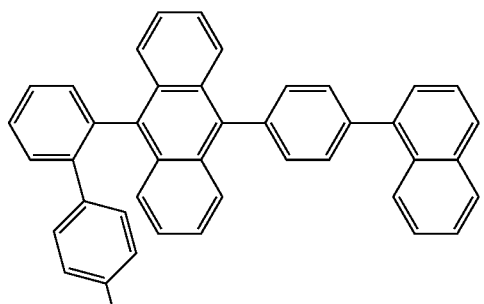
[Cpd. 43]
[Cpd. 44]
[Cpd. 45]
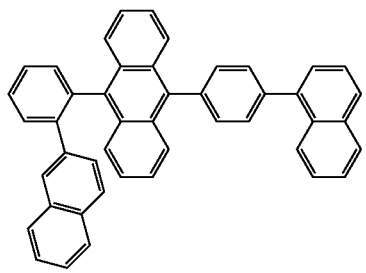
[Cpd. 46]
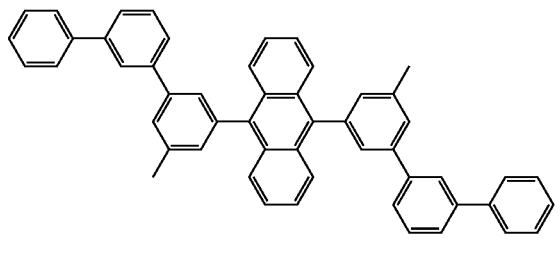
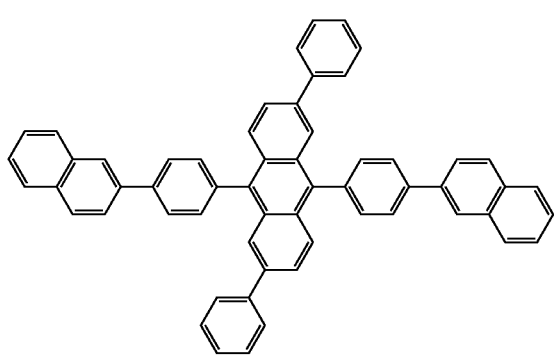
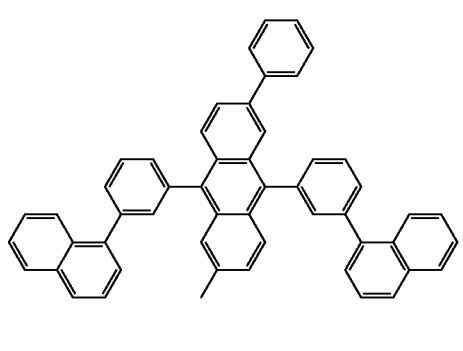

-continued
[Cpd. 47]
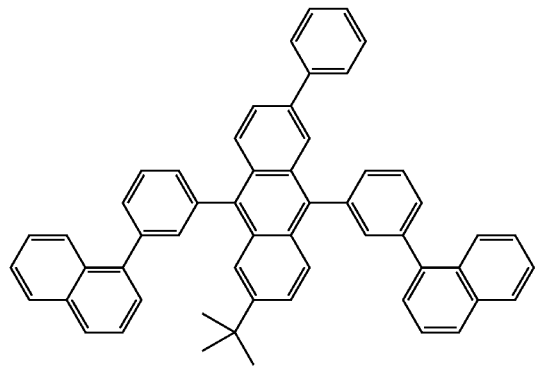
[Cpd. 48]
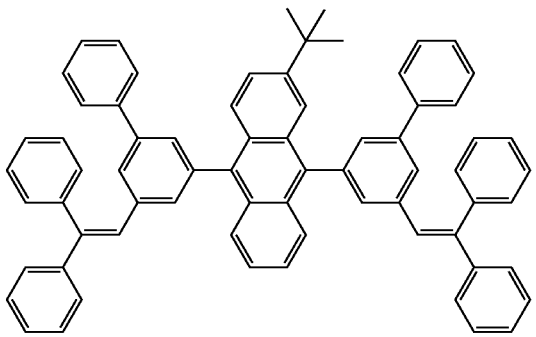
[Cpd. 49]
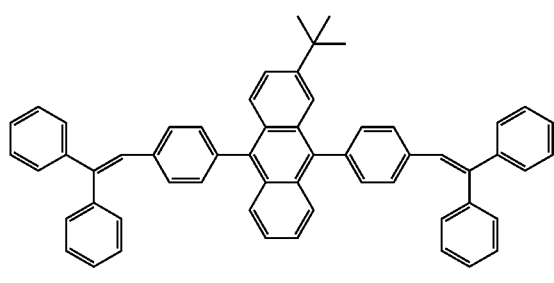
[Cpd. 50]
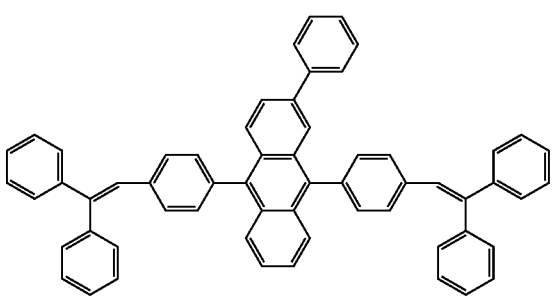
[Cpd. 51]
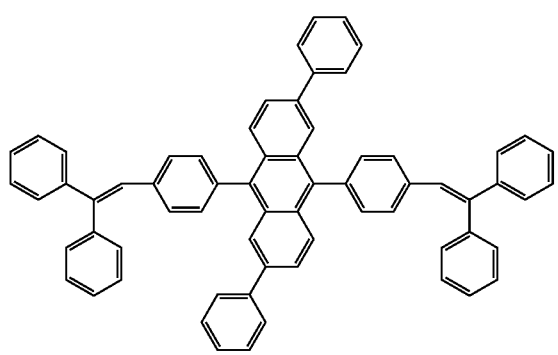
[Cpd. 52]
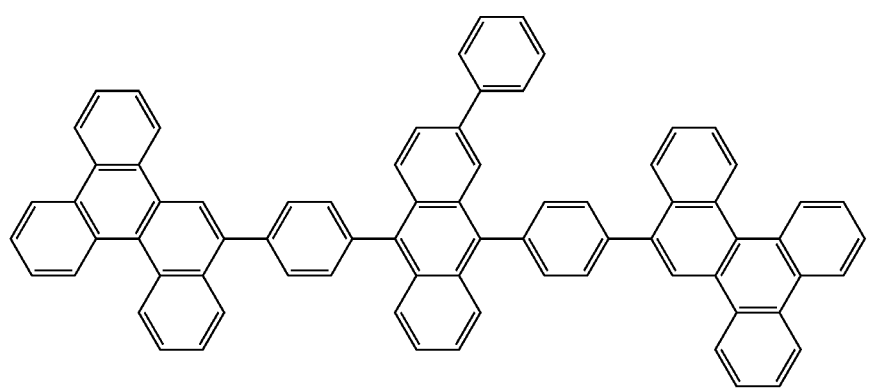

-continued
[Cpd. 53] [Cpd. 54]
[Cpd. 55] [Cpd. 56]
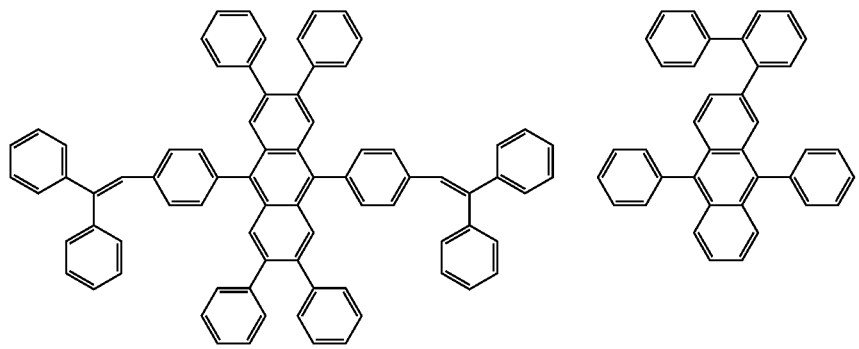
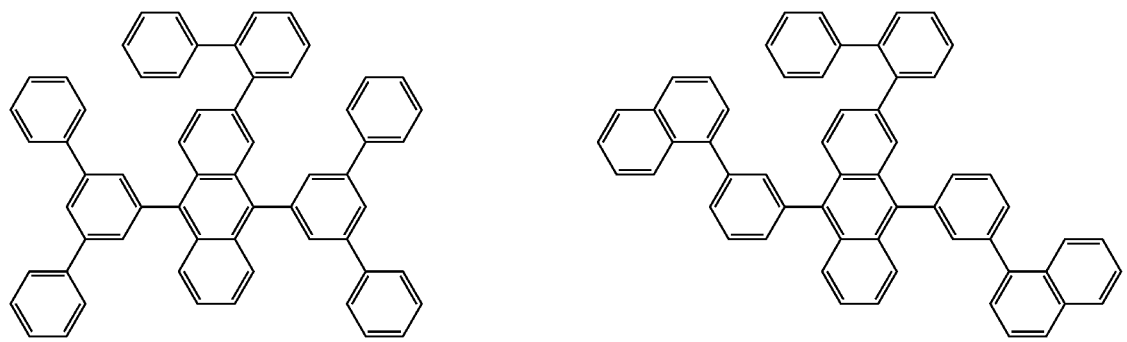
[Cpd. 57] [Cpd. 58]
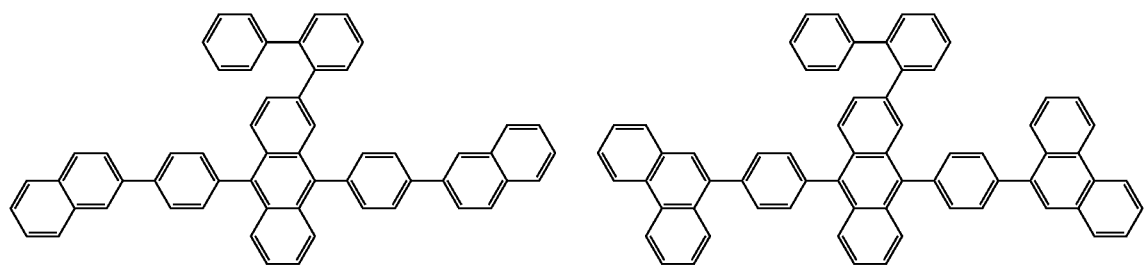
[Cpd. 59] [Cpd. 60]
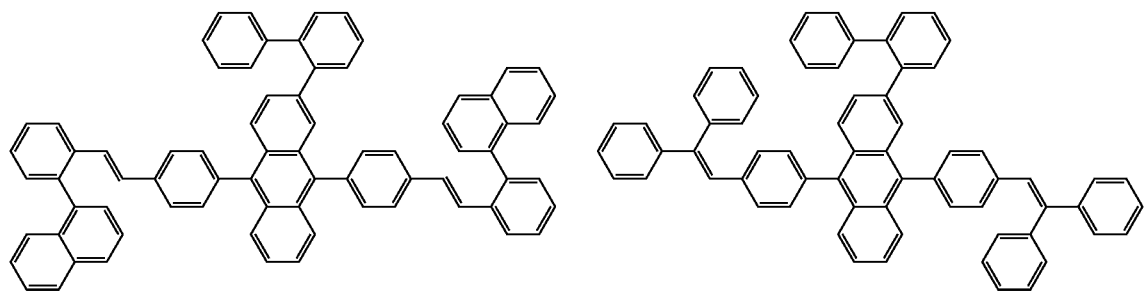

-continued
[Cpd. 61]
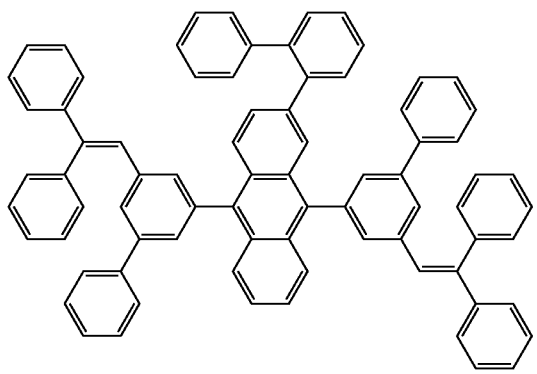
[Cpd. 62]
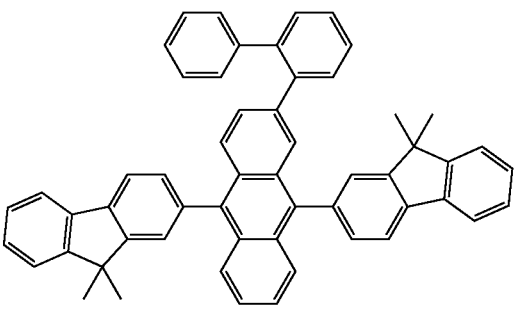
[Cpd. 63]
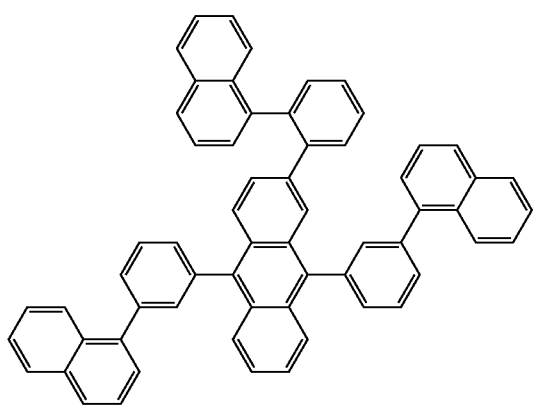
[Cpd. 64]
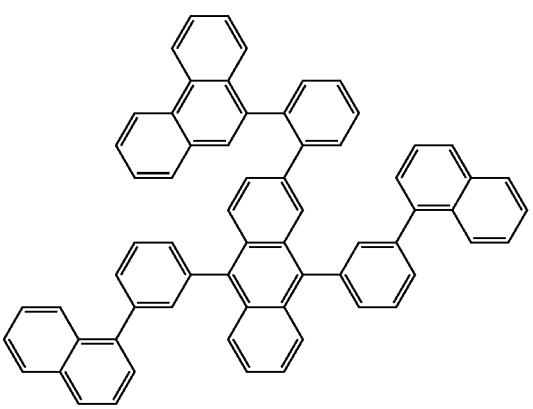
[Cpd. 65]
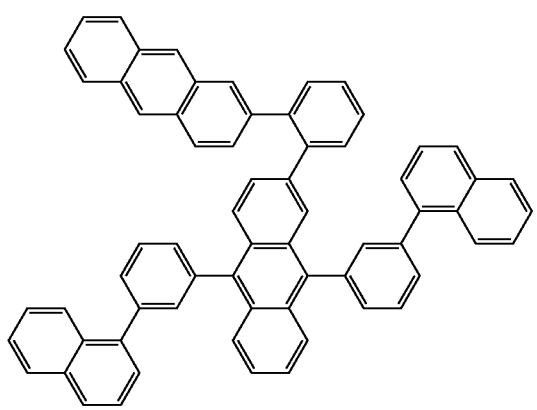
[Cpd. 66]
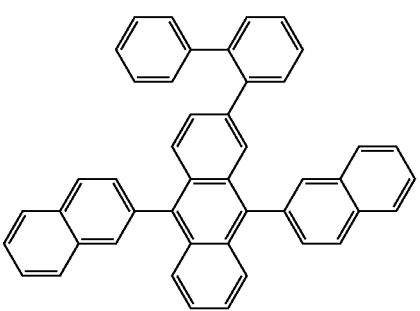
[Cpd. 67]
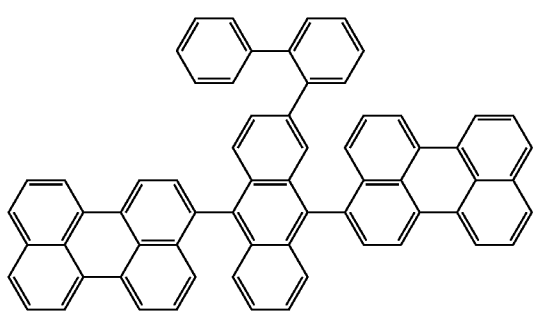
[Cpd. 68]
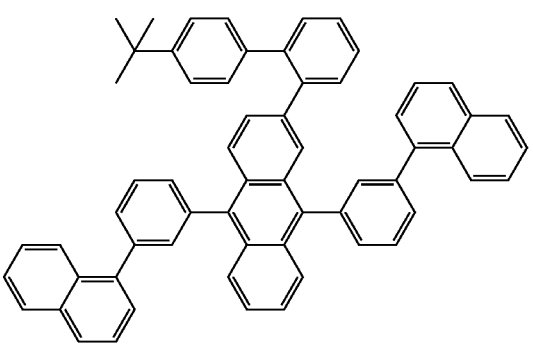

-continued
[Cpd. 69]
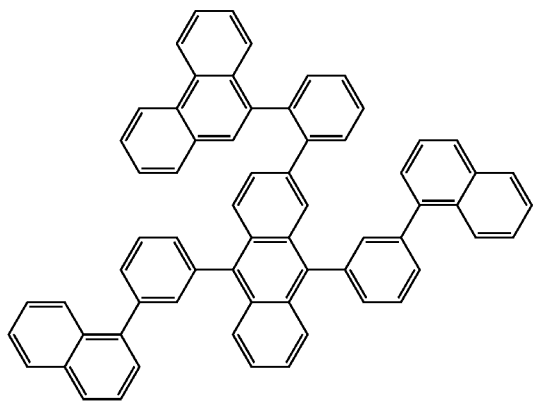
[Cpd. 70]
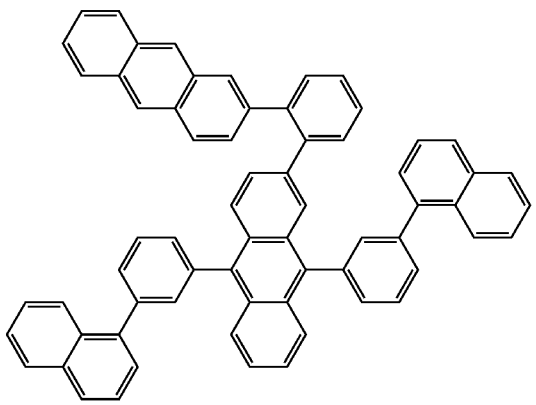
[Cpd. 71]
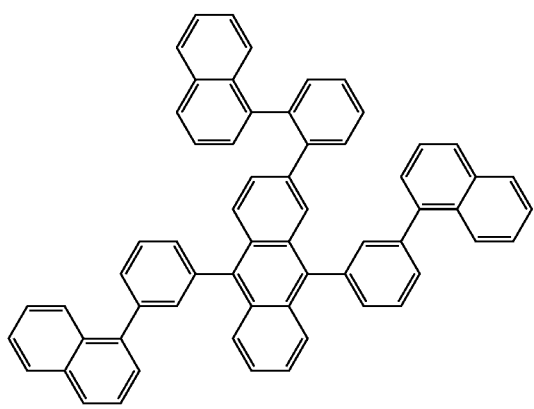
[Cpd. 72]
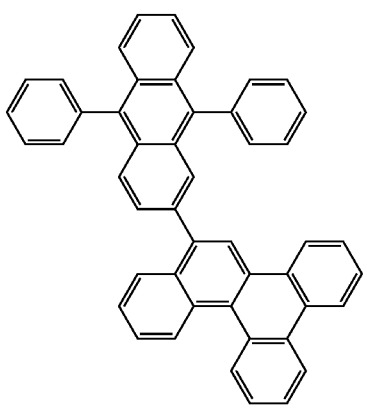
[Cpd. 73]
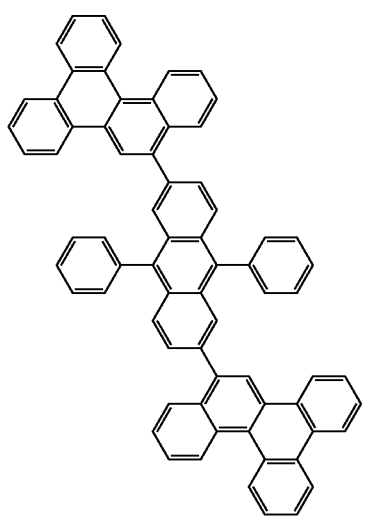
[Cpd. 74]
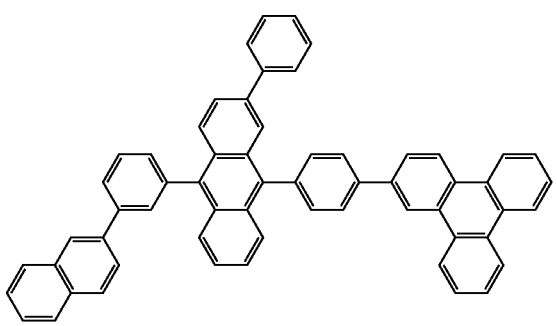

-continued
[Cpd. 75]
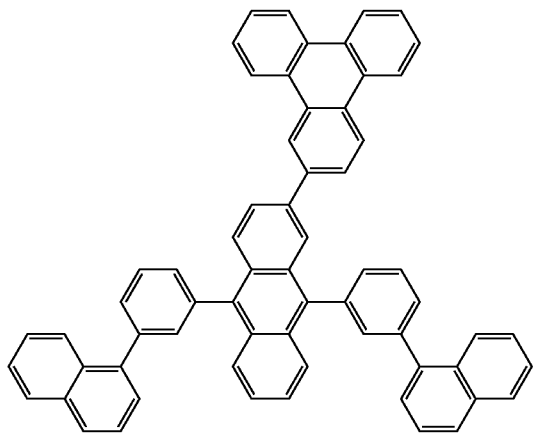
[Cpd. 76]
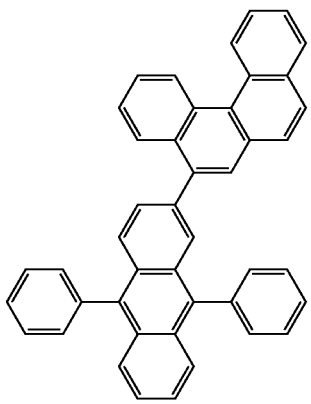
[Cpd. 77]
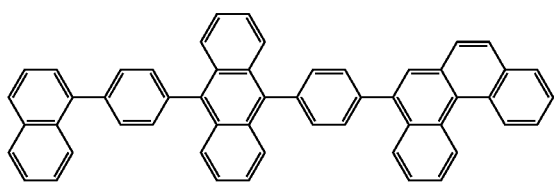
[Cpd. 78]
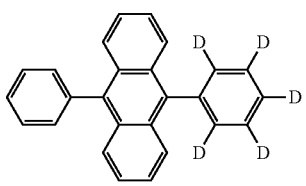
[Cpd. 79]
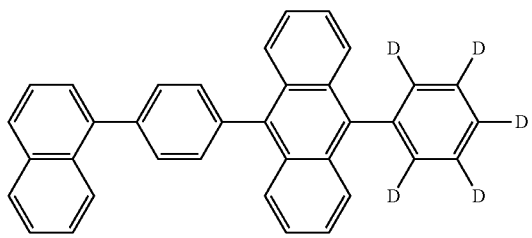
[Cpd. 80]
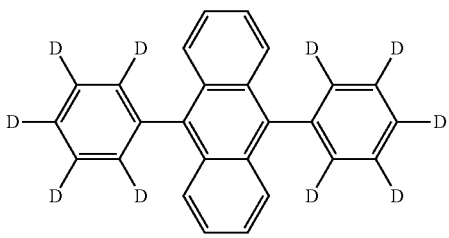
[Cpd. 81]
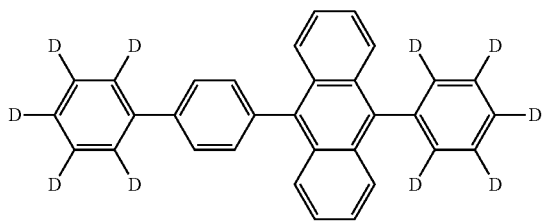
[Cpd. 82]
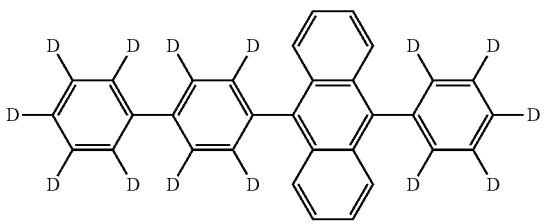
[Cpd. 83]
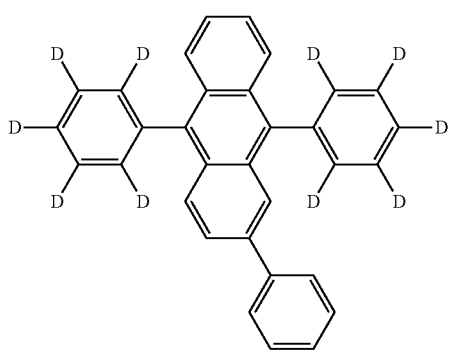
[Cpd. 84]
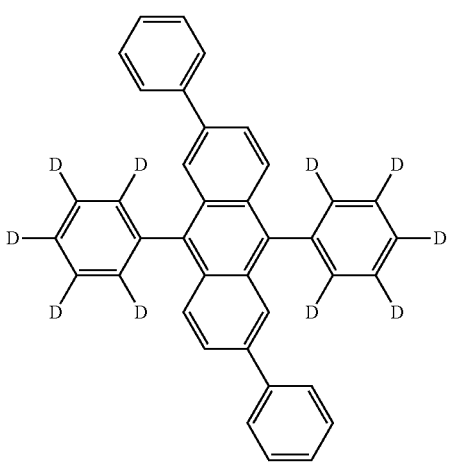

-continued
[Cpd. 85]
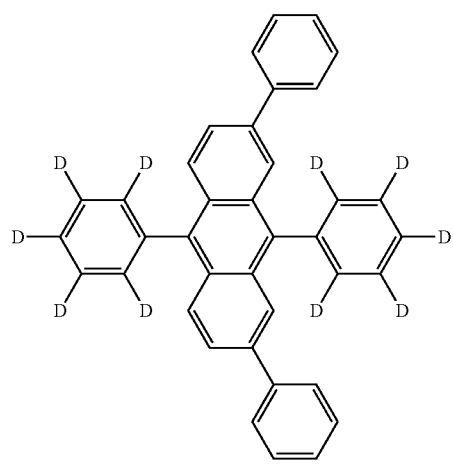
[Cpd. 86]
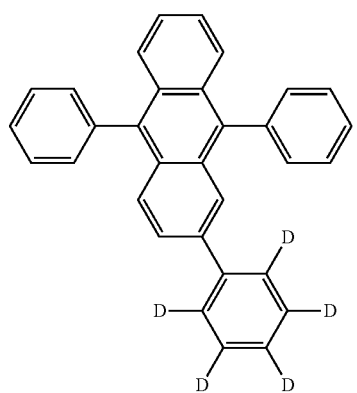
[Cpd. 87]
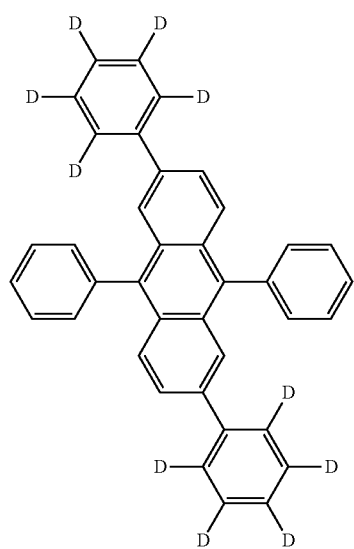
[Cpd. 88]
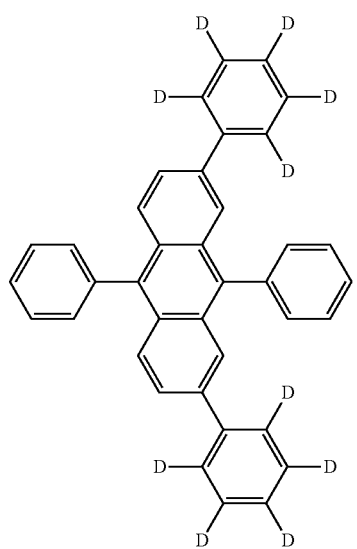
[Cpd. 89]
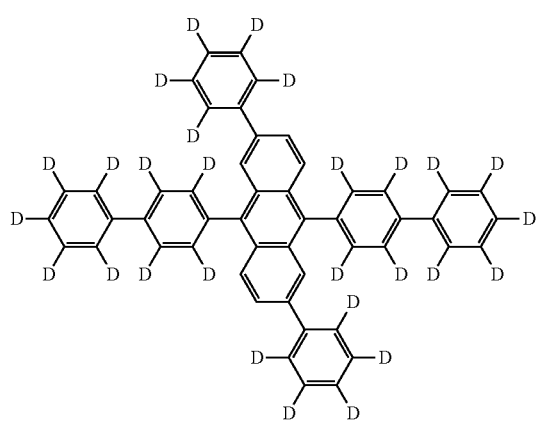
[Cpd. 90]
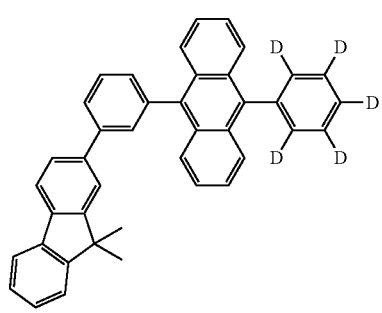

-continued
[Cpd. 91]
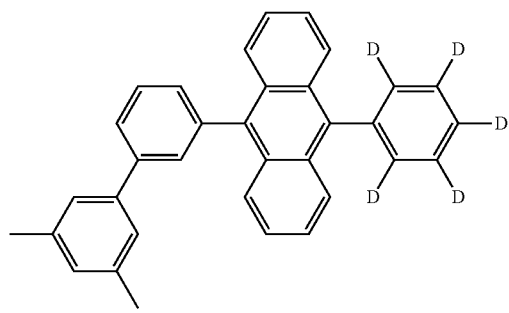
[Cpd. 92]
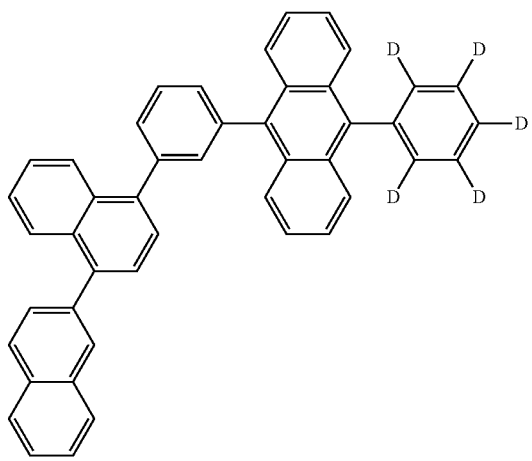
[Cpd. 93]
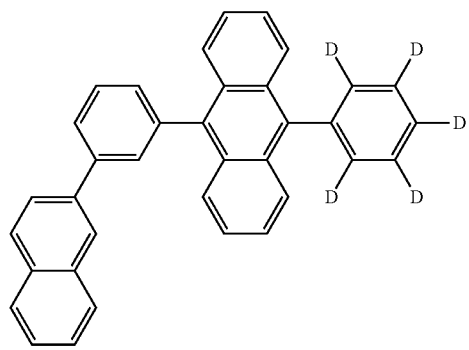
[Cpd. 94]
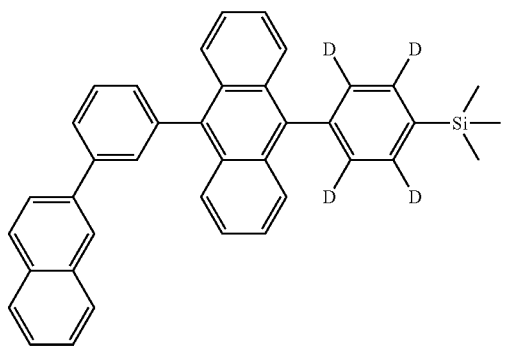
[Cpd. 95]
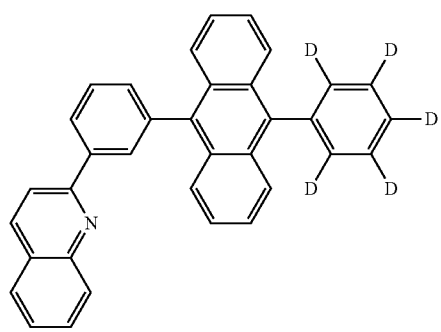
[Cpd. 96]
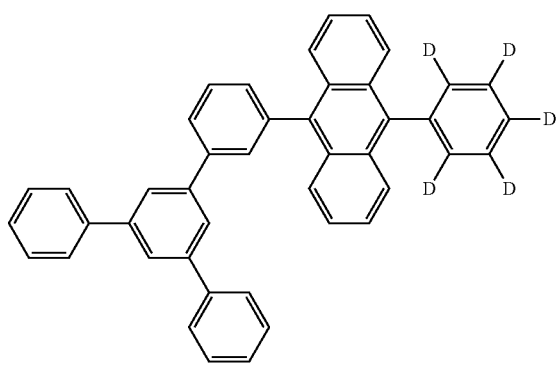
[Cpd. 97]
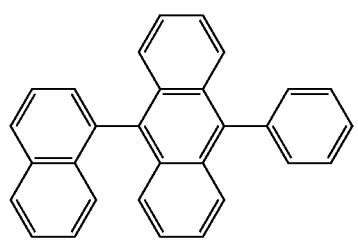
[Cpd. 98]
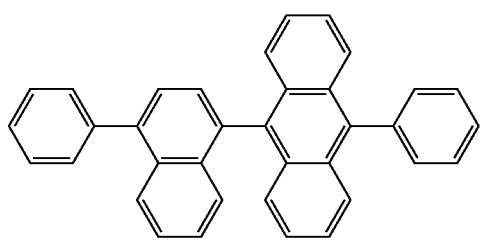

-continued
[Cpd. 99]
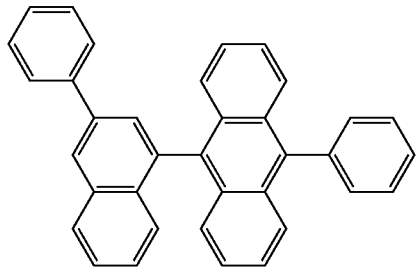
[Cpd. 100]
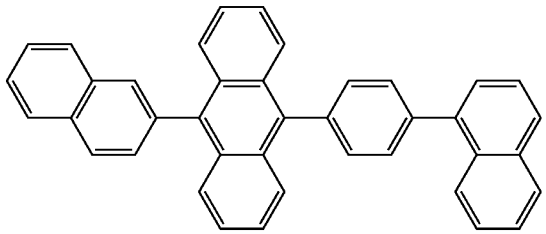
[Cpd. 101]
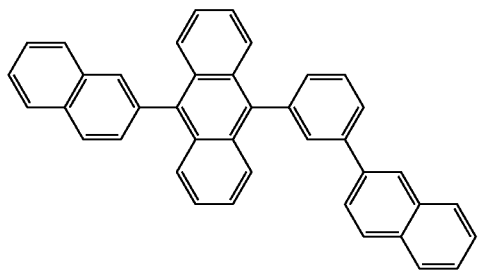
[Cpd. 102]
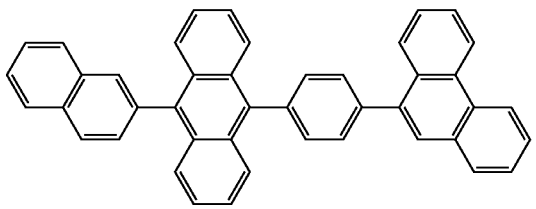
[Cpd. 103]
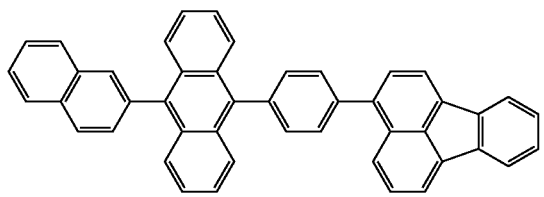
[Cpd. 104]
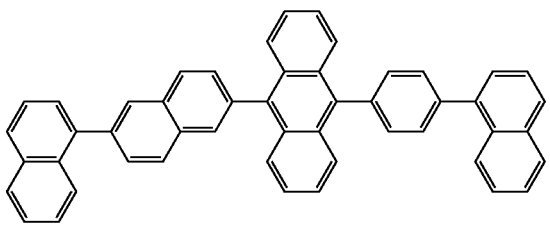
[Cpd. 105]
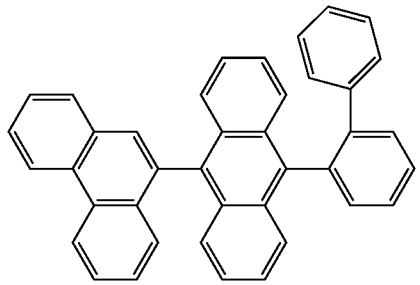
[Cpd. 106]
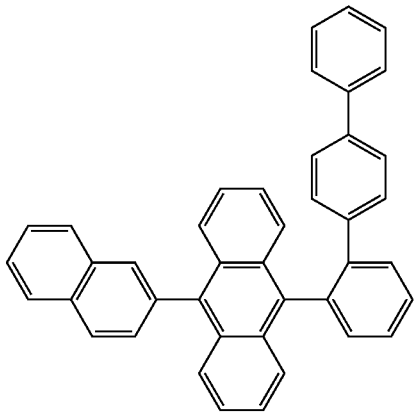
[Cpd. 107]
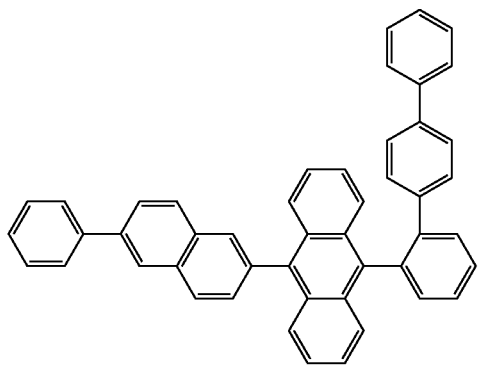
[Cpd. 108]
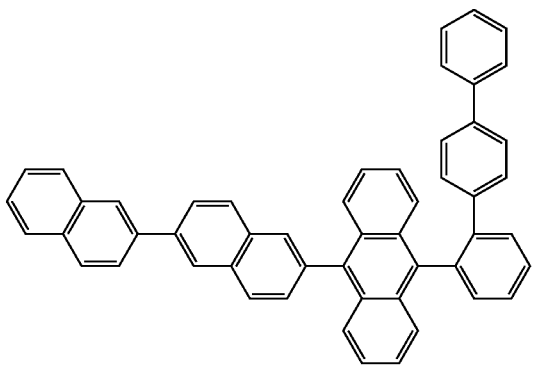

[Cpd. 109]
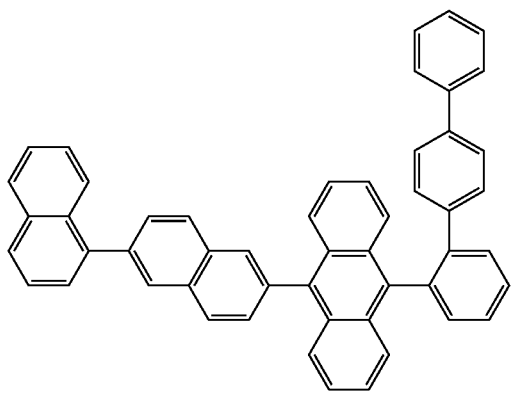
[Cpd. 110]
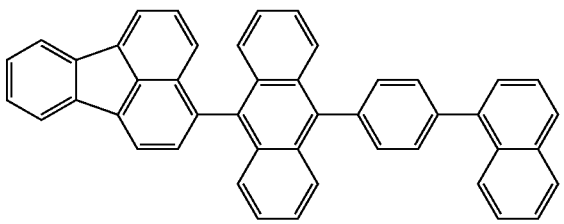
[Cpd. 111]
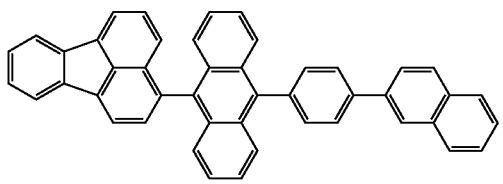
[Cpd. 112]
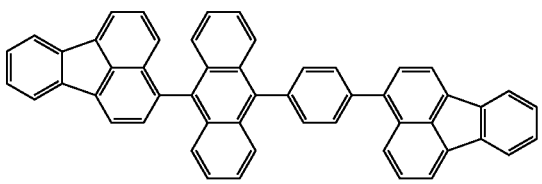
[Cpd. 113]
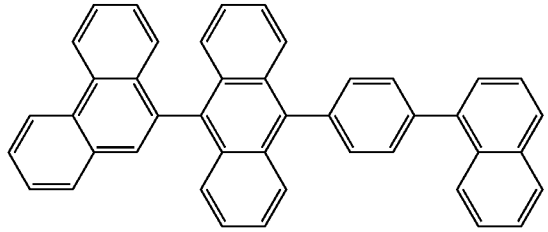
[Cpd. 114]
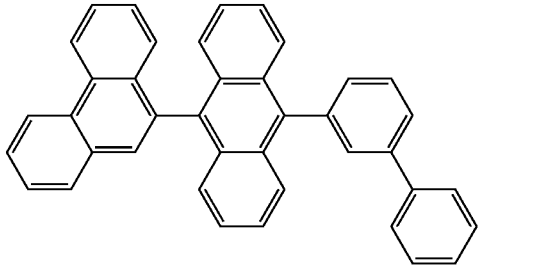
[Cpd. 115]
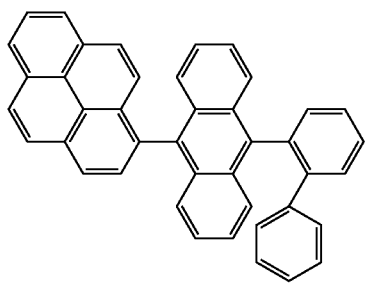
[Cpd. 116]
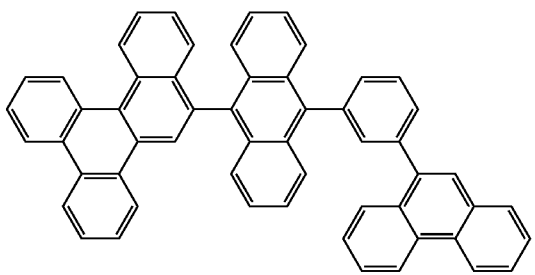
[Cpd. 117]
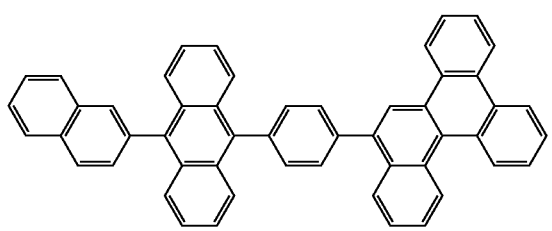
[Cpd. 118]
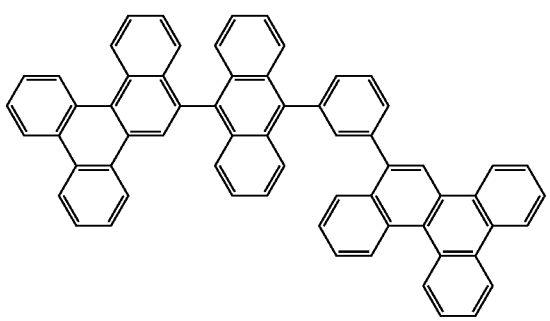

-continued
[Cpd. 119]
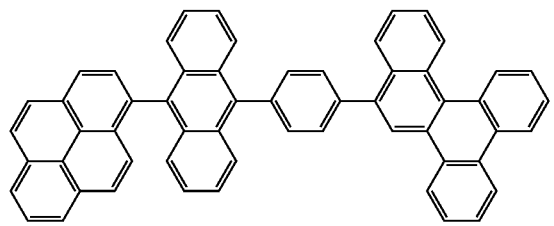
[Cpd. 120]
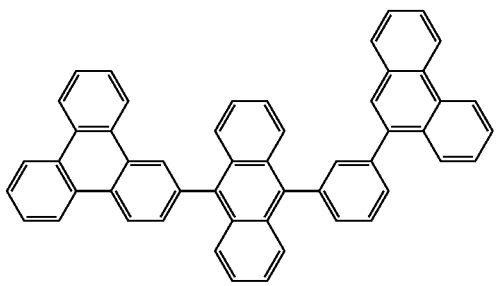
[Cpd. 121]
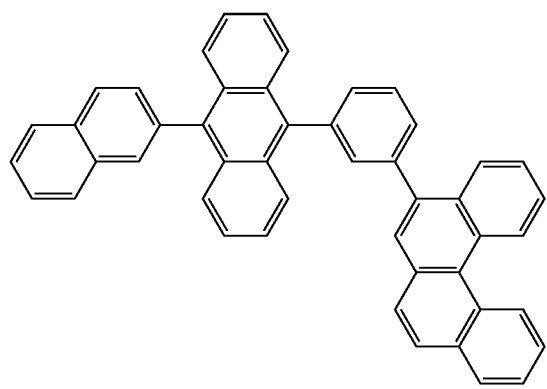
[Cpd. 122]
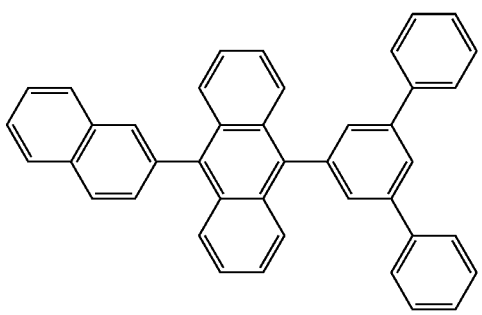
[Cpd. 123]
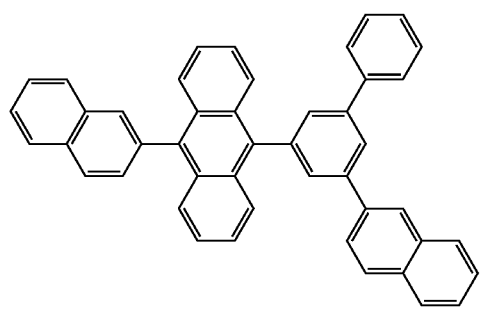
[Cpd. 124]
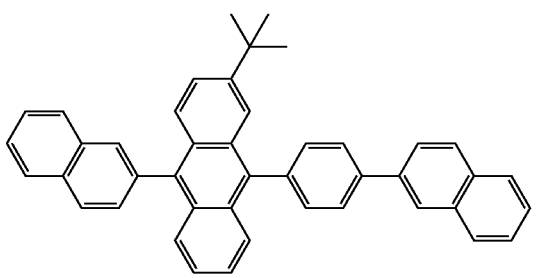
[Cpd. 125]
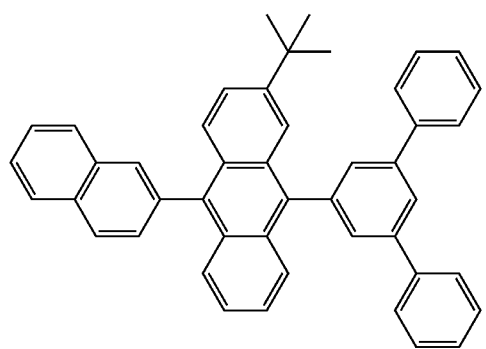
[Cpd. 126]
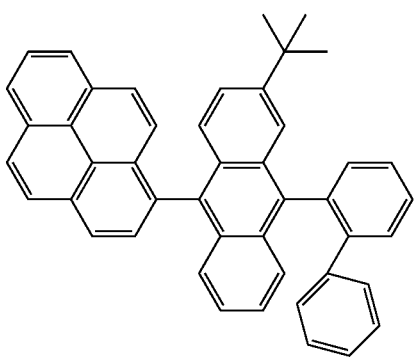

-continued
[Cpd. 127]
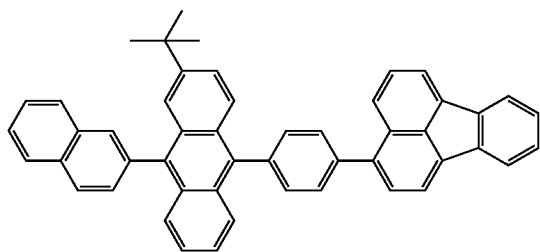
[Cpd. 128]
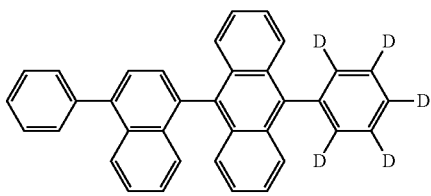
[Cpd. 129]
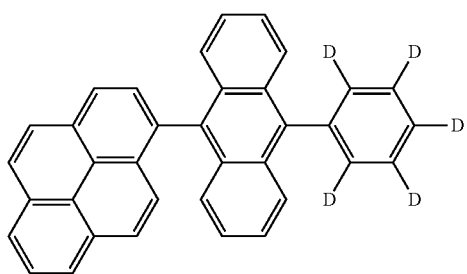
[Cpd. 130]
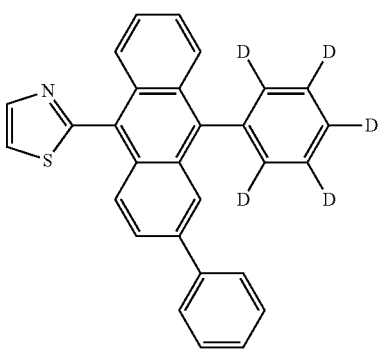
[Cpd. 131]
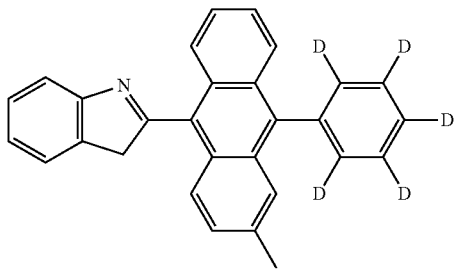
[Cpd. 132]
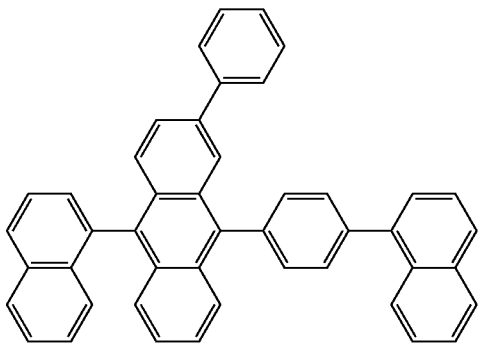
[Cpd. 133]
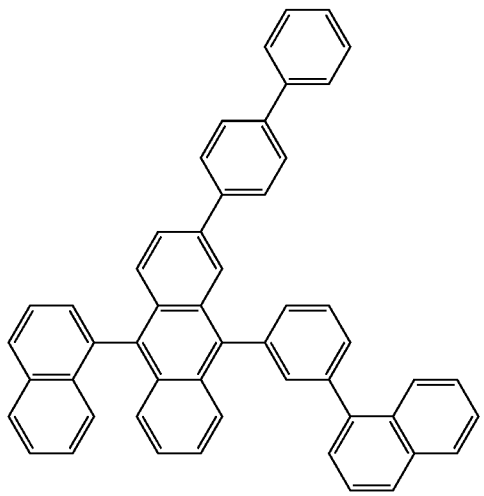
[Cpd. 134]
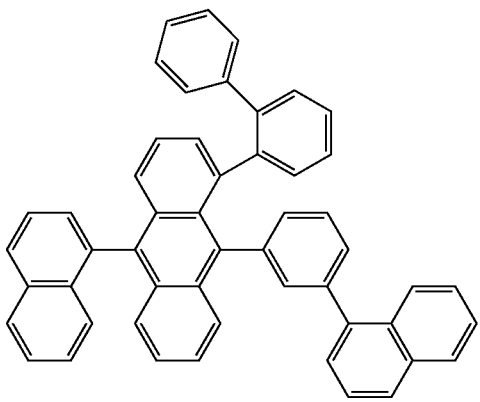

[Cpd. 135]
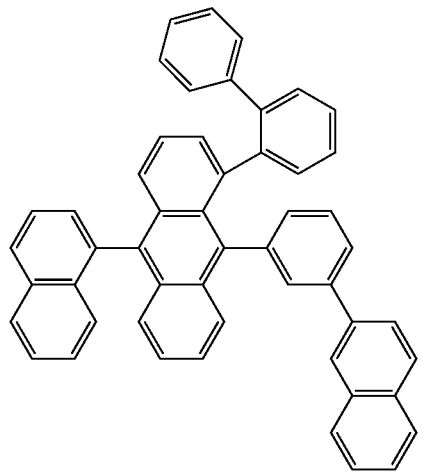
[Cpd. 136]
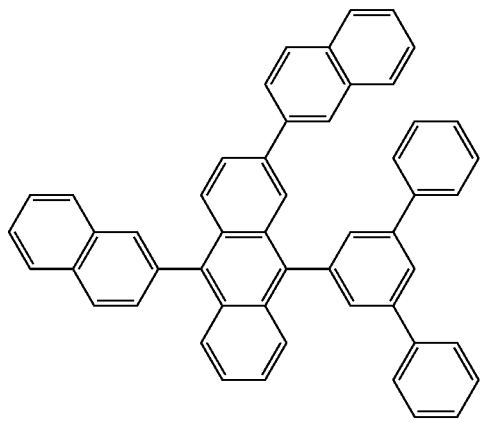
[Cpd. 137]
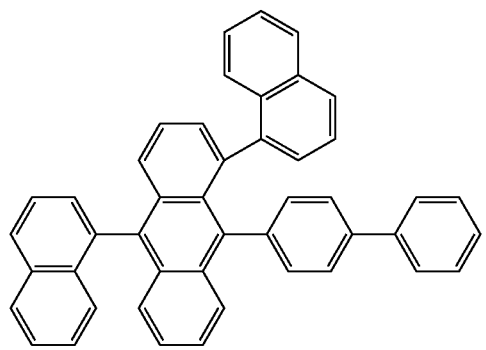
[Cpd. 138]
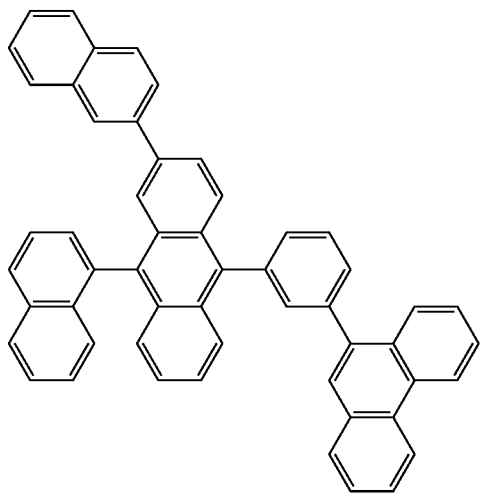
[Cpd. 139]
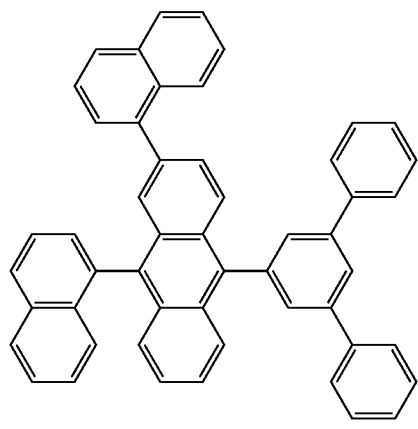
[Cpd. 140]
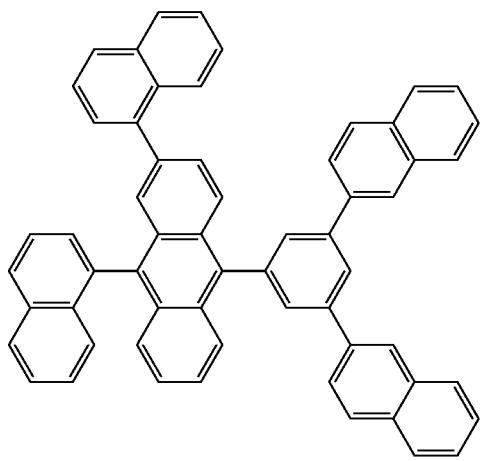

-continued
[Cpd. 141]
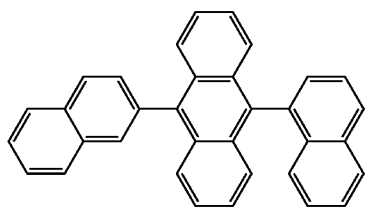
[Cpd. 142]
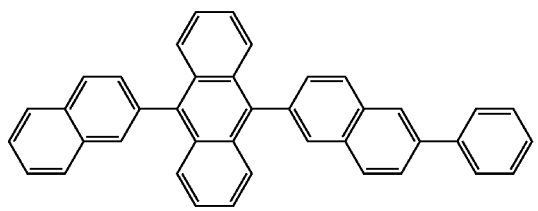
[Cpd. 143]
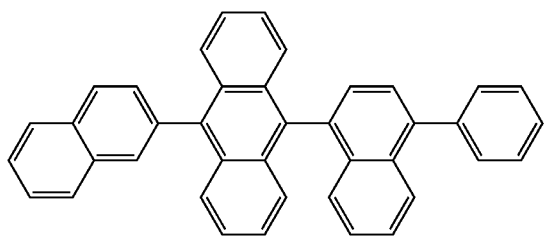
[Cpd. 144]
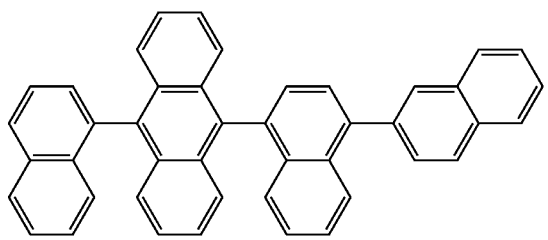
[Cpd. 145]
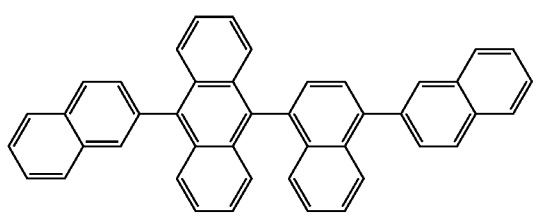
[Cpd. 146]
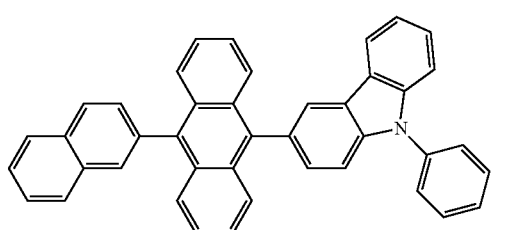
[Cpd. 147]
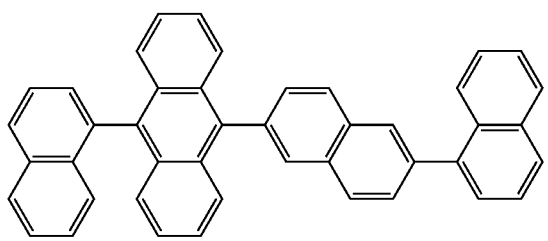
[Cpd. 148]
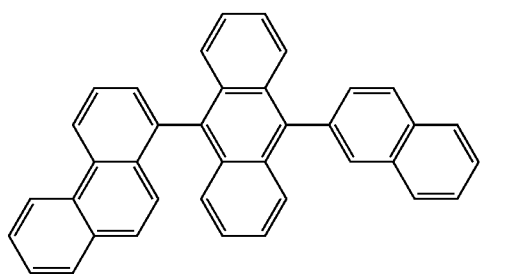
[Cpd. 149]
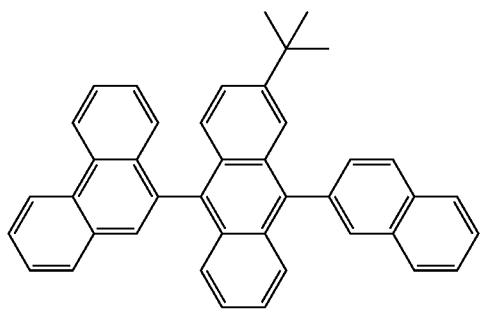
[Cpd. 150]
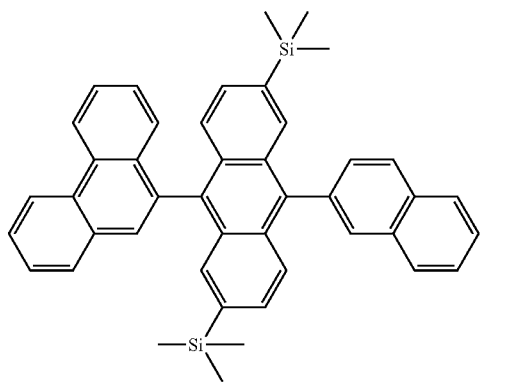

[Cpd. 151]
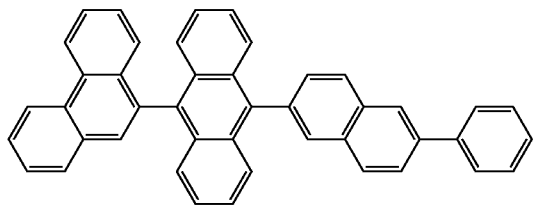
[Cpd. 152]
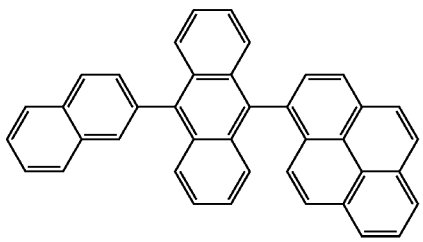
[Cpd. 153]
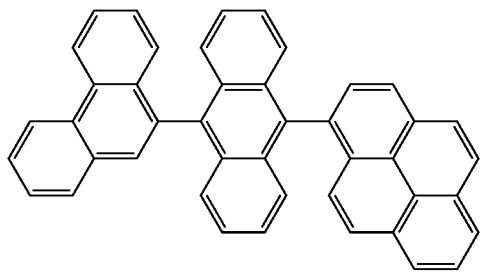
[Cpd. 154]
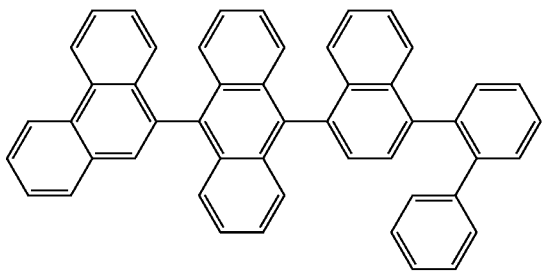
[Cpd. 155]
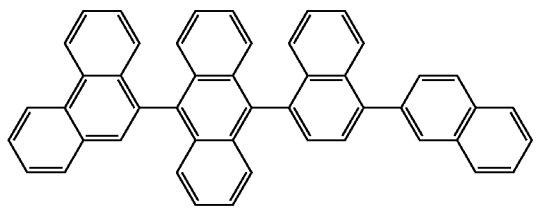
[Cpd. 156]
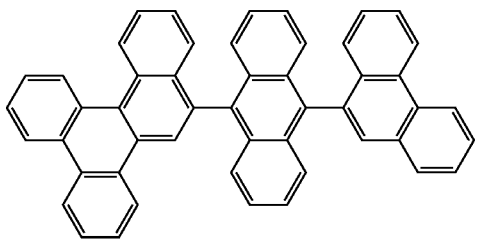
[Cpd. 157]
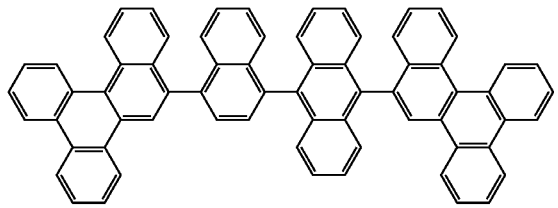
[Cpd. 158]
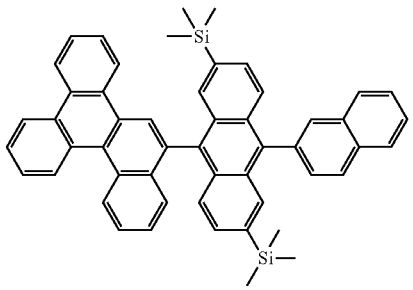
[Cpd. 159]
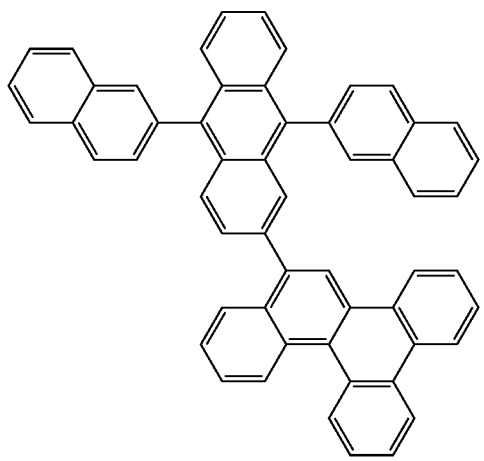
[Cpd. 160]
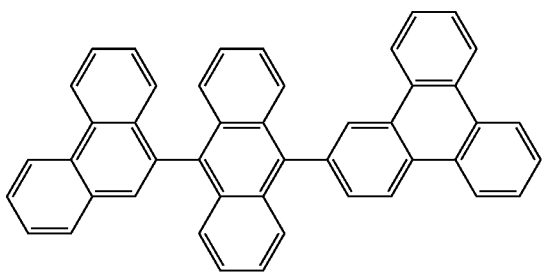

-continued
[Cpd. 161]
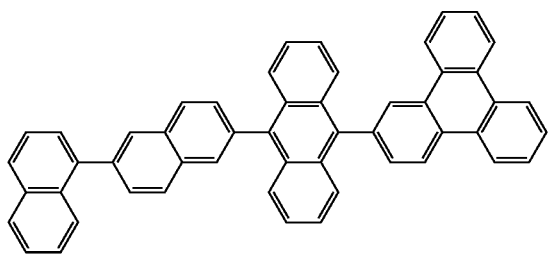
[Cpd. 162]
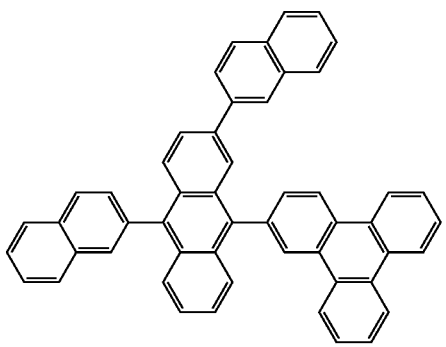
[Cpd. 163]
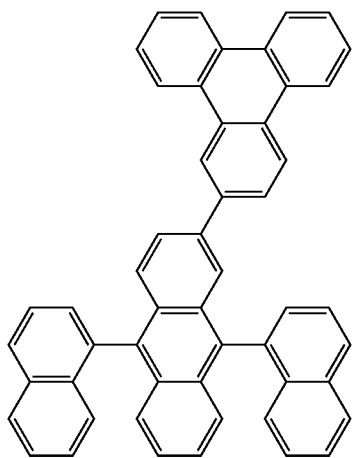
[Cpd. 164]
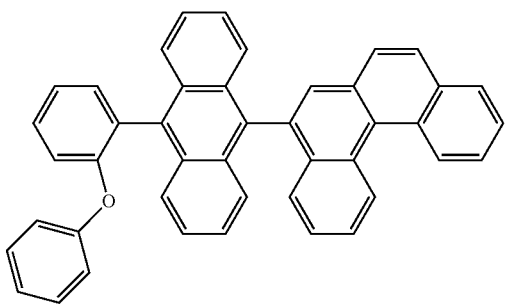
[Cpd. 165]
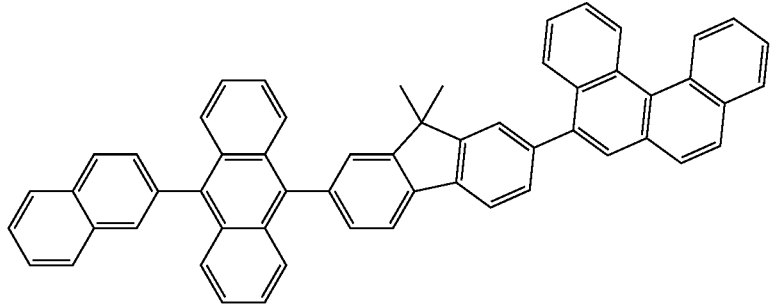
[Cpd. 166]
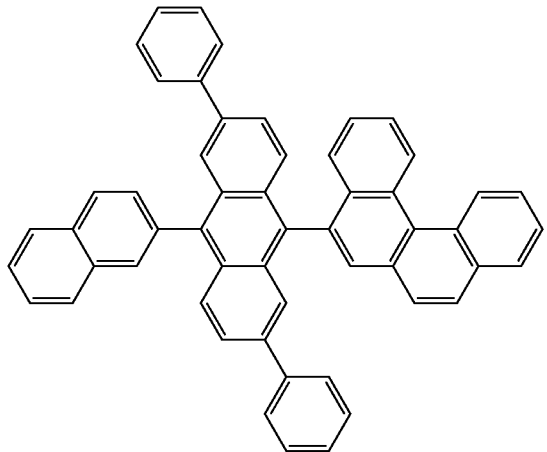

[Cpd. 167]
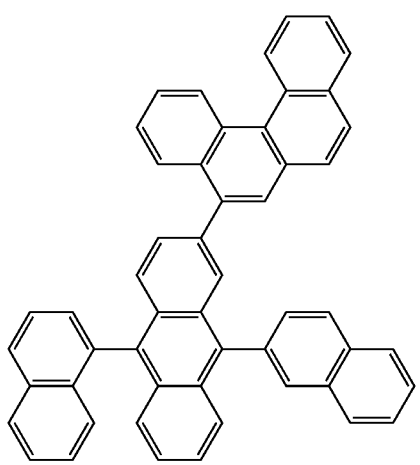
[Cpd. 168]
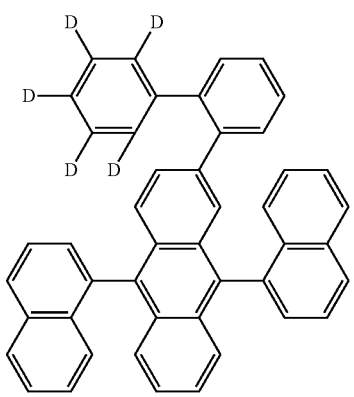
[Cpd. 169]
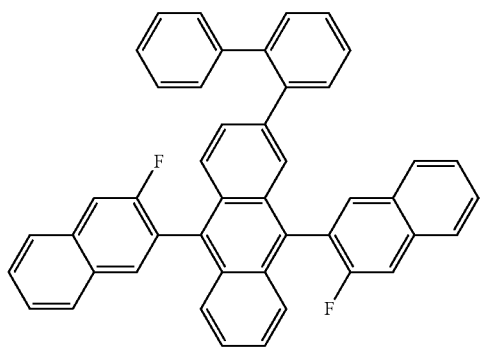
[Cpd. 170]
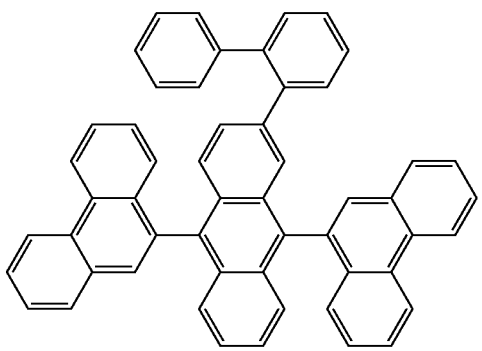
[Cpd. 171]
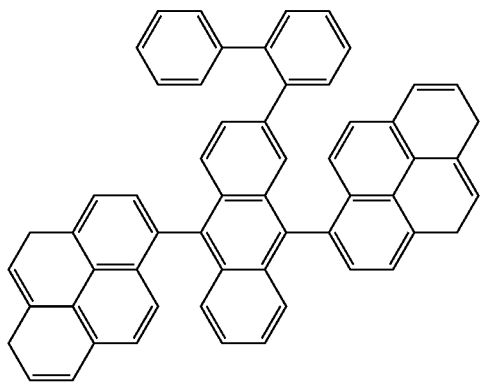
[Cpd. 172]
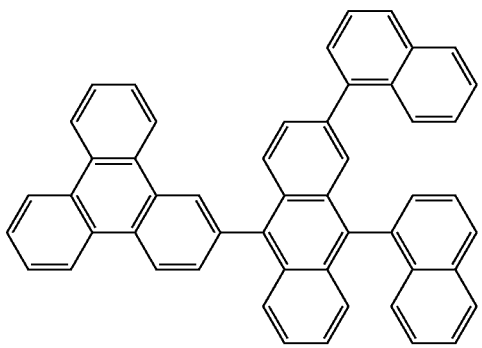
[Cpd. 173]
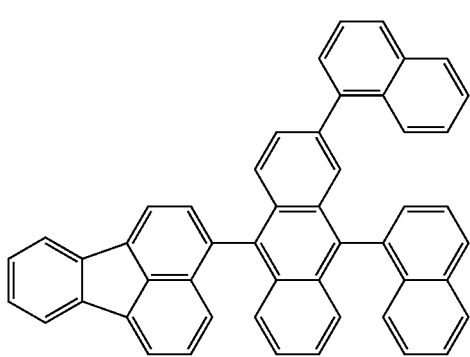
[Cpd. 174]
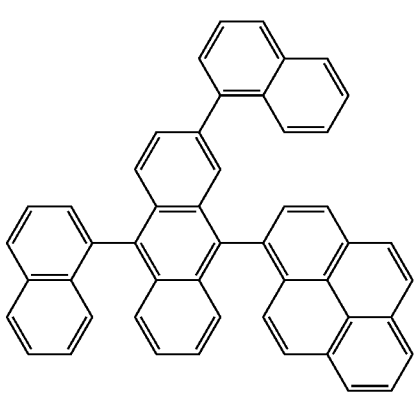

-continued
[Cpd. 175]
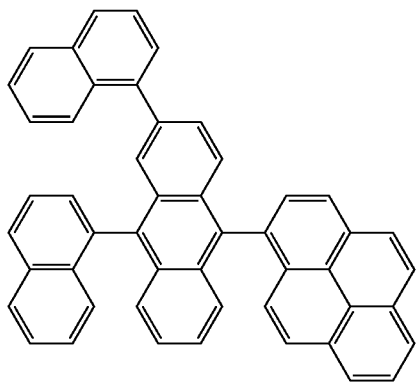
[Cpd. 176]
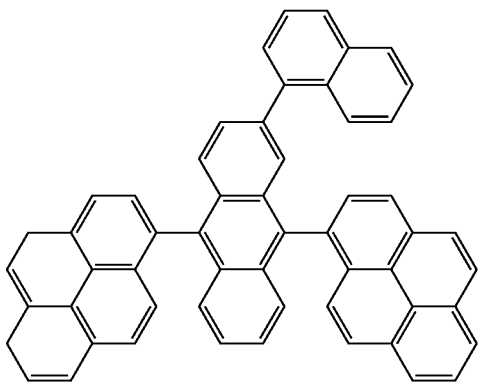
[Cpd. 177]
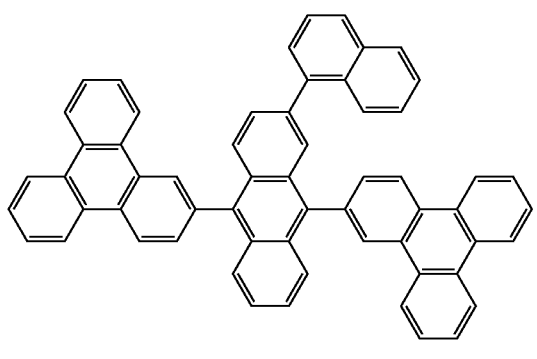
[Cpd. 178]
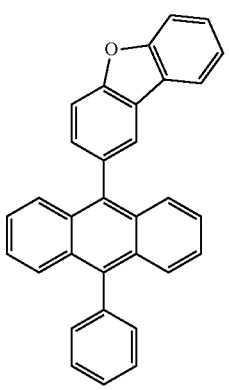
[Cpd. 179]
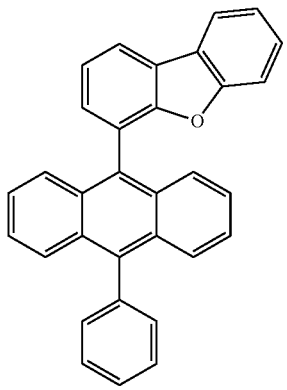
[Cpd. 180]
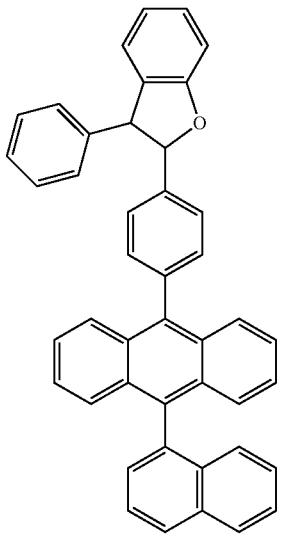

-continued
[Cpd. 181]
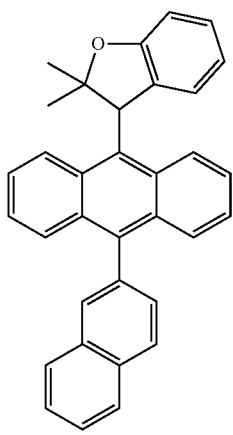
[Cpd. 182]
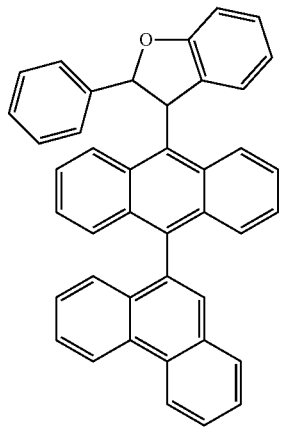
[Cpd. 183]
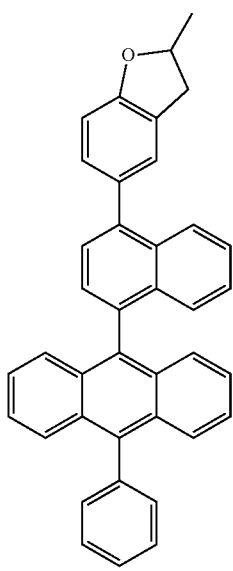
[Cpd. 184]
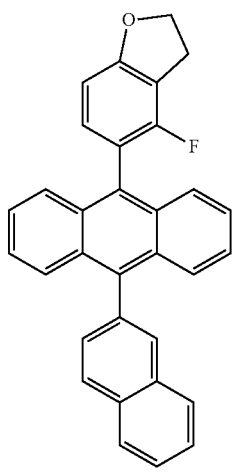
[Cpd. 185]
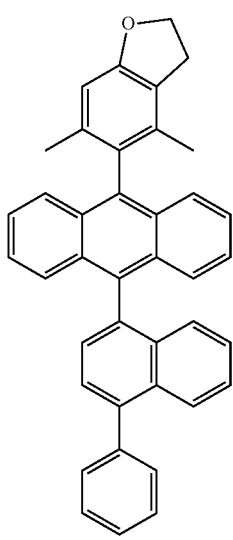
[Cpd. 186]
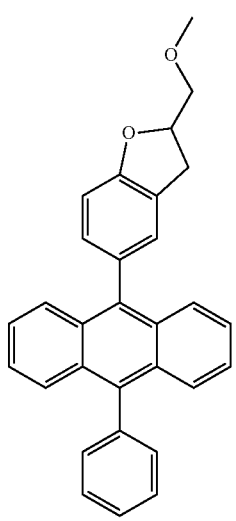

[Cpd. 187]
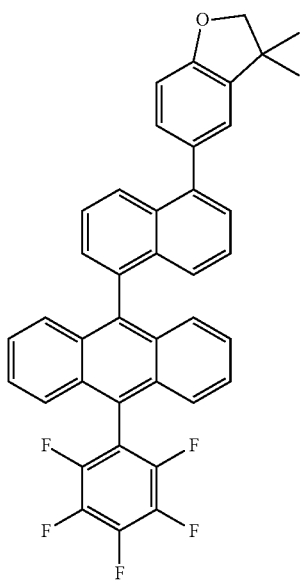
[Cpd. 188]
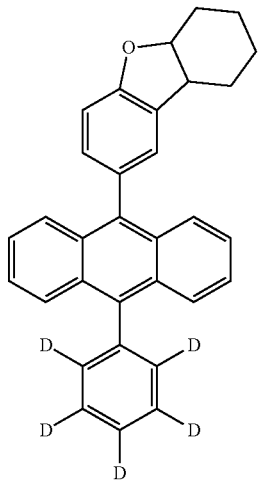
[Cpd. 189]
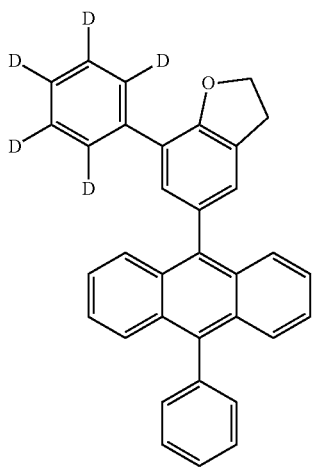
[Cpd. 190]
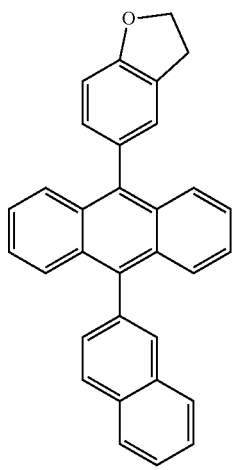
[Cpd. 191]
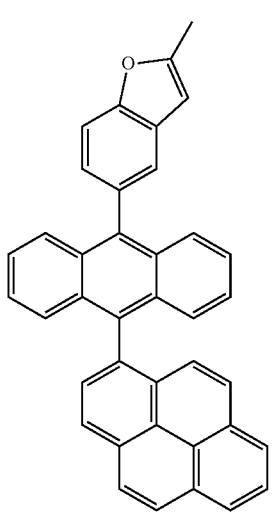
[Cpd. 192]
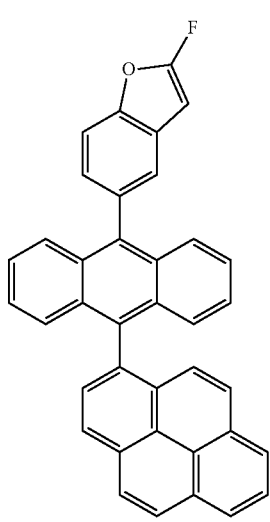

[Cpd. 193]
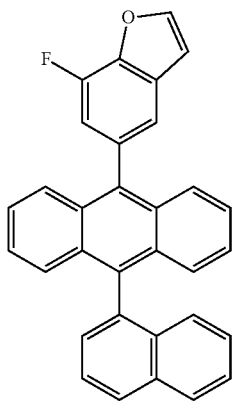
[Cpd. 194]
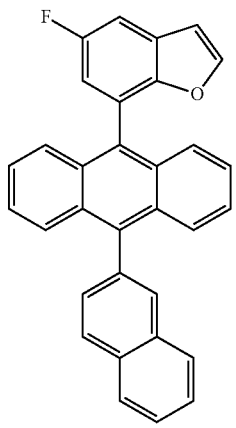
[Cpd. 195]
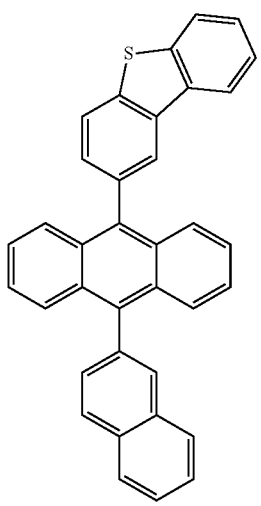
[Cpd. 196]
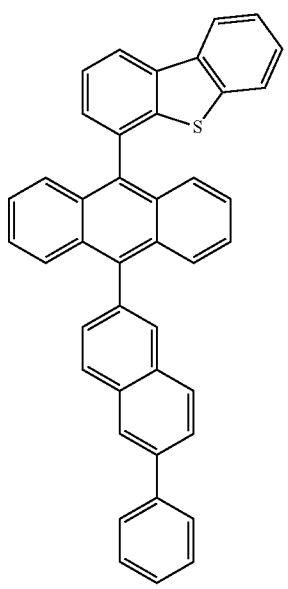
In addition, the dopant useful in the light-emitting layer may include at least one selected from among compounds represented by the following Chemical Formulas 2 to 4:
[Chemical Formula 2]
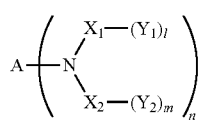
[Chemical Formula 3]
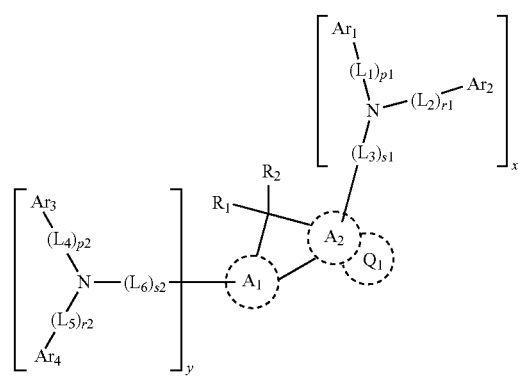

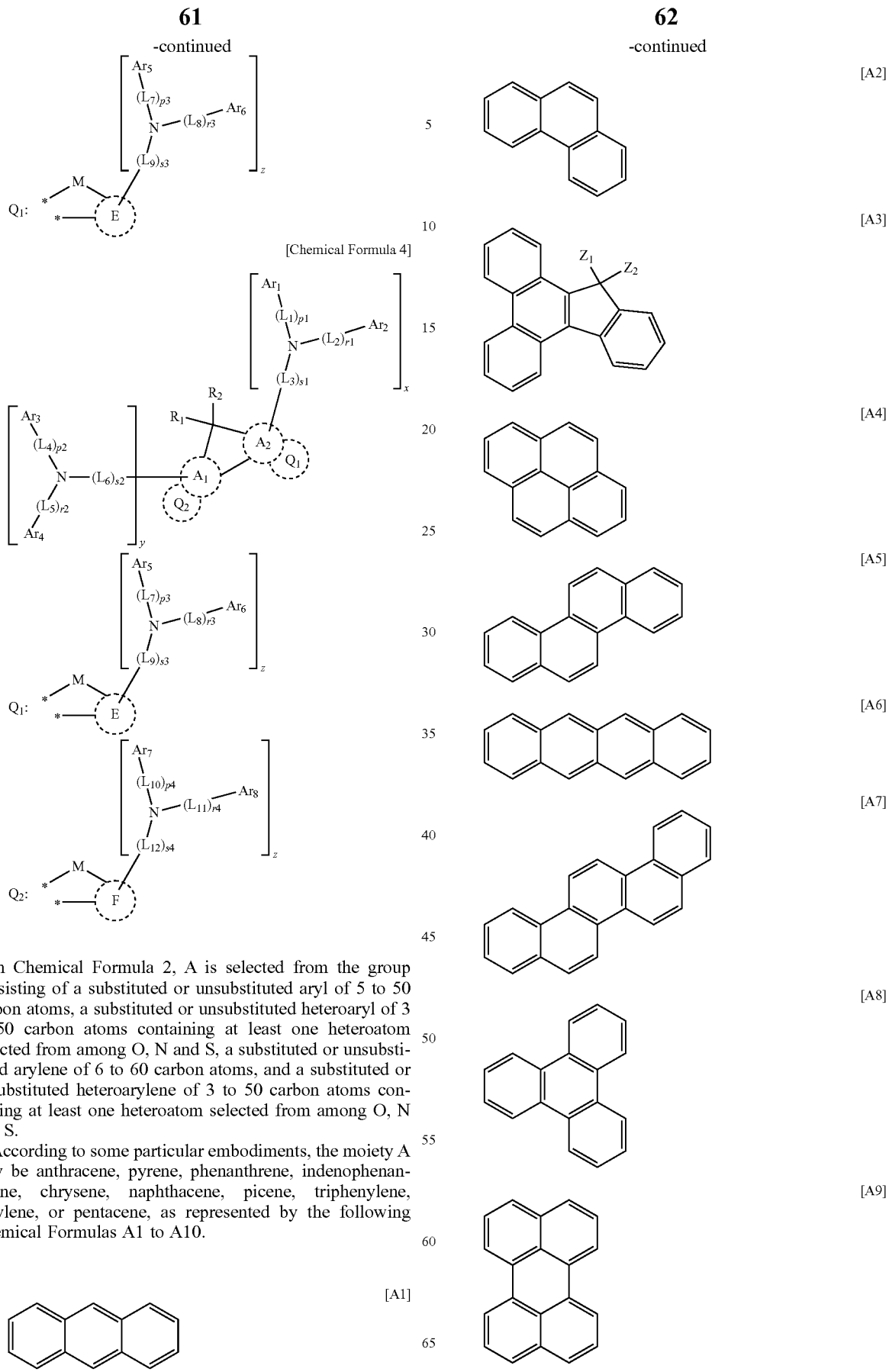

In Chemical Formula 2, A is selected from the group consisting of a substituted or unsubstituted aryl of 5 to 50 carbon atoms, a substituted or unsubstituted heteroaryl of 3 to 50 carbon atoms containing at least one heteroatom selected from among O, N and S, a substituted or unsubstituted arylene of 6 to 60 carbon atoms, and a substituted or unsubstituted heteroarylene of 3 to 50 carbon atoms containing at least one heteroatom selected from among O, N and S.

According to some particular embodiments, the moiety A may be anthracene, pyrene, phenanthrene, indenophenanthrene, chrysene, naphthacene, picene, triphenylene, perylene, or pentacene, as represented by the following Chemical Formulas A1 to A10.

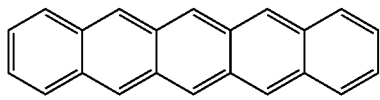

[A10]

In Chemical Formula A3, $Z_1$ and $Z_2$ may be the same or different, and are each independently selected from the group consisting of a hydrogen atom, a deuterium atom, a substituted or unsubstituted alkyl of 1 to 60 carbon atoms, a substituted or unsubstituted alkenyl of 2 to 60 carbon atoms, a substituted or unsubstituted alkynyl of 2 to 60 carbon atoms, a substituted or unsubstituted alkoxy of 1 to 60 carbon atoms, a substituted or unsubstituted alkylthio of 1 to 60 carbon atoms, a substituted or unsubstituted cycloalkyl of 3 to 60 carbon atoms, a substituted or unsubstituted aryl of 6 to 60 carbon atoms, a substituted or unsubstituted aryloxy of 5 to 60 carbon atoms, a substituted or unsubstituted arylthio of 5 to 60 carbon atoms, a substituted or unsubstituted heteroaryl of 2 to 60 carbon atoms, a substituted or unsubstituted (alkyl)amino of 1 to 60 carbon atoms, a di(substituted or unsubstituted alkyl)amino of 1 to 60 carbon atoms, a substituted or unsubstituted arylamino of 6 to 60 carbon atoms, and a di(substituted or unsubstituted aryl) amino of 6 to 60 carbon atoms, wherein adjacent substituents on $Z_1$ and $Z_2$ may form a fused ring.

In Chemical Formula 2, $X_1$ and $X_2$, which may the same or different, are each independently selected from among a substituted or unsubstituted arylene of 6 to 60 carbon atoms and a single bond, and may be bonded to each other;

$Y_1$ and $Y_2$, which may be the same or different, are each independently selected from the group consisting of a substituted or unsubstituted aryl of 6 to 24 carbon atoms, a substituted or unsubstituted heteroaryl of 2 to 24 carbon atoms, a substituted or unsubstituted alkyl of 1 to 24 carbon atoms, a substituted or unsubstituted heteroalkyl of 1 to 24 carbon atoms, a substituted or unsubstituted cycloalkyl of 3 to 24 carbon atoms, a substituted or unsubstituted alkoxy of 1 to 24 carbon atoms, cyano, halogen, a substituted or unsubstituted aryloxy of 6 to 24 carbon atoms, a substituted or unsubstituted alkylsilyl of 1 to 40 carbon atoms, a substituted or unsubstituted arylsilyl of 6 to 60 carbon atoms, germanium, phosphorus, boron, deuterium, and hydrogen, wherein adjacent substituents on $Y_1$ and $Y_2$ may form a fused, aliphatic, aromatic, heteroaliphatic or heteroaromatic ring; and l and m are each an integer of 1 to 20, and n is an integer of 1 to 4.

In Chemical Formulas 3 and 4, $A_1$, $A_2$, E, and F may be the same or different, and are each independently a substituted or unsubstituted aromatic hydrocarbon of to 50 carbon atoms or a substituted or unsubstituted heteroaromatic ring of 2 to 40 carbon atoms, wherein two adjacent carbon atoms of the aromatic ring $A_1$ and two adjacent carbon atoms of the aromatic ring A2 form a 5-membered fused ring together with a carbon atom to which substituents $R_1$ and $R_2$ are bonded;

linkers $L_1$ to $L_{12}$ may be the same or different, and are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_3$, $CR_4R_5$, $SiR_6R_7$, $GeR_8R_9$, O, S, and Se;

$R_1$ to $R_9$, and $Ar_1$ to $Ar_8$ may be the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkenyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkyl germanium of 1 to 30 carbon atoms, a substituted or unsubstituted aryl germanium of 1 to 30 carbon atoms, a cyano, nitro, and a halogen, with the proviso that $R_1$ and $R_2$ together may form a mono- or polycyclic aliphatic or aromatic ring, which may be a heterocyclic ring having a heteroatom selected from among N, O, P, Si, S, Ge, Se, and Te as a ring member;

p1 to p4, r1 to r4, and s1 to s4 are each independently an integer of 1 to 3, with the proviso that when any of them is 2 or greater, the corresponding linkers may be the same or different;

x is an integer of 1 or 2, and y and z may be the same or different and are each independently an integer of 0 to 3; and $Ar_1$ may form a ring with $Ar_e$, $Ar_a$ may form a ring with $Ar_1$, $Ar_5$ may form a ring with $Ar_6$, and $Ar_7$ may form a ring with $Ar_8$.

In Chemical Formula 3, two adjacent carbon atoms of the $A_2$ ring occupy respective positions of Structural Formula $Q_1$ to form a fused ring.

In Chemical Formula 4, two adjacent carbon atoms of the $A_1$ ring occupy respective positions of Structural Formula $Q_2$ to form a fused ring, and two adjacent carbon atoms of the $A_2$ ring occupy respective positions of Structural Formula $Q_1$ to form a fused ring.

The amine moiety of Chemical Formulas 2 to 4 may be selected from the group consisting of compounds represented by the following Substituents 1 to 52, but are not limited thereto.

[Substituent 1]

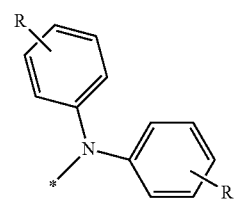

[Substituent 2]
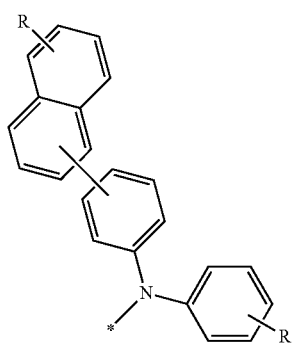
[Substituent 3]
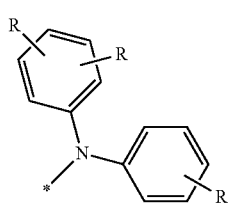
[Substituent 4]
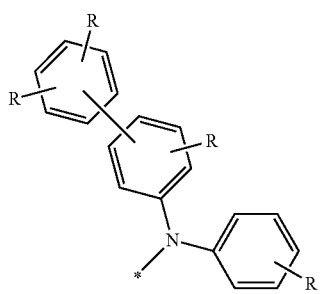
[Substituent 5]
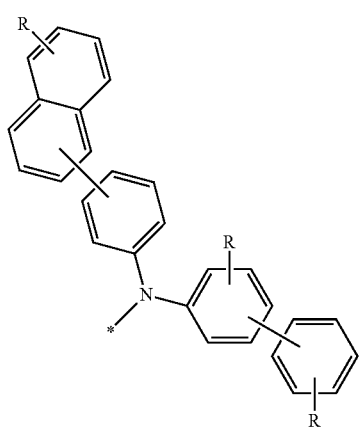
[Substituent 6]
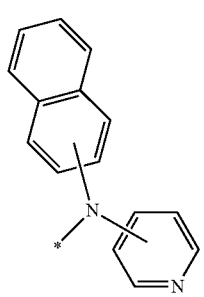
[Substituent 7]
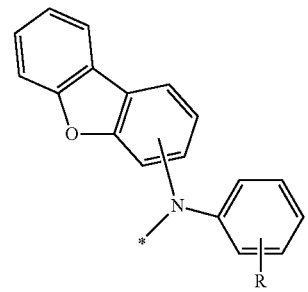
[Substituent 8]
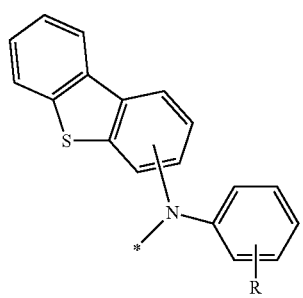
[Substituent 9]
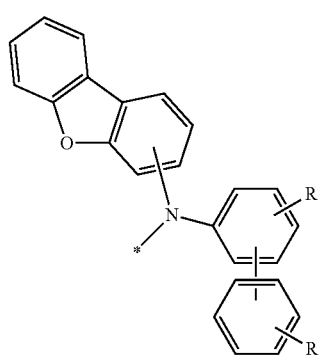
[Substituent 10]
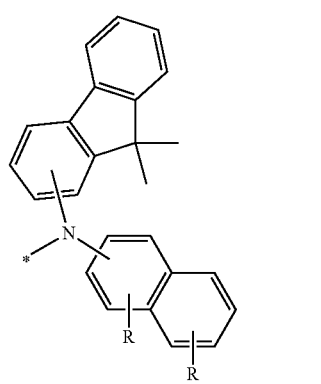
[Substituent 11]
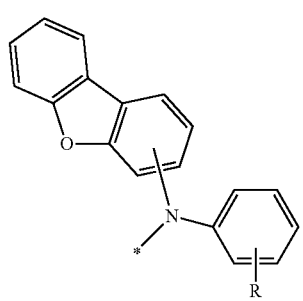

-continued
[Substituent 12]
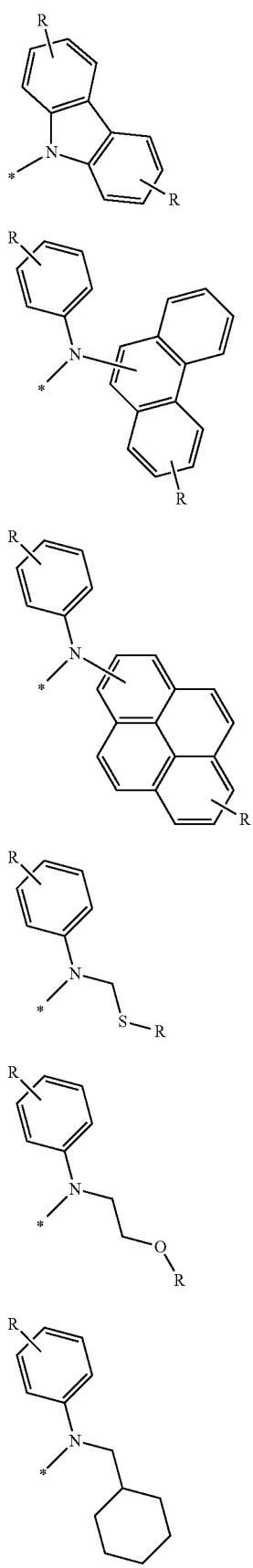
[Substituent 13]
[Substituent 14]
[Substituent 15]
[Substituent 16]
[Substituent 17]
-continued
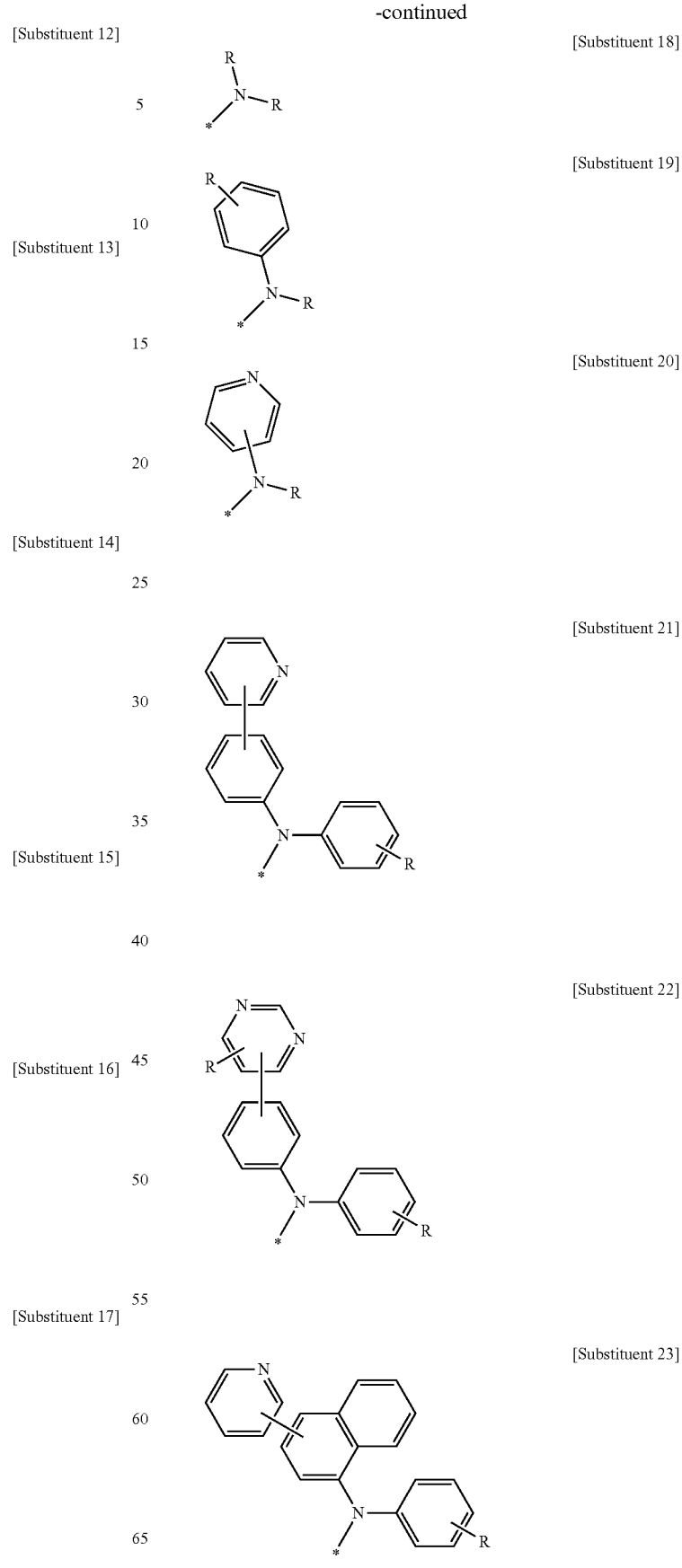
[Substituent 18]
[Substituent 19]
[Substituent 20]
[Substituent 21]
[Substituent 22]
[Substituent 23]

[Substituent 24]
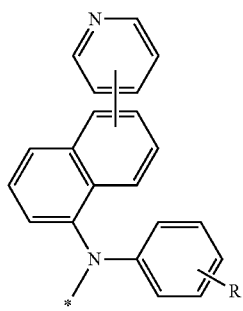
[Substituent 25]
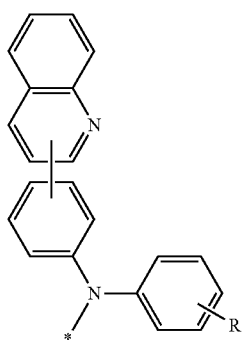
[Substituent 26]
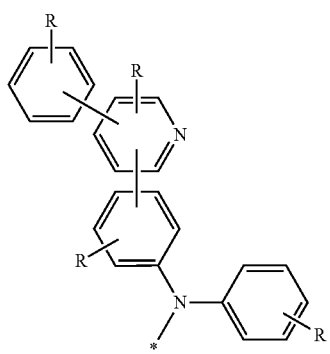
[Substituent 27]
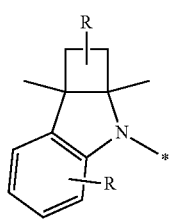
[Substituent 28]
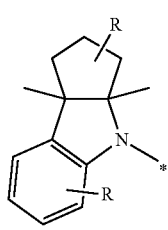
[Substituent 29]
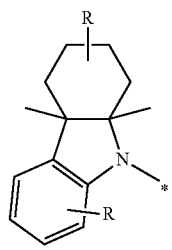
[Substituent 30]
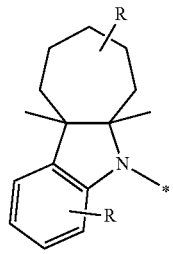
[Substituent 31]
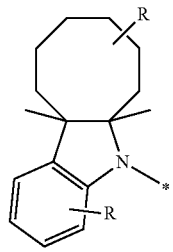
[Substituent 32]
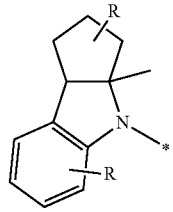
[Substituent 33]
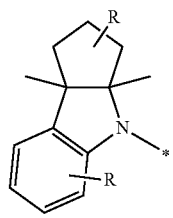
[Substituent 34]
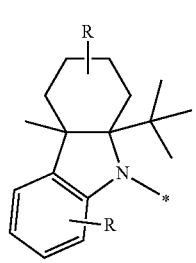

[Substituent 35]
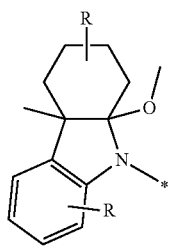
[Substituent 36]
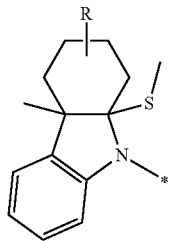
[Substituent 37]
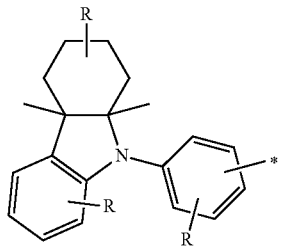
[Substituent 38]
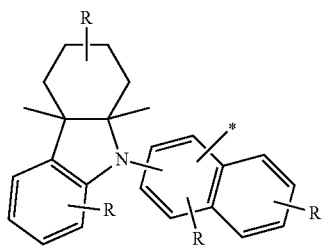
[Substituent 39]
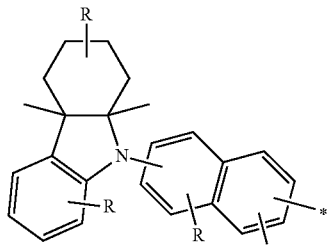
[Substituent 40]
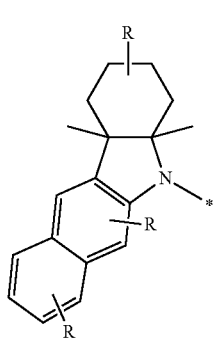
[Substituent 41]
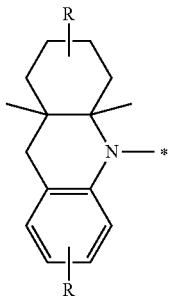
[Substituent 42]
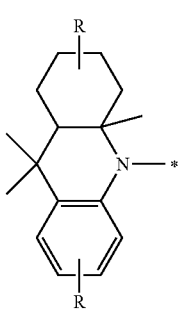
[Substituent 43]
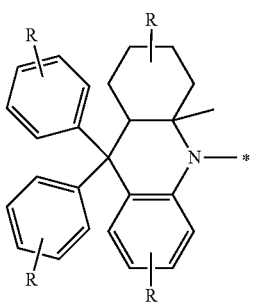
[Substituent 44]
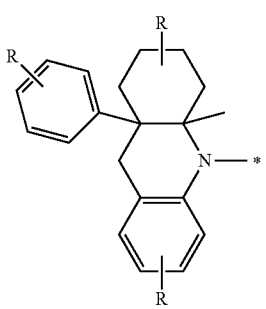
[Substituent 45]
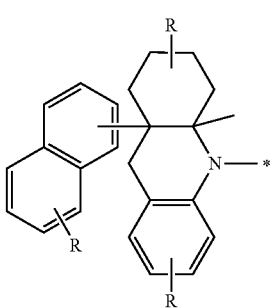

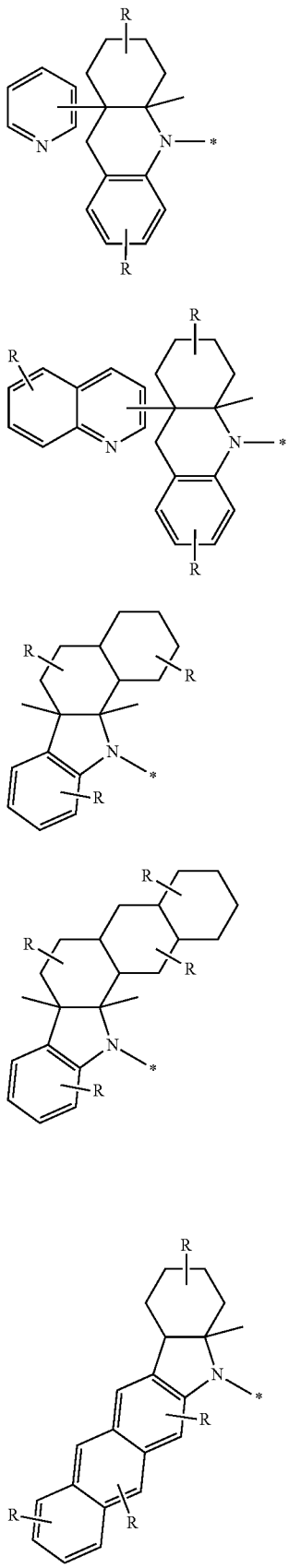

[Substituent 46]

[Substituent 47]

[Substituent 48]

[Substituent 49]

[Substituent 50]

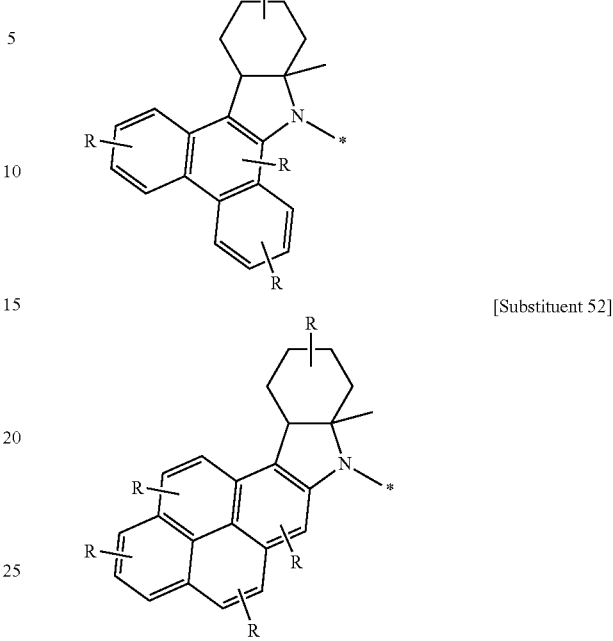

[Substituent 51]

[Substituent 52]

wherein R's, which may be the same or different, are each independently selected from among a hydrogen atom, a deuterium atom, a halogen atom, hydroxy, cyano, nitro, amino, amidino, hydrazine, hydrazone, carboxyl or a salt thereof, sulfonic acid or a salt thereof, phosphoric acid or a salt thereof, a substituted or unsubstituted alkyl of 1 to 60 carbon atoms, a substituted or unsubstituted alkenyl of 2 to 60 carbon atoms, a substituted or unsubstituted alkynyl of 2 to 60 carbon atoms, a substituted or unsubstituted alkoxy of 1 to 60 carbon atoms, a substituted or unsubstituted alkylthio of 1 to 60 carbon atoms, a substituted or unsubstituted cycloalkyl of 3 to 60 carbon atoms, a substituted or unsubstituted aryl of 6 to 60 carbon atoms, a substituted or unsubstituted aryloxy of 6 to 60 carbon atoms, a substituted or unsubstituted arylthio of 6 to 60 carbon atoms, a substituted or unsubstituted heteroaryl of 2 to 60 carbon atoms, a substituted or unsubstituted (alkyl)amino of 1 to 60 carbon atoms, a substituted or unsubstituted di(alkyl)amino of 1 to 60 carbon atoms or a substituted or unsubstituted di(aryl) amino of 6 to 60 carbon atoms, a substituted or unsubstituted di(aryl)amino of 6 to 60 carbon atoms, a substituted or unsubstituted alkylsilyl of 1 to 40 carbon atoms, a substituted or unsubstituted arylsilyl of 6 to 60 carbon atoms, germanium, phosphorus, and boron, and may range in number from 1 to 12, and may form a fused ring with an adjacent substituent.

Meanwhile, after being formed on the light-emitting layer, an electron-density-controlling layer 55 is covered with an electron transport layer 60 by vacuum deposition or spin coating and then with an electron injection layer 70. A cathode metal is deposited on the electron injection layer 70 by thermal vacuum deposition to form a cathode 80, thus obtaining an organic EL diode.

In accordance with some embodiments of the present disclosure, the affinity $A_h$ (eV) of the host of the light-emitting layer, the affinity $A_{ed}$ (eV) of the electron-density-controlling layer, and the affinity $A_e$ (eV) of the electron transport layer satisfy the relationship $A_h \geq A_{ed} \geq A_e$.

Figure 3:
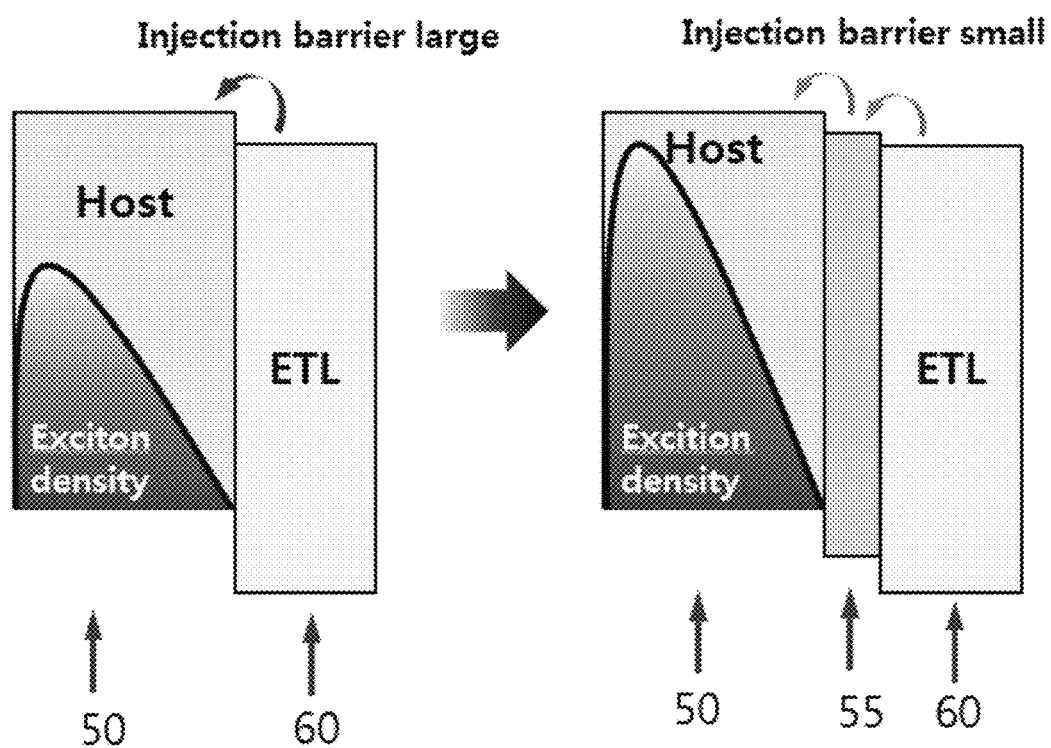
FIG. 3 shows the structures of light-emitting diodes in which an electron-density-controlling layer is absent or present in accordance with some embodiments of the present disclosure.

This can be elucidated in greater detail with reference to FIG. 3. FIG. 3 shows the structure of a light-emitting diode in which an electron-density-controlling layer is absent (left panel) or present (right panel).

As shown in the left panel of FIG. 3, when the electron transport layer 60 is in direct contact with the light-emitting layer 50, the electrons injected from the cathode are less prone to move through the electron transport layer 60 to the host 50 because there is a large electron injection barrier between the cathode and the host 50, resulting in low exciton density in the host of the light-emitting layer. In contrast, as in the present disclosure, when an affinity $A_{ed}$ (eV) of the electron-density-controlling layer is set to be between an affinity $A_h$ (eV) of the host in the light-emitting layer and an affinity $A_e$ (eV) of the electron transport layer ($A_h \geq A_{ed} \geq A_e$), smaller interlayer electron injection barriers exist, resulting in greater exciton density in the host of the light-emitting layer.

Figure 4:
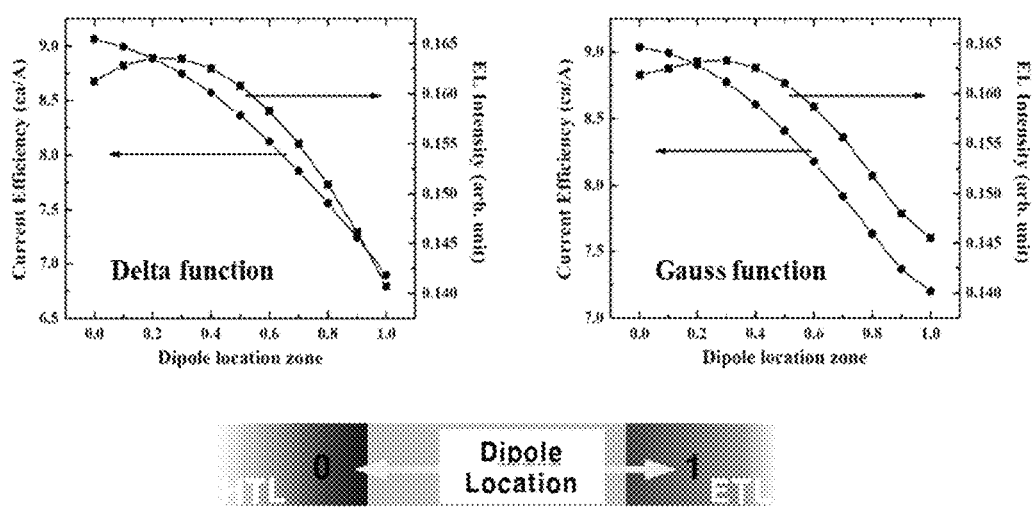
FIG. 4 shows the results of simulation of changes in current efficiency (left) and EL intensity (right) against dipole location zones of excitons in the light-emitting layer of the organic light-emitting diode according to the present disclosure.

A further explanation may be made in FIG. 4. FIG. 4 shows the simulation results of changes in current efficiency (left) and EL intensity (right) against dipole location zones of excitons in the light-emitting layer of the organic lighting emitting diode according to the present disclosure.

In FIG. 4, the X-axis for the dipole location zone within the light-emitting layer in which excitons recombine is divided from 0 (zero) for the side of the hole transport layer to 1 for the side of the electron transport layer. As can be seen, higher current efficiency and EL intensities are detected at positions of excitons nearer to the hole transport layer.

Similar patterns are drawn whether the current efficiency and the EL intensity follow a delta function or a Gaussian function, as can be seen in FIG. 4.

That is, given the condition that the affinity $A_{ed}$ (eV) of the electron-density-controlling layer is between the affinity $A_h$ (eV) of the host of the light-emitting layer and the affinity $A_e$ (eV) of the electron transport layer ($A_h \geq A_{ed} \geq A_e$), the organic light-emitting diode of the present disclosure can increase the electron density in the light-emitting layer, which shifts the dipole location zone toward the hole transport layer, with the consequent improvement of current efficiency and EL intensity.

Meanwhile, the organic light-emitting diode of the present disclosure is advantageous over that of Korean Patent Unexamined Application Publication No. 10-2012-0092555 in that the electron-density-controlling layer (corresponding to the blocking layer of the conventional art) need not be made of a material that is greater in triplet energy than the host of the light-emitting layer in order to effectively induce the TTF phenomenon.

Figure 5:
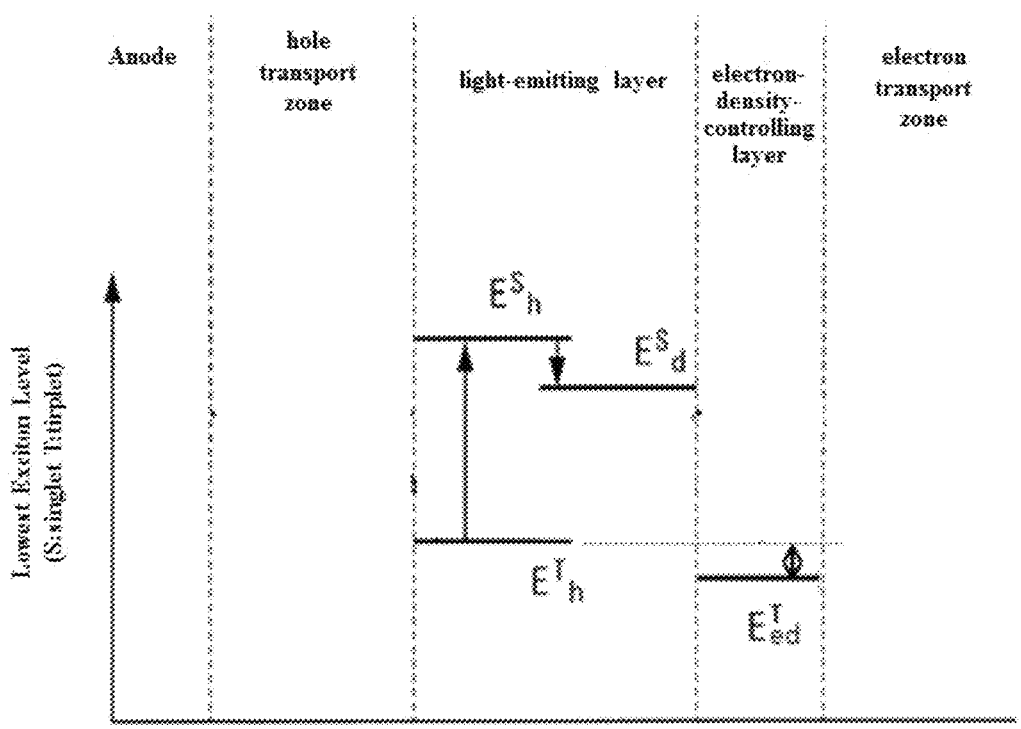
FIG. 5 is a diagram of an energy level structure of a light-emitting diode in which the triplet energy of an electron-density-controlling layer is lower than that of the host of a light-emitting layer in accordance with one embodiment of the present disclosure.

This advantage can be elucidated in detail with reference to FIG. 5. FIG. 5 is a diagram of the energy level structure of a light-emitting diode in which the triplet energy ($E^T_{ed}$) of an electron-density-controlling layer is lower than that ($E^T_h$) of the host of a light-emitting layer in accordance with one embodiment of the present disclosure. As shown in FIG. 5, the material of the electron-density-controlling layer may be lower in triplet energy than that of the host of the light-emitting layer.

In one exemplary embodiment, the difference in triplet energy between the host of the light-emitting layer ($E^T_h$ (eV)) and an anthracene derivative of the electron-density-controlling layer ($E^T_{ed}$ (eV)) may range from 0 to 0.4 (0.4 eV $\geq E^T_h - E^T_{ed} \geq 0$ eV) and more particularly from 0 to 0.3 ((0.3 eV $\geq E^T_h - E^T_{ed} \geq 0$ eV).

According to some embodiments, the anthracene derivative, represented by Chemical Formula A, within the electron-density-controlling layer in the present disclosure may be an anthracene derivative represented by the following Chemical Formula A-1 or A-2.

[Chemical Formula A-1]

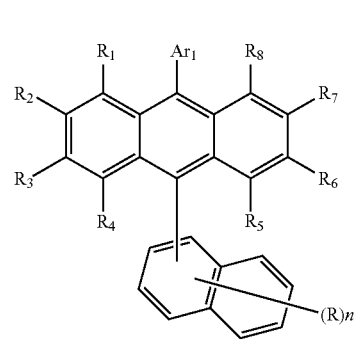

[Chemical Formula A-2]

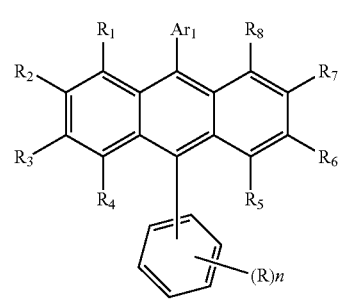

wherein, $Ar_1$ is a substituted or unsubstituted aryl of 6 to 50 carbon atoms, or a substituted or unsubstituted heteroaryl of 2 to 50 carbon atoms, and $R_1$ to $R_8$ may be the same or different, and are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkenyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 6 to 30 carbon atoms, a substituted or unsubstituted alkylsilyl of 1 to 30 carbon atoms, a substituted or unsubstituted arylsilyl of 6 to 30 carbon atoms, a substituted or unsubstituted alkyl germanium of 1 to 30 carbon atoms, a substituted or unsubstituted aryl germanium of 6 to 30 carbon atoms, a cyano, a nitro, and a halogen, and R is the same as defined above for $R_1$ to $R_8$, when there are no R's on the naphthyl ring of Chemical Formula A-1 or the phenyl ring of Chemical Formula A-2, each of the carbon atoms of the aromatic ring moieties has a hydrogen, n is an integer of 0 to 7, and when n is 2 or greater, R's may be the same or different, and at least one of the substituents Ar₁ and R is a heteroaryl of 2 to 20 carbon atoms or an aryl of 6 to 20.
In one embodiment, the anthracene derivative represented by Chemical Formula A may be one selected from among the following Compounds 1 to 8:
[Cpd. 1]
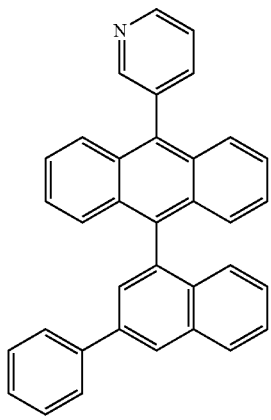
[Cpd. 2]
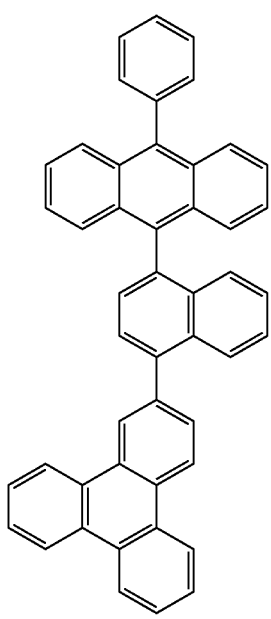
-continued
[Cpd. 3]
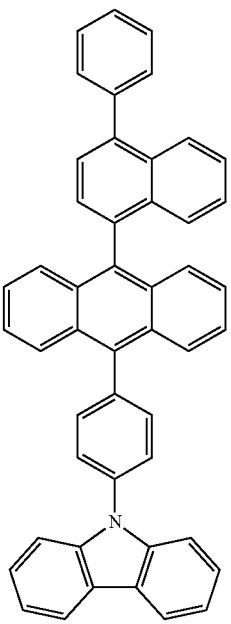
[Cpd. 4]
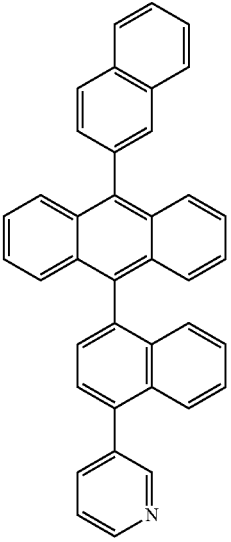

-continued

[Cpd. 5]
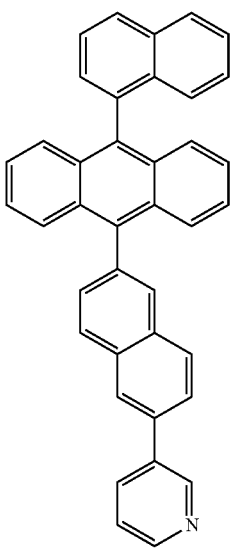

[Cpd. 6]
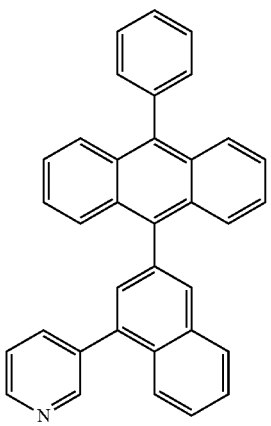

[Cpd. 7]
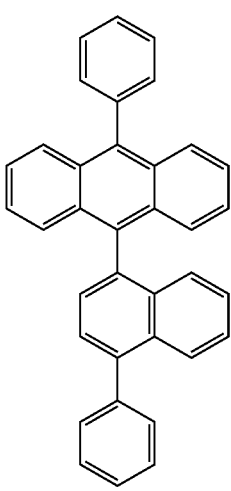

[Cpd. 8]
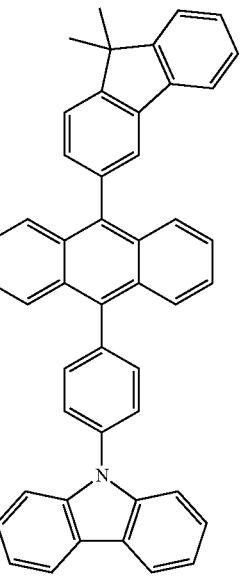

According to one embodiment of the present disclosure, the electron mobility of the anthracene derivative of the electron-density-controlling layer may be the same as or greater than that of the material of the electron transport layer. Since the electron-density-controlling layer is not smaller in electron mobility than the electron transport layer, the electrons supplied from the electron transport layer can move quickly toward the light-emitting layer without delay in the electron-density-controlling layer, thereby facilitating the elevation of exciton density in the light-emitting layer.

Figure 6:
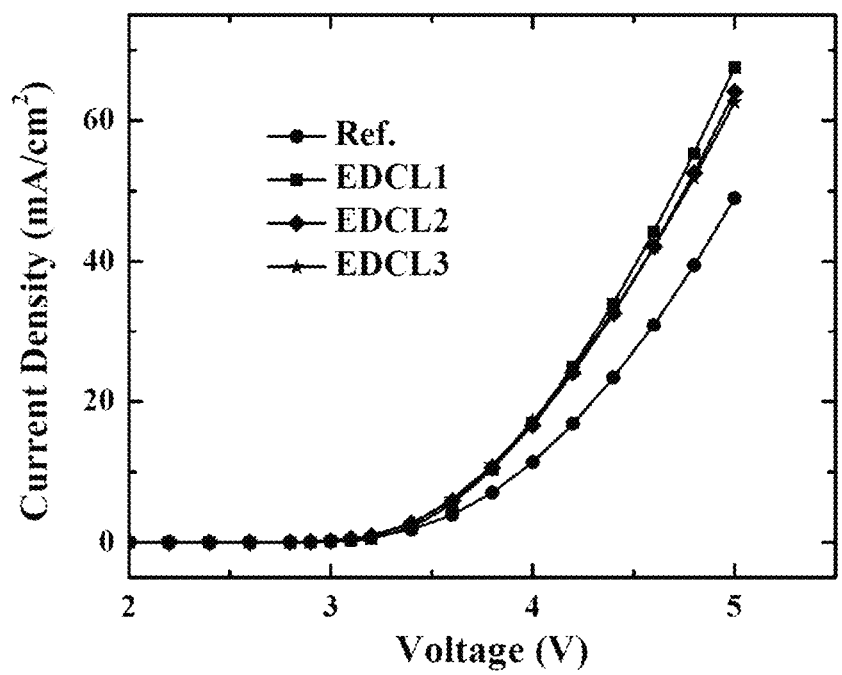
FIG. 6 shows changes in current efficiency with voltage in organic light-emitting diodes according to Examples and Comparative Example.
Figure 6:
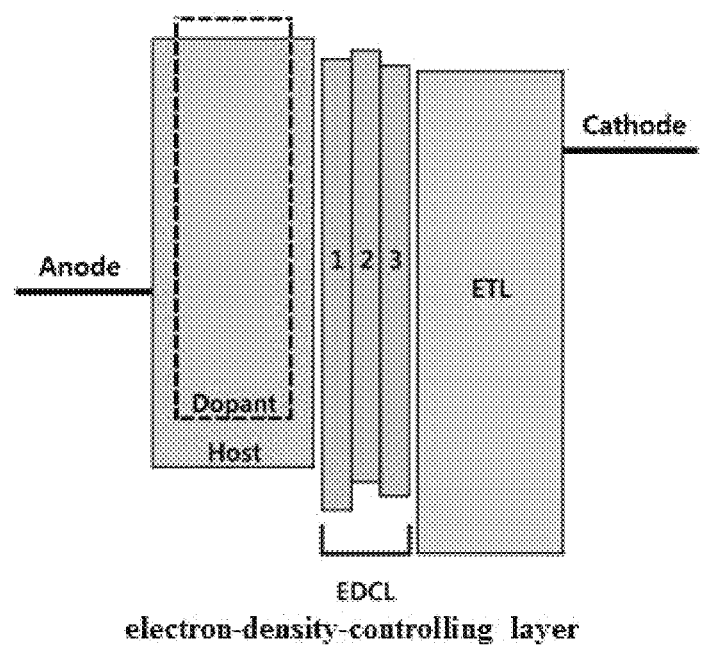

With regard to details of current density, reference may made to FIG. 6.

FIG. 6 shows changes in current efficiency with voltage in the presence or absence of electron-density-controlling layer according to Examples and Comparative Example. In order to obtain the effect of the electron-density-controlling layer on electron mobility, an electron-only device (EOD), fabricated as shown in the lower panel of FIG. 6, was measured for current density while applying direct voltages thereto.

As can be understood from the upper diagram of FIG. 6, an electron-density-controlling layer helps increase the current density at the same voltage.

Thus, it has been discovered that the introduction of an electron-density-controlling layer enhances the electron injection properties of the device.

For more accurate arithmetic comparison, the electron mobility ($\mu$) in each device may be measured. In this regard, whether or not an electron-density-controlling layer is introduced thereinto, all the devices to be tested were fabricated to have the same overall thickness so as to exclude an error factor in calculating electron mobility.

To calculate the electron mobility from the data measured in EOD devices, the following relationship between mobility and electric conductivity was used (G. Paasch et al. Synthetic Metals Vol. 132, pp. 97-104 (2002)).

First, the device was measured for resistance from the current-voltage data, and for electric conductivity from the overall thickness (d) and pixel area (A) using the following Formula 1. Based on the electric conductivity, electron mobility was obtained according to the following Formula 2. The data thus obtained are summarized in Table 2, below.

Figure 7:
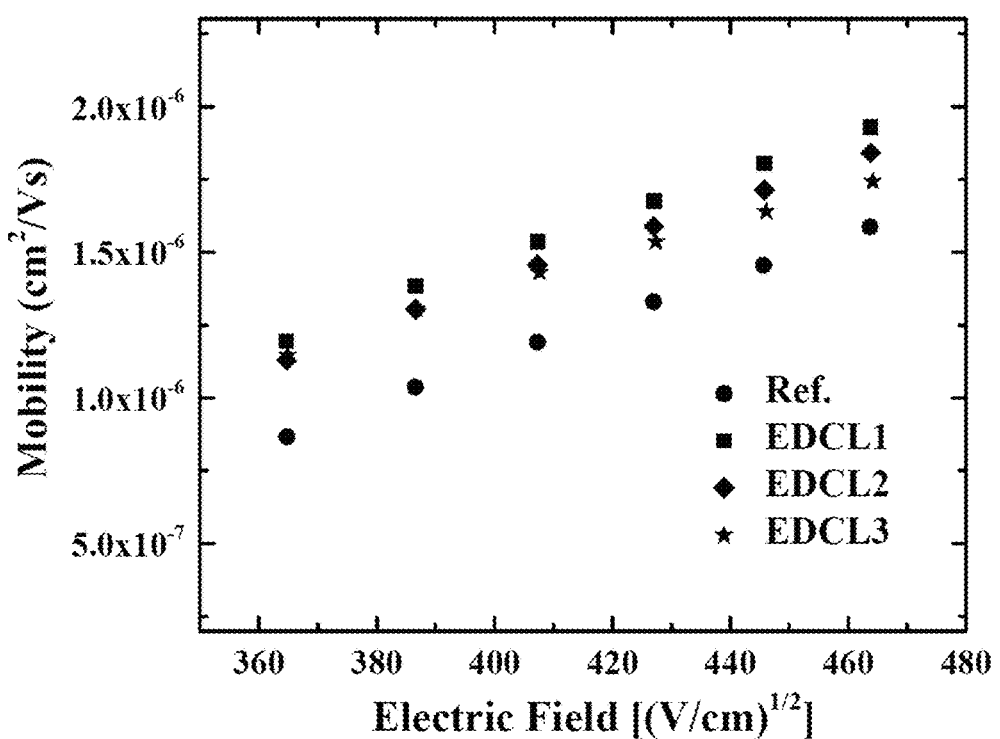
FIG. 7 is a diagram of mobility plotted against electric field for the organic light-emitting diodes of Examples and Comparative Examples.

FIG. 7 is a diagram of mobility plotted against electric field.

$$\sigma = \frac{1}{R} \times \frac{d}{A}, R = \frac{V}{I} \quad (1)$$

$$\mu(cm^2/Vs) = \sigma^{0.76}(S/cm) \quad (2)$$

It is therefore understood that when the electron-density-controlling layer is not lower in electron mobility than the electron transport layer, the electrons supplied from the electron transport layer can move quickly toward the light-emitting layer without a delay in the electron-density-controlling layer, thereby facilitating the increase of exciton density in the light-emitting layer.

According to exemplary embodiments of the present disclosure, the electron-density-controlling layer and the electron transport layer may have electron mobility of at least $10^{-6}$ cm$^2$/Vs at an electronic field strength of 0.04 MV/cm to 0.5 MV/cm.

So long as it functions to stably transport the electrons from the cathode, any known material may be used for the electron transport layer. Examples of the known electron transport material include quinoline derivatives, particularly tris(8-quinolinolate)aluminum (Alq3), Liq, TAZ, Balq, beryllium bis(benzoquinolin-10-oate: Bebq2), ADN, compound 201, compound 202, BCP, and the oxadiazole derivatives PBD, BMD, and BND, but are not limited thereto.

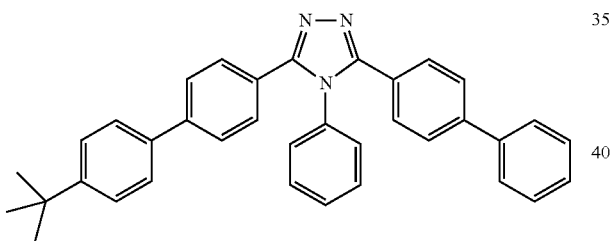

TAZ

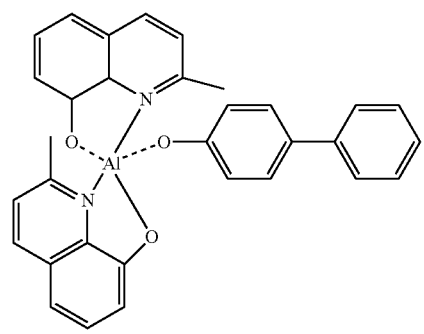

BAlq

<Compound 201>

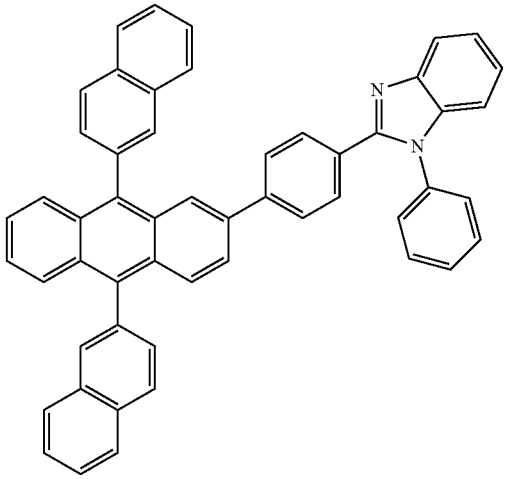

<Compound 202>

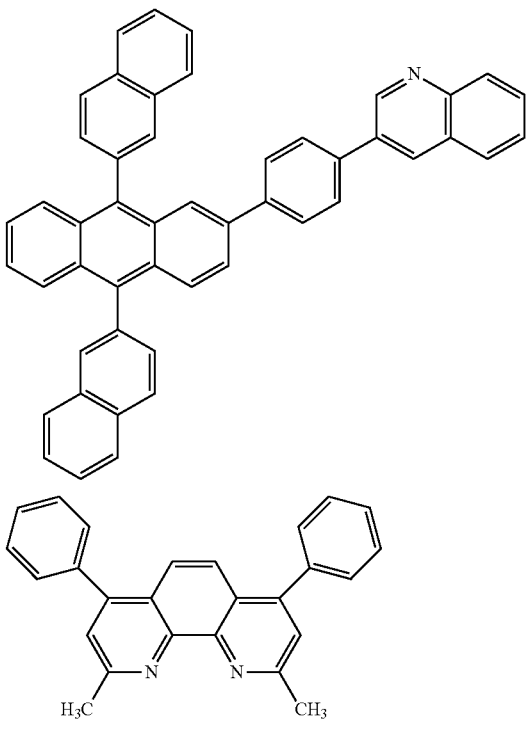

BCP

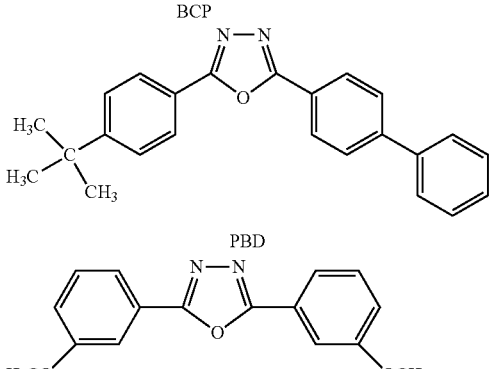

PBD

BMD

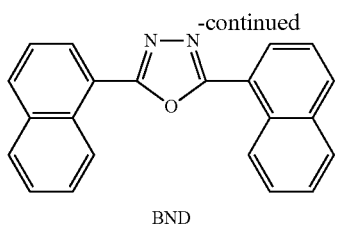

BND

In addition, the electron transport layer may be made of the organic metal compound represented by Chemical Formula F, either alone or in combination with the aforementioned material.

$$Y_m\text{-}M\text{-}(OA)_n \quad \text{[Chemical Formula F]}$$

wherein,

Y is a ligand that contains two moieties respectively responsible for forming a single bond with M through a direct bond M and for forming a coordinate bond with M, each moiety being selected from among C, N, O and S, and which is chelated by the single bond and the coordinate bond;

M is an alkali metal, an alkaline earth metal, aluminum (Al), or a boron (B) atom, with the proviso that:

when M is an alkali metal, m=1, n=0 when M is an alkaline earth metal, m=1, n=1, or m=2, n=0, or when M is aluminum or a boron, m is an integer of 1 to 3 and n is an integer of 0 to 2, satisfying the relationship m+n=3;

OA is a monodentate ligand capable of forming a single bond or a coordinate bond with M, wherein O is oxygen, and A is selected from among a substituted or unsubstituted alkyl of 1 to 30 carbon atoms, a substituted or unsubstituted aryl of 5 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, and a substituted or unsubstituted heteroaryl of 2 to 50 carbon atoms containing as a heteroatom at least one selected from among O, N, S and Si.

The term 'substituted' in the expression 'substituted or unsubstituted' means having at least one substituent selected from the group consisting of a deuterium atom, a cyano, a halogen, a hydroxy, a nitro, an alkyl, an alkoxy, an alkylamino, an arylamino, a hetero arylamino, an alkylsilyl, an arylsilyl, an aryloxy, an aryl, a heteroaryl, germanium, phosphorus, and boron.

In the present disclosure, the Y's may be the same or different and are each independently selected from among the following Structural Formulas C1 to C39, but are not limited thereto:

[C1]

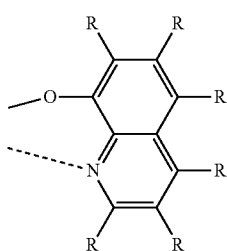

[C2]

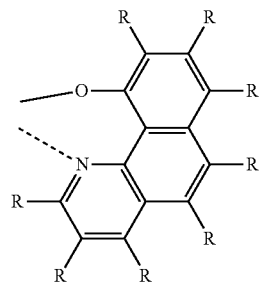

[C3]

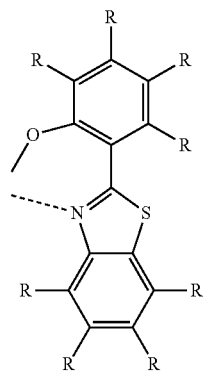

[C4]

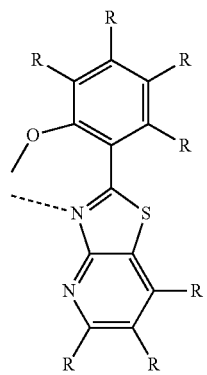

[C5]

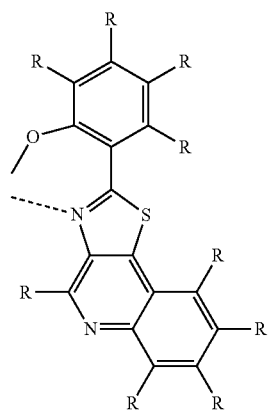

[C6] 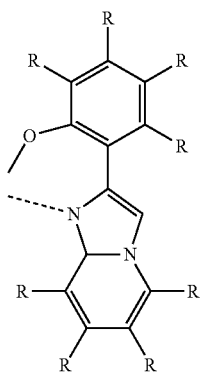
[C7] 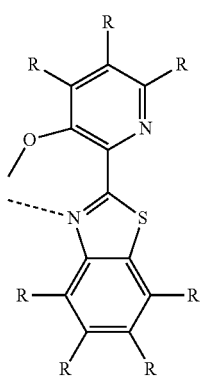
[C8] 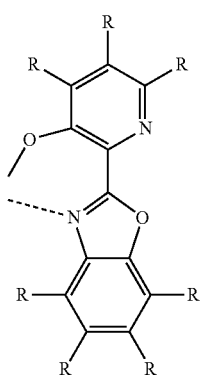
[C9] 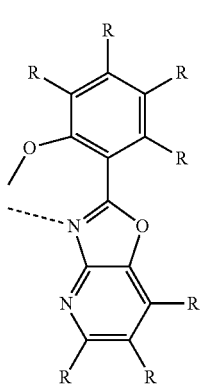
[C10] 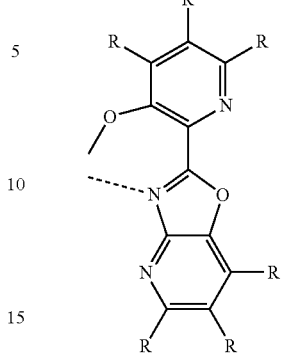
[C11] 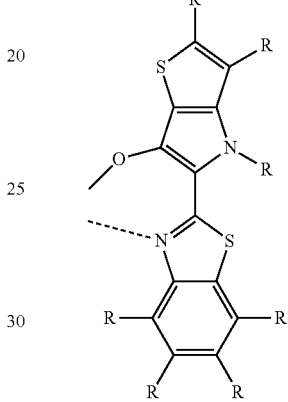
[C12] 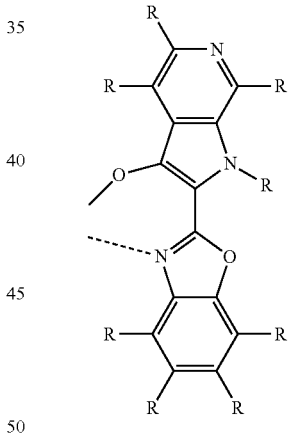
[C13] 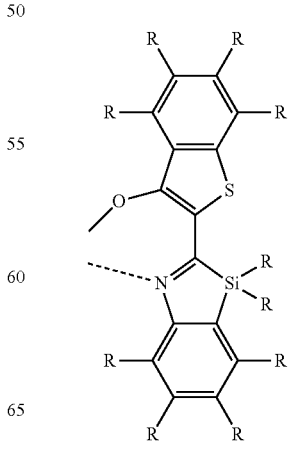

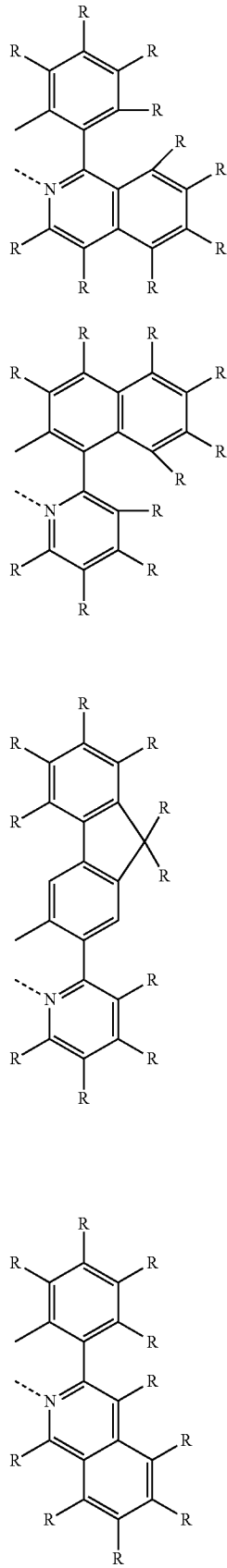
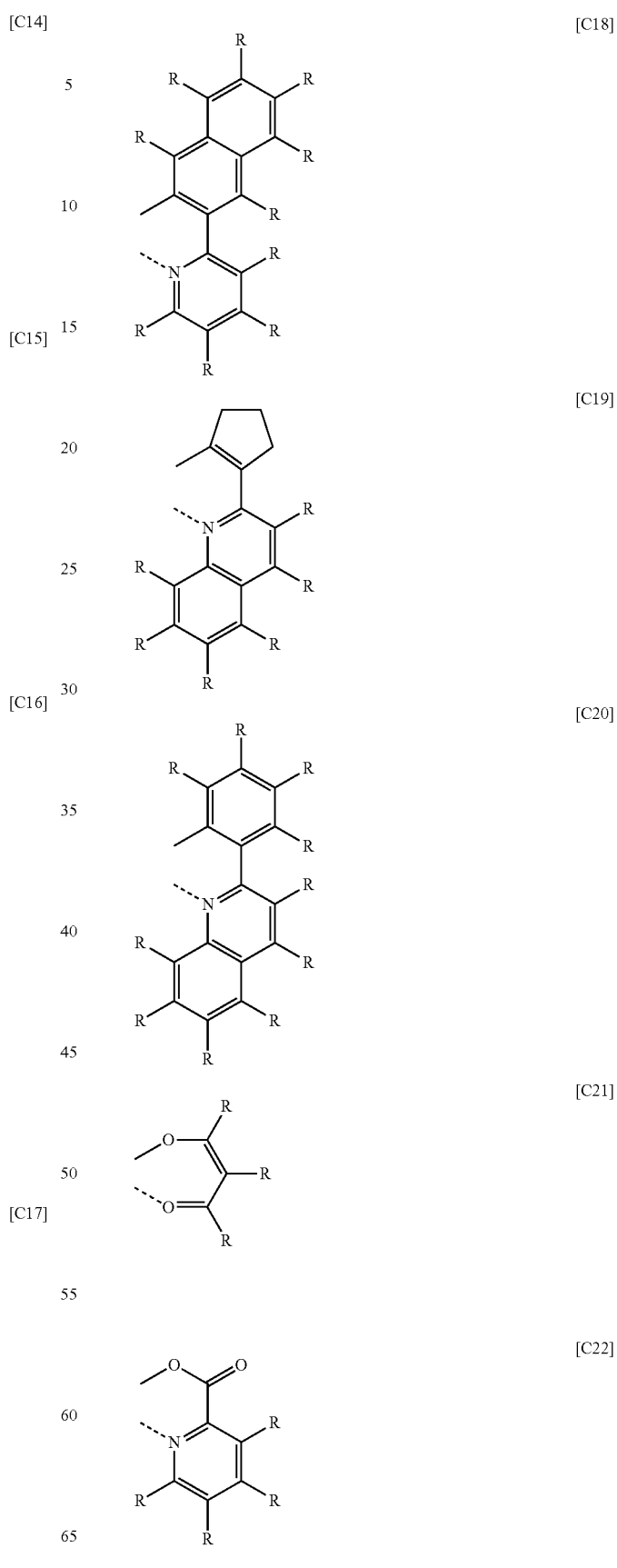

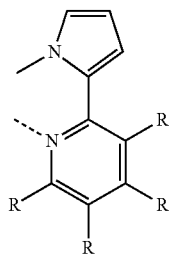
[C23]
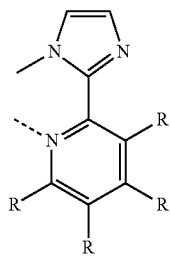
[C24]
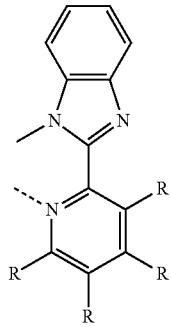
[C25]
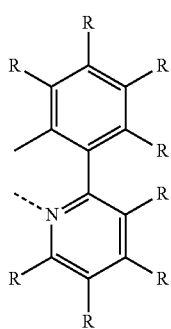
[C26]
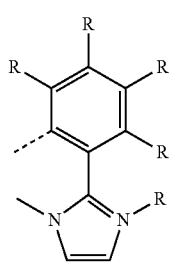
[C27]
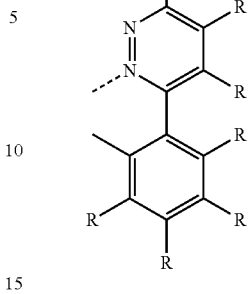
[C28]
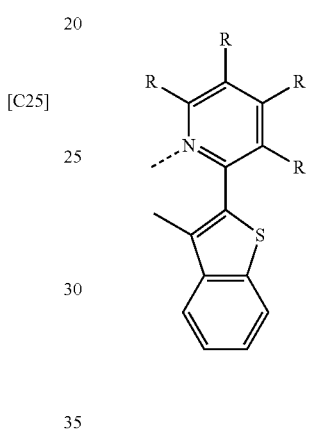
[C29]
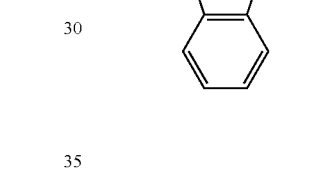
[C30]
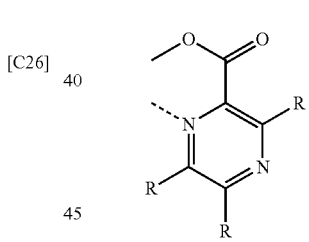
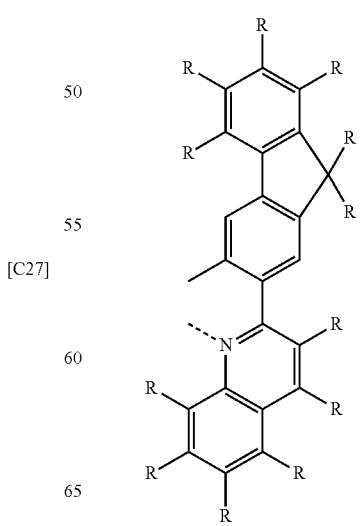
[C31]

[C32] 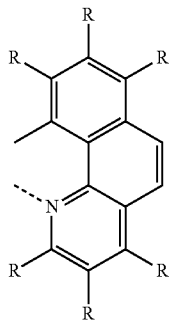

[C33] 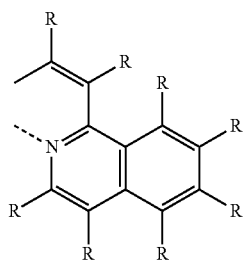

[C34] 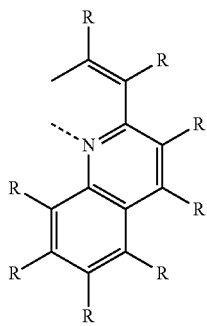

[C35] 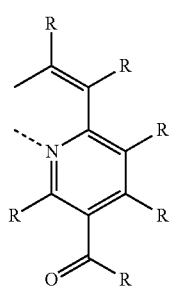

[C36] 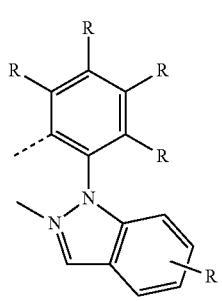

[C37] 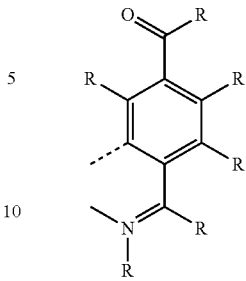

[C38] 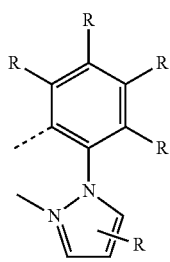

[C39] 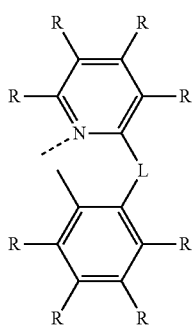

wherein,

R's, which may be the same or different, are each independently selected from among halogen, deuterium, halogen, cyano, a substituted or unsubstituted alkyl of 1 to 30 carbon atoms, a substituted or unsubstituted aryl of 6 to 60 carbon atoms, a substituted or unsubstituted heteroaryl of 3 to 30 carbon atoms, a substituted or unsubstituted alkoxy of 1 to 30 carbon atoms, a substituted or unsubstituted cycloalkyl of 3 to 30 carbon atoms, a substituted or unsubstituted alkenyl of 2 to 30 carbon atoms, a substituted or unsubstituted alkylamino of 1 to 30 carbon atoms, a substituted or unsubstituted alkylsilyl of 1 to 30 carbon atoms, a substituted or unsubstituted arylamino of 6 to 60 carbon atoms, and a substituted or unsubstituted arylsilyl of 6 to 60 carbon atoms, and may form a spiro or fused ring with an adjacent substituent via an alkylene or alkenylene linker.

As described above, an electron injection layer (EIL) is positioned on the electron transport layer in the organic light-emitting diode of the present invention. So long as it functions to facilitate the injection of electrons from the cathode, any known material may be available for forming the electron injection layer, without particular limitation.

By way of example, a material for the electron injection layer may be CsF, NaF, LiF, NaCl, Li$_2$O, or BaO. The condition for depositing the electron injection layer is dependent on the compound that is employed, but may fall within the range of conditions for the formation of the hole injection layer.

The electron injection layer may range in thickness from about 1 Å to about 100 Å, and particularly from about 3 Å to about 90 Å. Given this thickness range, the electron injection layer can exhibit satisfactory electron injection properties without an actual increase in driving voltage.

The cathode may be made of a metal or metal alloy such as lithium (Li), magnesium (Mg), aluminum (Al), aluminum-lithium (Al—Li), calcium (Ca), magnesium-indium (Mg—In), and magnesium-silver (Mg—Ag). Alternatively, ITO or IZO may be employed to form a transparent cathode for a top-emitting organic light-emitting diode.

In another embodiment, the light-emitting diode of the present disclosure may further comprise a light-emitting layer, made of a blue light-emitting material, a green light-emitting material, or a red light-emitting material, which can emit light in a wavelength range of 380 nm to 800 nm. That is, the light-emitting layer in the organic light-emitting diode of the present disclosure may have a multilayer structure in which the additional blue, green, and/or red light-emitting layer may be made of a fluorescent or phosphorescent material.

Further, one or more layers selected from among the hole injection layer, the hole transport layer, the light-emitting layer, the electron-density-controlling layer, the electron transport layer, and the electron injection layer may be deposited using a single molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or white flat illumination devices, and monochrome or white flexible illumination devices.

A better understanding of the light-emitting diode according to the present disclosure may be obtained through the following examples which are set forth to illustrate, but are not to be construed as the limit of the present disclosure.

EXAMPLES

Synthesis Example 1

Synthesis of BD1

Synthesis Example 1

(1): Synthesis of <Intermediate 1-a>

Intermediate 1-a was synthesized as illustrated in the following Reaction Scheme 1.

<Reaction Scheme 1>

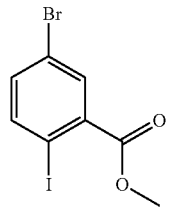 +

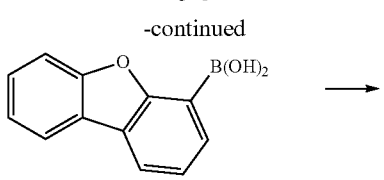

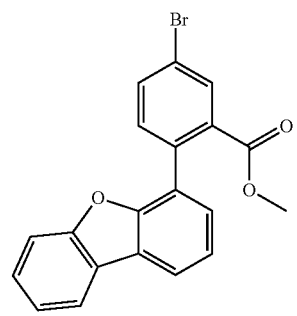

Intermediate 1-a

Into a 500-mL round-bottom flask reactor, methyl 5-bromo-2-iodobenzoate (25.0 g, 73 mmol), 4-dibenzofuran boronic acid (18.7 g, 88 mmol), tetrakis (triphenylphosphine)palladium (1.7 g, 0.15 mmol), and potassium carbonate (20.2 g, 146.7 mmol) was introduced, followed by toluene (125 mL), tetrahydrofuran (125 mL) and water (50 mL). The temperature of the reactor was elevated to 80° C., at which the solution was stirred for 10 hrs. After completion of the reaction, the reaction mixture was cooled to room temperature and extracted with ethyl acetate. The organic layer thus formed was separated and concentrated in a vacuum. Purification of the concentrate by column chromatography afforded <Intermediate 1-a>. (75.0 g, 60.1%)

Synthesis Example 1

(2): Synthesis of [Intermediate 1-b]

Intermediate 1-b was synthesized as illustrated in the following Reaction Scheme 2:

<Reaction Scheme 2>

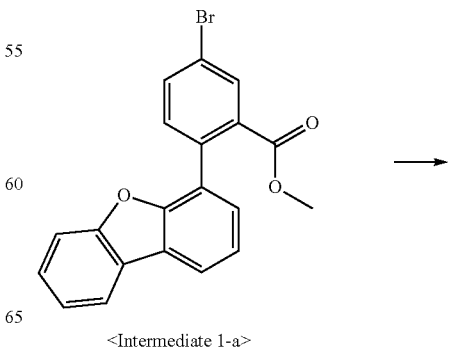

<Intermediate 1-a>

-continued

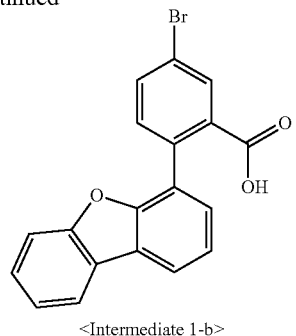

<Intermediate 1-b>

In a 500-mL round-bottom flask reactor, <Intermediate 1-a> (17.0 g, 45 mmol), sodium hydroxide (2.14 g, 54 mmol), and ethanol (170 ml) were stirred for 48 hrs under reflux. After completion of the reaction was confirmed by thin layer chromatography, the reaction mixture was cooled to room temperature. The cooled solution was added with drops of 2-N HCl over 30 min while stirring to form precipitates. Recrystallization in dichloromethane and normal hexane afforded <Intermediate 1-b> as a solid (14.5 g, 88.6%)

Synthesis Example 1

(3): Synthesis of [Intermediate 1-c]

Intermediate 1-c was synthesized as illustrated in the following Reaction Scheme 3:

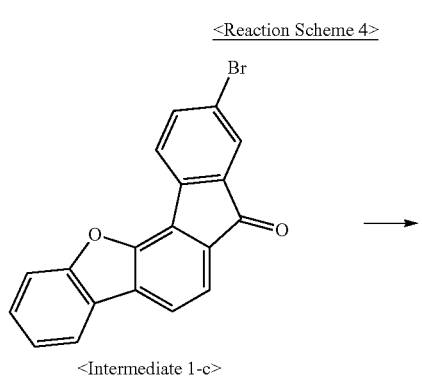

In a 250-mL round-bottom flask reactor, <Intermediate 1-b> (14.5 g, 39 mmol) and methane sulfonic acid (145 ml) were heated to 80° C. and stirred for 3 hrs. After completion of the reaction was confirmed by thin layer chromatography, the reaction mixture was cooled to room temperature. The cooled solution was added dropwise to ice water (150 ml) over 30 min while stirring to form precipitates. Filtration and washing with water and methanol afforded <Intermediate 1-c> as a solid (11.50 g, 83.4%).

Synthesis Example 1

(4): Synthesis of [Intermediate 1-d]

Intermediate 1-d was synthesized as illustrated in the following Reaction Scheme 4:

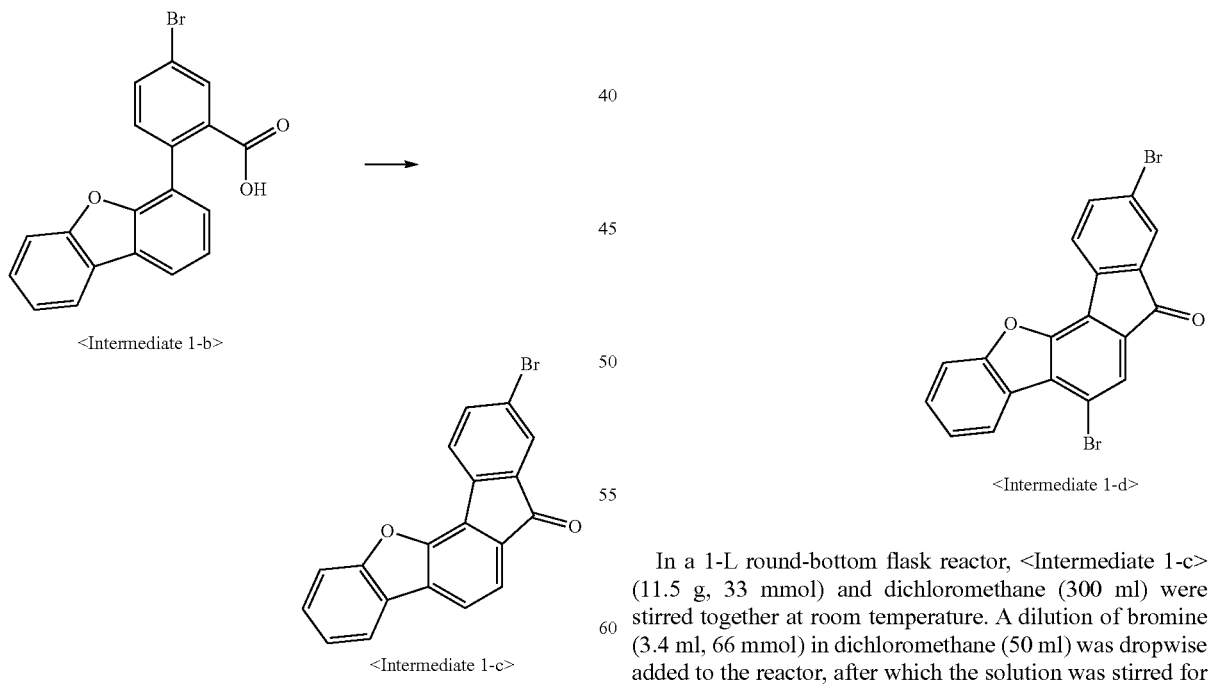

In a 1-L round-bottom flask reactor, <Intermediate 1-c> (11.5 g, 33 mmol) and dichloromethane (300 ml) were stirred together at room temperature. A dilution of bromine (3.4 ml, 66 mmol) in dichloromethane (50 ml) was dropwise added to the reactor, after which the solution was stirred for 8 hrs at room temperature. After completion of the reaction, acetone (100 ml) was added and stirred. The precipitates thus formed were filtered and washed with acetone. Recrystallization in monochlorobenzene afforded <Intermediate 1-d> as a solid (11.0 g, 78%).

Synthesis Example 1

(5): Synthesis of [Intermediate 1-e]

Intermediate 1-e was synthesized as illustrated in the following Reaction Scheme 5:

<Reaction Scheme 5>

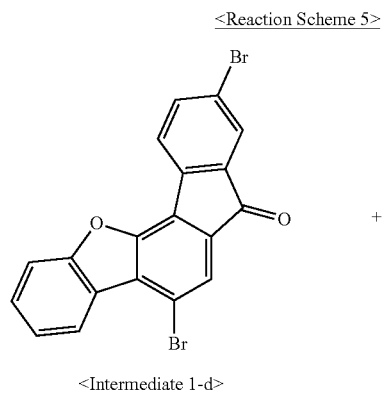

<Intermediate 1-d>

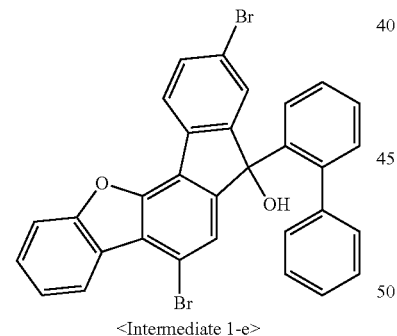

<Intermediate 1-e>

In a 250-ml round-bottom flask reactor, a mixture of 2-bromobiphenyl (8.4 g, 0.036 mol) and tetrahydrofuran (110 ml) was cooled to −78° C. under a nitrogen atmosphere. At the same temperature, n-butyl lithium (19.3 ml, 0.031 mol) was dropwise added to the mixture and stirred for 2 hrs. Then, <Intermediate 1-d> (11.0 g, 0.026 mol) was added little by little at room temperature while stirring. When the reaction mixture started to change color, the reaction was monitored via thin layer chromatography. After the reaction was stopped with $H_2O$ (50 ml), extraction was conducted with ethylacetate and water. The organic layer was separated, concentrated in a vacuum, and recrystallized to afford <Intermediate 1-e> as a solid (12.2 g, 81.5%).

Synthesis Example 1

(6): Synthesis of [Intermediate 1-f]

Intermediate 1-f was synthesized as illustrated in the following Reaction Scheme 6:

<Reaction Scheme 6>

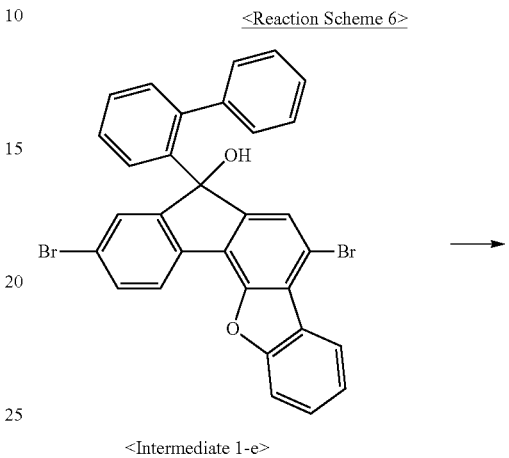

<Intermediate 1-e>

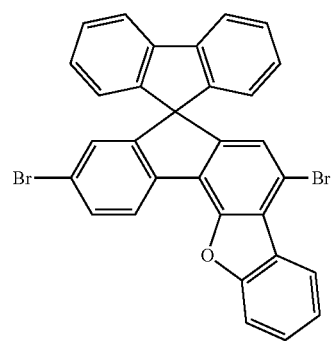

<Intermediate 1-f>

In a 250-ml round-bottom flask reactor, a mixture of <Intermediate 1-e> (12.0 g, 0.021 mol), acetic acid (120 ml), and sulfuric acid (2 ml) was stirred for 5 hrs under reflux. When a precipitate was formed, the completion of the reaction was monitored using thin layer chromatography. The reaction mixture was then cooled to room temperature and filtered. The filtrate was washed with $H_2O$ and methanol and dissolved in monochlorobenzene. Following silica gel chromatography, the fraction was concentrated and cooled to room temperature to give <Intermediate 1-f> (10.7 g, 90%).

Synthesis Example 1

(7): Synthesis of [BD 1]

BD 1 was synthesized as illustrated in the following Reaction Scheme 7:

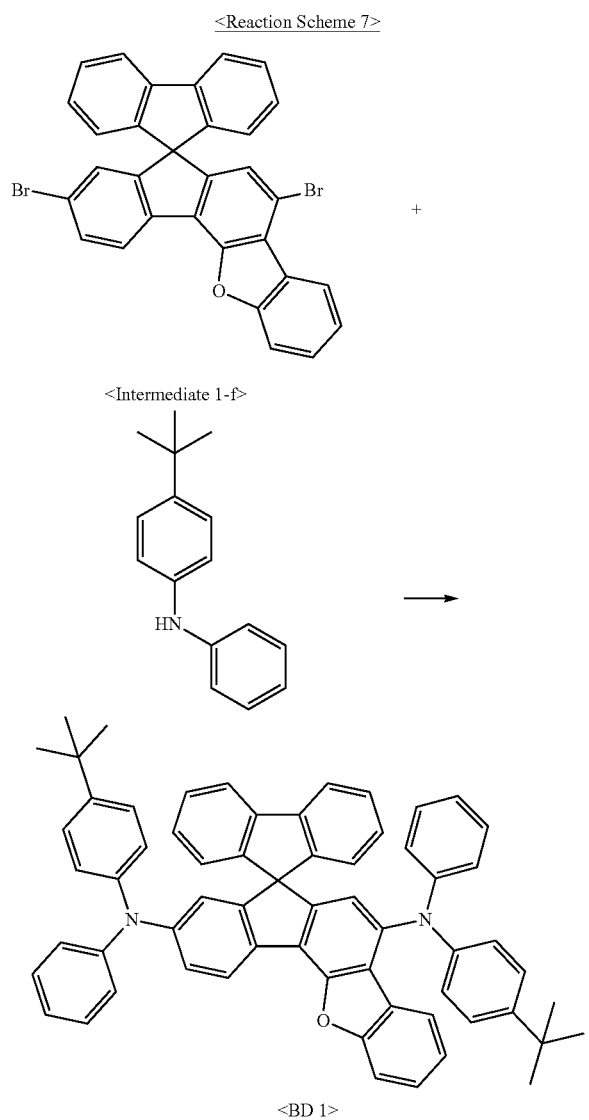

In a 250-ml round-bottom flask reactor, a mixture of <Intermediate 1-f> (5.0 g, 0.009 mol), (4-tert-butylphenyl)-phenylamine (4.7 g, 0.021 mol), palladium (II) acetate (0.08 g, 0.4 mmol), sodium tert-butoxide (3.4 g, 0.035 mol), tri-tert-butyl phosphine (0.07 g, 0.4 mmol), and toluene (60 ml) was stirred for 2 hrs under reflux. After completion of the reaction, the reaction mixture was cooled to room temperature and then extracted with dichloromethane and water. The organic layer thus formed was separated, dried over magnesium sulfate, and concentrated in a vacuum. The concentrate was purified by column chromatography and recrystallized in dichloromethane and acetone to yield <BD 1> as a solid (2.9 g, 38%).

MS (MALDI-TOF): m/z 852.41 [M+]

Example 1-3

Fabrication of Organic Light-Emitting Diode

An ITO glass substrate was patterned to have a luminescent area of 2 mm×2 mm and cleansed. The ITO glass was mounted in a vacuum chamber that was then set to have a base pressure of $1 \times 10^{-7}$ torr. On the ITO glass substrate, films of DNTPD (400 Å) and α-NPD (200 Å) were formed in that order. A light-emitting layer (200 Å) was formed of a mixture of BH and BD 1 (weight ratio 97:3). Then, the compounds shown in Table 1 were deposited to form an electron-density-controlling layer (50 Å thick), on which [Chemical Formula E-2] for an electron transport layer (250 Å), [Chemical Formula E-1] for an electron injection layer (5 Å), and Al (1000 Å) were deposited in the order to fabricate an organic light-emitting diode. The organic light-emitting diode thus obtained was measured at 10 mA/cm² for luminescence properties.

In addition, triplet energy values of each the host materials and the electron-density-controlling layer materials are given, together with electron affinity values of each the host materials, the electron density controlling layer materials and the electron transport layer materials, in Table 2, below. The triplet energy values were obtained using a PL spectrofluorometer (JASCO FP8600) at 77K in a 2-methyl THF solution according to the following Formula:

$$T1(eV) = \frac{hc}{\lambda_{onset}} \cong \frac{1240}{\lambda_{onset}}$$

h: Plank constant c: velocity of light

λ: Wavelength

Affinity values of individual materials were calculated using the formula of LUMO=HOMO-Band gap (UV onset). In this regard, the HOMO level was measured in a single thin layer of each compound on a quartz substrate using PYS-202. For the UV onset, the absorption spectrum was measured in a single thin layer.

The data depicted in FIG. 4 were obtained based on the reflectivity of each layer and the PL spectra of dopant materials of the light-emitting layer in the organic light-emitting diode of the present disclosure, using the Setfos 3.2 (FLUXiM) semiconductor thin film optical simulation program. Organic light-emitting diodes of Examples and Comparative Examples were measure for voltage when an electric field was applied to the diodes to make a current of 10 mA/cm². Further, electroluminescence (EL) spectra were measured using a spectroradiometer (SR3A: TOPCON). From the spectroradio spectra, color coordinates (CIE_x, CIE_y), current efficiency (cd/A), and external quantum efficiency were calculated.

[Cpd. 1]
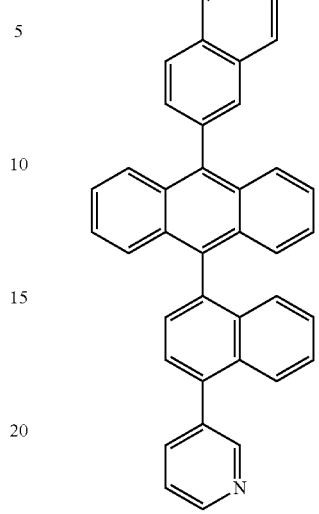
[Cpd. 2]
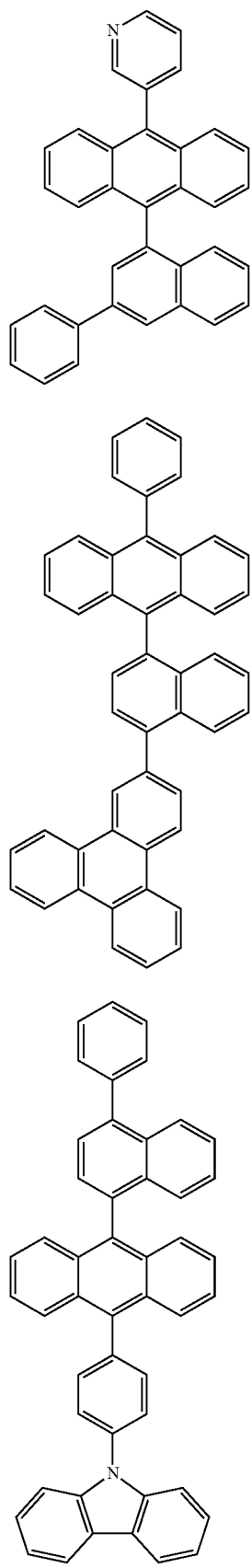
[Cpd. 3]
[Cpd. 4]
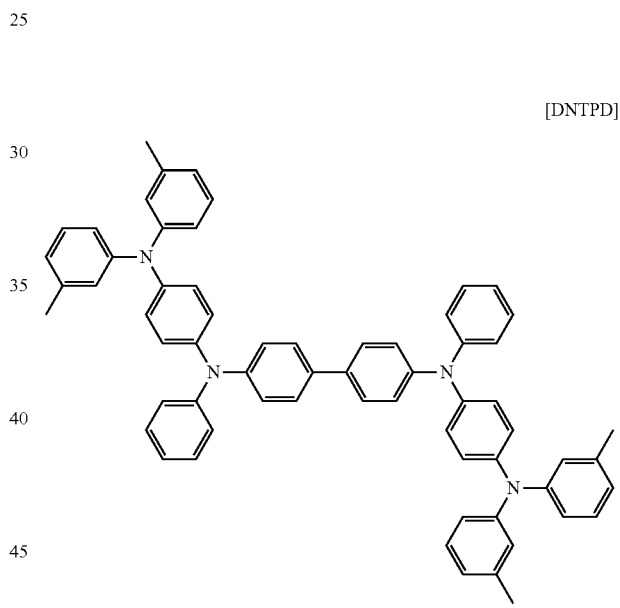
[DNTPD]
[α-NPD]
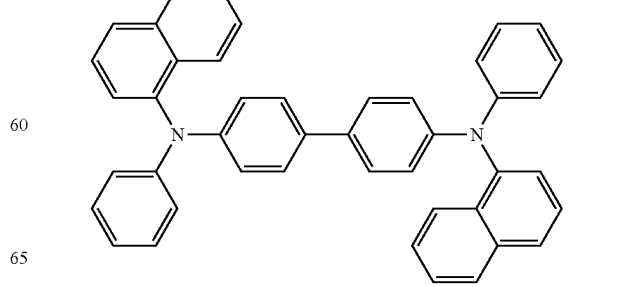

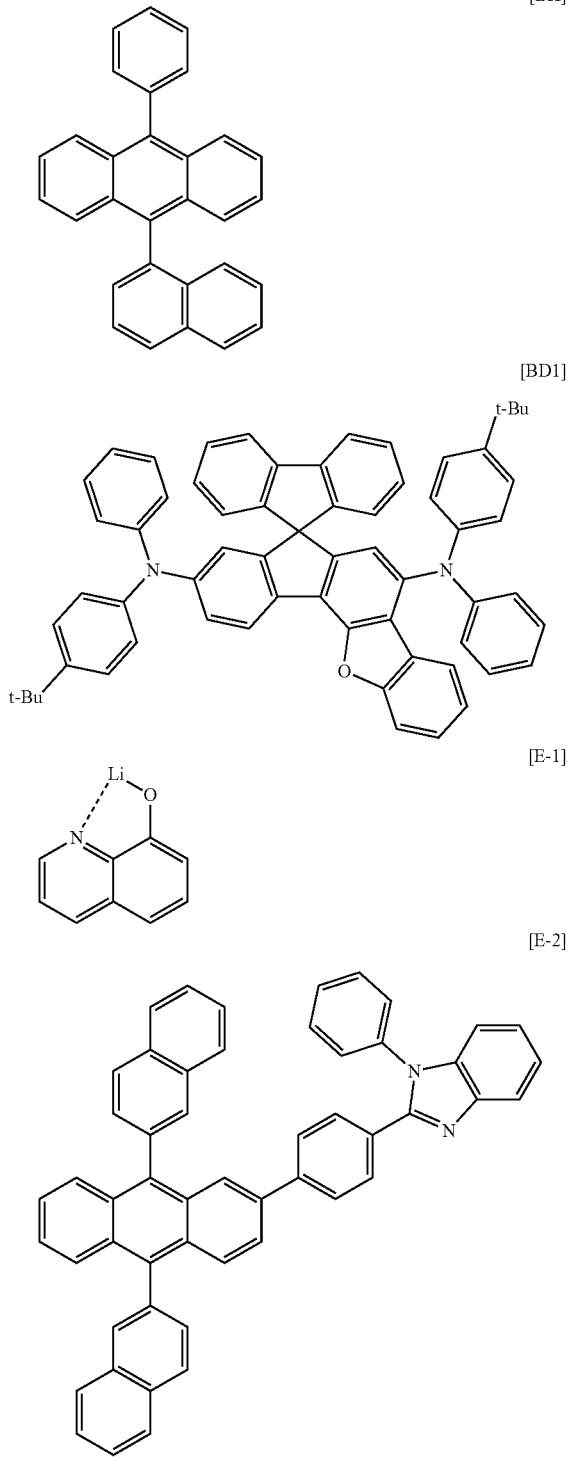

measured at 10 mA/cm² for luminescence properties. The structure of [BD2] is as follows:

Comparative Example 1

An ITO glass substrate was patterned to have a luminescent area of 2 mm×2 mm and cleansed. The ITO glass was mounted in a vacuum chamber that was then set to have a base pressure of 1×10⁻⁷ torr. On the ITO glass substrate, films were formed of DNTPD (400 Å) and α-NPD (200 Å) in the order. A light-emitting layer (200 Å) was formed of a mixture of BH and BD 1 (weight ratio 97:3). Then, [Chemical Formula E-2] for an electron transport layer (300 Å), [Chemical Formula E-1] for an electron injection layer (5 Å), and Al (1000 Å) were deposited in that order to fabricate an organic light-emitting diode. The organic light-emitting diode was measured at 10 mA/cm² for luminescence properties.

Comparative Example 2

An organic light-emitting diode was fabricated in the same manner as in Comparative Example 1, with the exception that [BD2] was used, instead of [BD1]. The organic light-emitting diode was measured at 10 mA/cm² for luminescence properties.

Figure 8:
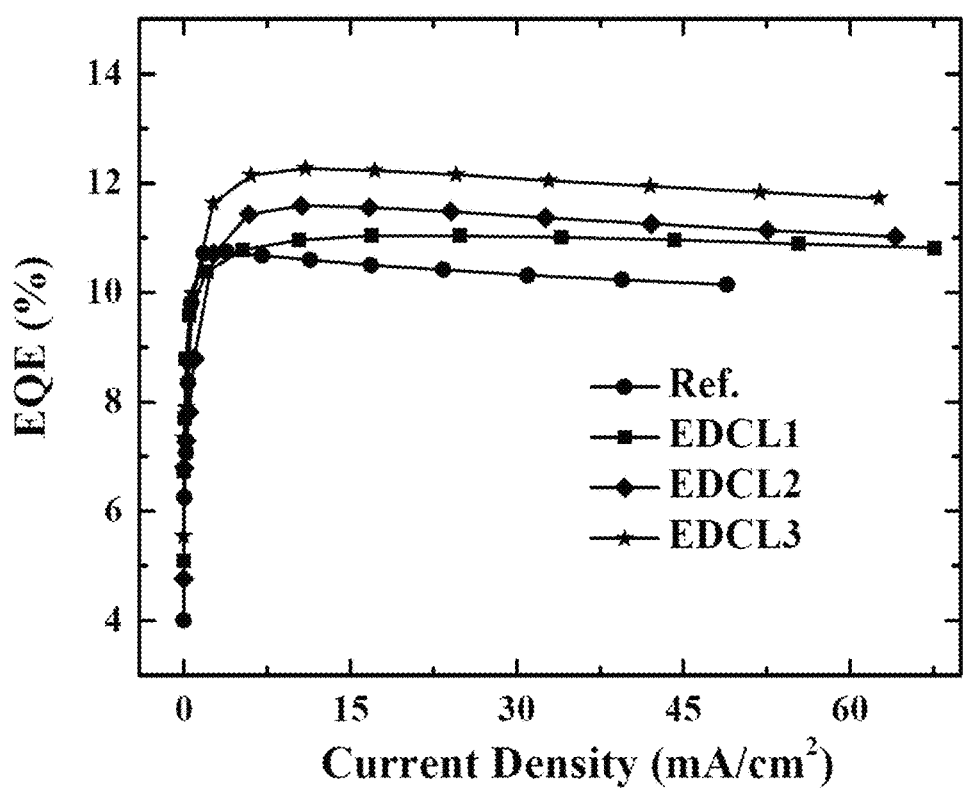
FIG. 8 shows changes in external quantum efficiency with current density in the organic light-emitting diodes of Examples and Comparative Example.

Current efficiency changes with voltage and external quantum efficiency changes with current density in the diodes of Examples and Comparative Examples are depicted in FIGS. 6 and 8, respectively.

In FIGS. 6 to 8, the curves of EDCL 1 to EDCL 3 show the results of Examples 1 to 3 and the curves of Ref. indicate the results of Comparative Examples.

Example 4

Fabrication of Organic Light-Emitting Diode

An organic light-emitting diode was fabricated in the same manner as in Examples 1 to 3, with the exception that [BD2] was used, instead of [BD1], as a dopant in the light-emitting layer. The organic light-emitting diode was

TABLE 1

| Host | Dopant | EDCL (Electron-density-controlling layer) | V | EQE | CIEx | CIEy |
|---|---|---|---|---|---|---|
| Ex. 1 | BH | BD1 | 1 | 3.79 | 10.95 | 0.137 | 0.111 |
| Ex. 2 | BH | BD1 | 2 | 3.78 | 11.56 | 0.137 | 0.109 |
| Ex. 3 | BH | BD1 | 3 | 3.76 | 12.24 | 0.138 | 0.105 |
| C. Ex. 1 | BH | BD1 | — | 3.94 | 10.62 | 0.137 | 0.111 |

TABLE 1-continued

|  | Host | Dopant | EDCL (Electron-density-controlling layer) | V | EQE | CIEx | CIEy |
|---|---|---|---|---|---|---|---|
| Ex. 4 | BH | BD2 | 4 | 3.78 | 10.55 | 0.135 | 0.109 |
| C. Ex. 2 | BH | BD2 | — | 3.82 | 9.95 | 0.135 | 0.107 |

TABLE 2

|  | Cpd. 1 | Cpd. 2 | Cpd. 3 | Cpd. 4 | BH1 | E-2 |
|---|---|---|---|---|---|---|
| Triplet Energy | 1.821 | 1.821 | 1.816 | 1.821 | 1.824 | 1.740 |
| Affinity | −3.224 | −3.189 | −3.249 | −3.224 | −3.067 | −3.265 |
| Electron Mobility | 1.806 | 1.717 | 1.643 |  |  | 1.453 |

As shown in Table 1 and FIGS. 6 to 8, the organic light-emitting diodes in which an electron-density-controlling layer is formed between a light-emitting layer and an electron transport layer are superior in terms of external quantum efficiency to those lacking the electron-density-controlling layer. Hence, organic light-emitting diodes of high efficiency can be fabricated according to the present disclosure.

Structured to have an electron-density-controlling layer for lowering a barrier to electron injection between a light-emitting layer and an electron transport layer, the organic light-emitting diode of the present disclosure allows for the effective injection of electrons into the light-emitting layer so that it can increase the electron density of the light-emitting layer and the density of excitons generated in the light-emitting layer, resulting in an improvement in external quantum efficiency (EQE).

In addition, the organic light-emitting diode of the present disclosure has an advantage over conventional organic light-emitting diodes in that, even if the triplet energy of the electron-density-controlling layer is not greater than that of the host, a higher improvement can be brought into EQE.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. An organic light-emitting diode, comprising an anode, a hole transport layer, a light-emitting layer including a host and a dopant, an electron transport layer, and a cathode in that order,
wherein an electron-density-controlling layer including an anthracene derivative represented by the following Chemical Formula A-1 or Chemical Formula A-2 is disposed between the light-emitting layer and the electron transport layer, wherein the electron-density-controlling layer is materially different from the electron transport layer,
wherein an affinity $A_h$ (eV) of the host of the light-emitting layer, an affinity $A_{ed}$ (eV) of the electron-density-controlling layer, and an affinity $A_e$ (eV) of the electron transport layer satisfy a relationship of $|A_h| \geq |A_{ed}| \geq |A_e|$, and
wherein an electron mobility of the anthracene derivative of the electron-density-controlling layer is not less than that of the material of the electron transport layer:

[Chemical Formula A-1]

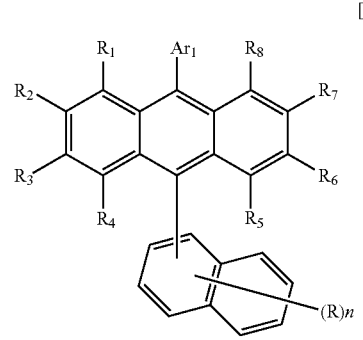

[Chemical Formula A-2]

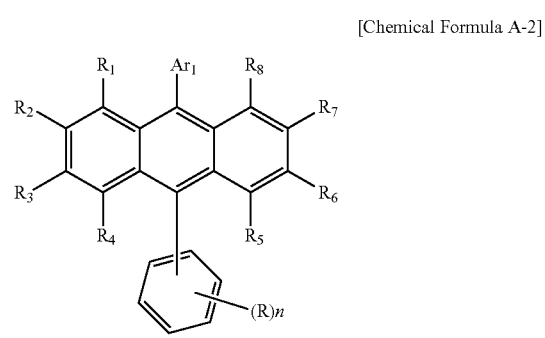

wherein,
$R_1$ to $R_8$ may be the same or different, and are each independently any one selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkenyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 6 to 30 carbon atoms, a substituted or unsubstituted alkylsilyl of 1 to 30 carbon atoms, a substituted or unsubstituted arylsilyl of 6 to 30 carbon atoms, a substituted or unsubstituted alkyl germanium of 1 to 30 carbon atoms, a substituted or unsubstituted aryl germanium of 6 to 30 carbon atoms, a cyano, a nitro, and a halogen, R is an unsubstituted aryl of 6 to 20 carbon atoms, when there are no R's on the naphthyl ring of Chemical Formula A-1 or the phenyl ring of Chemical Formula A-2, each of the carbon atoms of the aromatic ring moieties has a hydrogen, n is an integer of 1 to 7, and when n is 2 or greater, R's may be the same or different, and $Ar_1$ is a heteroaryl of 2 to 20 carbon atoms or an aryl of 6 to 20, wherein the term 'substituted' in the expression 'substituted or unsubstituted' means having at least one substituent selected from the group consisting of a deuterium atom, a cyano, a halogen, a hydroxy, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, an aryl of 6 to 24 carbon atoms, an arylalkyl of 7 to 24 carbon atoms, a heteroaryl of 2 to 24 carbon atoms or a heteroarylalkyl of 2 to 24 carbon atoms, an alkoxy of 1 to 24 carbon atoms, an alkylamino of 1 to 24 carbon atoms, an arylamino of 6 to 24 carbon atoms, a hetero arylamino of 2 to 24 carbon atoms, an alkylsilyl of 1 to 24 carbon atoms, an arylsilyl of 6 to 24 carbon atoms, and an aryloxy of 6 to 24 carbon atoms.

2. The organic light-emitting diode of claim 1, wherein a difference in triplet energy between the host of the light-emitting layer ($E^T_h$ (eV)) and the anthracene derivative of the electron-density-controlling layer ($E^T_{ed}$ (eV)) ranges from 0 to 0.4 (0.4 eV≥$E^T_h$−$E^T_{ed}$≥0 eV).

3. The organic light-emitting diode of claim 1, wherein a difference in triplet energy between the host of the light-emitting layer ($E^T_h$ (eV)) and the anthracene derivative of the electron-density-controlling layer ($E^T_{ed}$ (eV)) ranges from 0 to 0.3 (0.3 eV≥$E^T_h$−$E^T_{ed}$≥0 eV).

4. The organic light-emitting diode of claim 1, wherein the anthracene derivative represented by Chemical Formula A is one selected from among the following Compounds 1, 2, and 7:

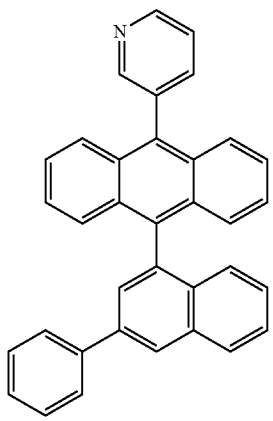

[Cpd. 1]

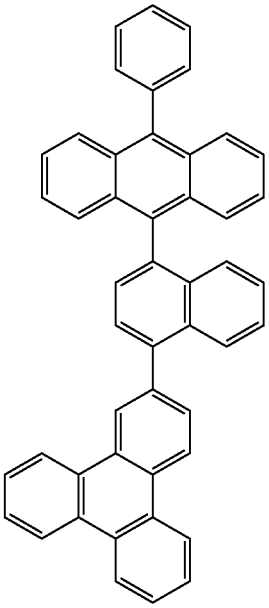

[Cpd. 2]

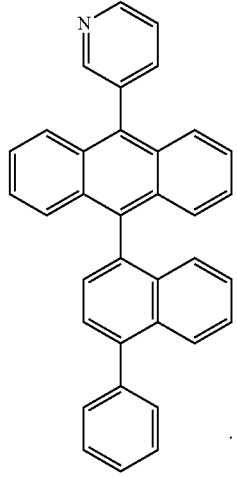

[Cpd. 7]

5. The organic light-emitting diode of claim 1, wherein a hole injection layer is introduced between the anode and the hole transport layer, and an electron injection layer is disposed between the electron transport layer and the cathode.

6. The organic light-emitting diode of claim 1, wherein the host includes at least one of the compounds represented by the following Chemical Formula 1A:

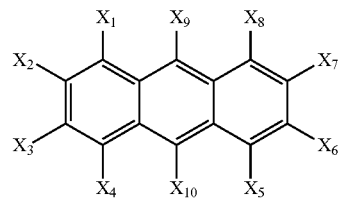

[Chemical Formula 1A]

wherein, $X_1$ to $X_{10}$ may be the same or different and are each independently selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 6 to 30 carbon atoms, a substituted or unsubstituted aryl of 6 to 50 carbon atoms, a substituted or unsubstituted heteroaryl of 3 to 50 carbon atoms containing at least one heteroatom selected from among O, N, and S, a substituted or unsubstituted silicone, a substituted or unsubstituted boron, a substituted or unsubstituted silane, a carbonyl, a phosphoryl, an amino, a nitrile, a hydroxy, a nitro, a halogen, an amide, and an ester wherein adjacent moieties of $X_1$ to $X_{10}$ may form a fused, aliphatic, aromatic, heteroaliphatic or heteroaromatic ring.

7. The organic light-emitting diode of claim 1, wherein the dopant includes at least one selected from among compounds represented by the following Chemical Formulas 2 to 4:

[Chemical Formula 2]

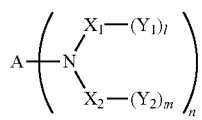

[Chemical Formula 3]

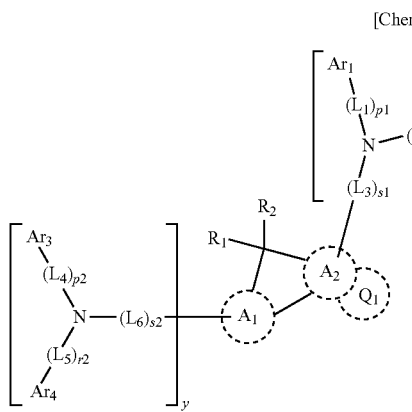

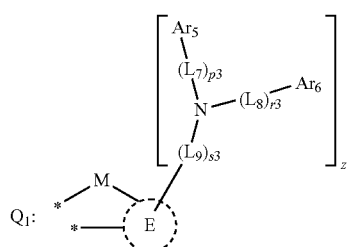

[Chemical Formula 4]

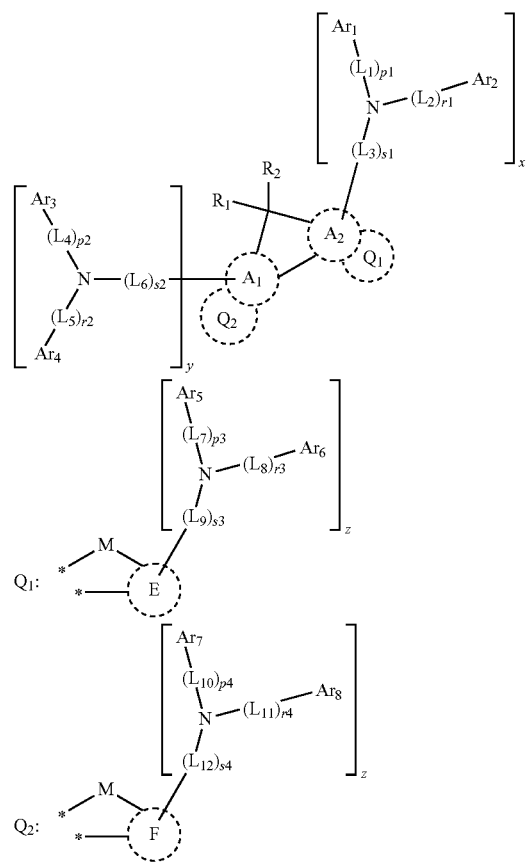

wherein,

A of Chemical Formula 2 is selected from the group consisting of a substituted or unsubstituted aryl of 6 to 50 carbon atoms, a substituted or unsubstituted heteroaryl of 3 to 50 carbon atoms containing at least one heteroatom selected from among O, N and S, a substituted or unsubstituted arylene of 6 to 60 carbon atoms, and a substituted or unsubstituted heteroarylene of 3 to 50 carbon atoms containing at least one heteroatom selected from among O, N and S;

$X_1$ and $X_2$, which may the same or different, are each independently selected from among a substituted or unsubstituted arylene of 6 to 60 carbon atoms and a single bond, and may be bonded to each other;

$Y_1$ and $Y_2$, which may be the same or different, are each independently selected from the group consisting of a substituted or unsubstituted aryl of 6 to 24 carbon atoms, a substituted or unsubstituted heteroaryl of 2 to 24 carbon atoms, a substituted or unsubstituted alkyl of 1 to 24 carbon atoms, a substituted or unsubstituted heteroalkyl of 1 to 24 carbon atoms, a substituted or unsubstituted cycloalkyl of 3 to 24 carbon atoms, a substituted or unsubstituted alkoxy of 1 to 24 carbon atoms, cyano, halogen, a substituted or unsubstituted aryloxy of 6 to 24 carbon atoms, a substituted or unsubstituted alkylsilyl of 1 to 40 carbon atoms, a substituted or unsubstituted arylsilyl of 6 to 60 carbon atoms, germanium, phosphorus, boron, deuterium, and hydrogen, wherein adjacent substituents on $Y_1$ and $Y_2$ may form a fused, aliphatic, aromatic, heteroaliphatic or heteroaromatic ring; and l and m are each an integer of 1 to 20, and n is an integer of 1 to 4;

$A_1$, $A_2$, E, and F may be the same or different, and are each independently a substituted or unsubstituted aromatic hydrocarbon of 6 to 50 carbon atoms or a substituted or unsubstituted heteroaromatic ring of 2 to 40 carbon atoms, wherein two adjacent carbon atoms of the aromatic ring $A_1$ and two adjacent carbon atoms of the aromatic ring A2 form a 5-membered fused ring together with a carbon atom to which substituents $R_1$ and $R_2$ are bonded;

linkers $L_1$ to $L_{12}$ may be the same or different, and are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_3$, $CR_4R_5$, $SiR_6R_7$, $GeR_8R_9$, O, S, and Se;

$R_1$ to $R_9$, and $Ar_1$ to $Ar_8$ may be the same or different, and are each independently any one selected from among hydrogen, deuterium, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkenyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkyl thioxy of 1 to 30 carbon atoms, a substituted or unsubstituted aryl thioxy of 6 to 30 carbon atoms, a substituted or unsubstituted alkyl amine of 1 to 30 carbon atoms, a substituted or unsubstituted aryl amine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkyl germanium of 1 to 30 carbon atoms, a substituted or unsubstituted aryl germanium of 1 to 30 carbon atoms, a cyano, a nitro, and a halogen, with the proviso that $R_1$ and $R_2$ together may form a mono- or polycyclic aliphatic or aromatic ring, which may be a heterocyclic ring having a heteroatom selected from among N, O, P, Si, S, Ge, Se, and Te as a ring member;

p1 to p4, r1 to r4, and s1 to s4 are each independently an integer of 1 to 3, with the proviso that when any of them is 2 or greater, the corresponding linkers $L_1$ to $L_{12}$ may be the same or different;

x is an integer of 1 or 2, and y and z may be the same or different and are each independently an integer of 0 to 3;

$Ar_1$ may form a ring with $Ar_2$, Ara may form a ring with $Ar_4$, $Ar_5$ may form a ring with $Ar_6$, and $Ar_7$ may form a ring with $Ar_8$; and two adjacent carbon atoms of the $A_2$ ring occupy respective positions * of Structural Formula $Q_1$ to form a fused ring; and two adjacent carbon atoms of the $A_1$ ring occupy respective positions * of Structural Formula $Q_2$ to form a fused ring, and two adjacent carbon atoms of the $A_2$ ring occupy respective positions * of Structural Formula $Q_1$ to form a fused ring.

8. The organic light-emitting diode of claim 1, further comprising a light-emitting layer, made of a blue light-emitting material, a green light-emitting material, or a red light-emitting material, which emits light in a wavelength range of 380 nm to 800 nm.

9. The organic light-emitting diode of claim 5, wherein at least one of the layers is formed using a deposition process or a solution process.

10. The organic light-emitting diode of claim 1, wherein the organic light-emitting diode is used for a device selected from among a flat display device; a flexible display device; a monochrome or white flat illumination device; and a monochrome or white flexible illumination device.

* * * * *